(12) United States Patent
Tada et al.

(10) Patent No.: US 8,043,791 B2
(45) Date of Patent: Oct. 25, 2011

(54) POSITIVE PHOTOSENSITIVE COMPOSITION, PATTERN FORMING METHOD USING THE COMPOSITION AND RESIN FOR USE IN THE COMPOSITION

(75) Inventors: Yuko Tada, Shizuoka (JP); Kazuto Shimada, Shizuoka (JP); Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/678,023

(22) PCT Filed: Sep. 11, 2008

(86) PCT No.: PCT/JP2008/066444
§ 371 (c)(1),
(2), (4) Date: Mar. 12, 2010

(87) PCT Pub. No.: WO2009/035045
PCT Pub. Date: Mar. 19, 2009

(65) Prior Publication Data
US 2010/0216072 A1    Aug. 26, 2010

(30) Foreign Application Priority Data

Sep. 14, 2007  (JP) .................................. 2007-239572
Aug. 4, 2008   (JP) .................................. 2008-201279

(51) Int. Cl.
*G03F 7/039*  (2006.01)
*G03F 7/20*   (2006.01)
*G03F 7/30*   (2006.01)
*C08F 224/00* (2006.01)
*C07D 313/00* (2006.01)

(52) U.S. Cl. .................... 430/270.1; 430/326; 430/905; 430/910; 526/266; 549/266; 549/271

(58) Field of Classification Search .................. None
See application file for complete search history.

(56) References Cited

U.S. PATENT DOCUMENTS

| | | | |
|---|---|---|---|
| 6,303,266 B1 | 10/2001 | Okino et al. | |
| 2002/0098441 A1 | 7/2002 | Okino et al. | |
| 2003/0149225 A1 | 8/2003 | Okino et al. | |
| 2003/0194640 A1* | 10/2003 | Sato | 430/270.1 |
| 2004/0043324 A1 | 3/2004 | Okino et al. | |
| 2004/0202954 A1* | 10/2004 | Momota et al. | 430/170 |
| 2005/0147920 A1* | 7/2005 | Lin et al. | 430/311 |
| 2007/0134589 A1* | 6/2007 | Yamamoto et al. | 430/270.1 |
| 2007/0224539 A1* | 9/2007 | Mizutani et al. | 430/270.1 |

FOREIGN PATENT DOCUMENTS

| | | |
|---|---|---|
| EP | 1 703 326 A2 | 9/2006 |
| JP | 5-163265 A | 6/1993 |
| JP | 2000-98612 A | 4/2000 |
| JP | 2000-119588 A | 4/2000 |
| JP | 2001-33971 A | 2/2001 |
| JP | 2002-31890 A | 1/2002 |
| JP | 2002-91002 A | 3/2002 |

OTHER PUBLICATIONS

Kim, J.-B., et al., "Synthesis and characterization of norbornene-based polymers with 7,7-dimethyloxepan-2-one acid labile groups for chemically amplified photoresists", Polymer Communication, 2002, pp. 1963-1967, vol. 43.
Lee, J.-J., et al., "Novel Alicyclic Polymers Having 7,7-Dimethyloxepan-2-one Acid Labile Groups for ArF Lithography", Proceedings of SPIE, 2002, pp. 110-119, vol. 4690, The International Society of Optical Engineering.
International Search Report (PCT/ISA/210) for PCT/JP2008/066444 dated Oct. 7, 2008, 5 pages.
Written Opinion (PCT/ISA/237) for PCT/JP2008/066444, dated Oct. 7, 2008, 6 pages.
Extended European Search Report dated Sep. 6, 2011 in European Application No. 08830724.4.

* cited by examiner

*Primary Examiner* — Sin J. Lee
(74) *Attorney, Agent, or Firm* — Sughrue Mion, PLLC

(57) ABSTRACT

A positive photosensitive composition ensuring wide exposure latitude and reduced line edge roughness not only in normal exposure (dry exposure) but also in immersion exposure, a pattern forming method using the positive photosensitive composition, and a novel resin contained in the positive photosensitive composition are provided, which are a positive photosensitive composition comprising (A) a resin having a specific lactone structure in the side chain and being capable of increasing the solubility in an alkali developer by the action of an acid and (B) a compound capable of generating an acid upon irradiation with an actinic ray or radiation, a pattern forming method using the positive photosensitive composition, and a novel resin contained in the positive photosensitive composition.

20 Claims, No Drawings

POSITIVE PHOTOSENSITIVE COMPOSITION, PATTERN FORMING METHOD USING THE COMPOSITION AND RESIN FOR USE IN THE COMPOSITION

TECHNICAL FIELD

The present invention relates to a positive photosensitive composition for use in the process of producing a semiconductor such as IC, in the production of a circuit board for liquid crystal, thermal head and the like or in other photofabrication processes, and a pattern forming method using the composition. More specifically, the present invention relates to a positive photosensitive composition suitable for the process using an exposure light source that emits, for example, a far ultraviolet ray at a wavelength of 220 nm or less or using an irradiation source such as electron beam source, a polymerizable compound, a resin, and a pattern forming method using the same.

BACKGROUND ART

A chemical amplification resist composition is a pattern forming material of forming a pattern on a substrate by producing an acid in the exposed area upon irradiation with an actinic ray or radiation such as far ultraviolet light and through a reaction using the acid as a catalyst, changing the developer solubility of the area irradiated with an actinic ray or radiation and that of the non-irradiated area.

In the case of using a KrF excimer laser as the exposure light source, a resin having small absorption in the region of 248 nm and having a basic skeleton of poly(hydroxystyrene) is primarily used as the main component and therefore, this is an excellent system capable of forming a good pattern with high sensitivity and high resolution compared with conventional naphthoquinonediazide/novolak resin systems.

On the other hand, in the case of using a light source of emitting light at a shorter wavelength, for example, in using an ArF excimer laser (193 nm) as the exposure light source, a satisfactory pattern cannot be formed even by the above-described chemical amplification system, because the compound having an aromatic group substantially has large absorption in the region of 193 nm.

In order to solve this problem, a resist containing a resin having an alicyclic hydrocarbon structure has been developed for the use with an ArF excimer laser.

Various improvements are being made also to the acid-decomposable resin that is a main constituent component of the chemical amplification resist composition, and a specific acid-decomposable resin is disclosed, for example, in Non-Patent Documents 1 and 2.

Furthermore, various improvements are being made also to the resin having a lactone structure, and a resin having a specific lactone structure is disclosed, for example, in Patent Document 1.

However, at the formation of a fine pattern having a line width of 100 nm or less, it is required to improve not only resolution but also performance in terms of line edge roughness of a line pattern.

The line edge roughness as used herein means that the resist edge at the interface between the line pattern and the substrate irregularly fluctuates in the direction perpendicular to the line direction due to resist characteristics and when the pattern is observed from right above, the edge gives an uneven appearance (approximately from ±several nm to ±several tens of nm). The unevenness is transferred to the substrate through an etching step and when the unevenness is large, this causes deterioration of electrical properties and reduction in the yield.

Non-Patent Document 1: Polymer 43, (2002) 1963-1967
Non-Patent Document 2: The International Society of Optical Engineering, Proceedings of SPIE, 110-119 (2002)
Patent Document 1: JP-A-2001-33971 (the term "JP-A" as used herein means an "unexamined published Japanese patent application")

DISCLOSURE OF THE INVENTION

Problems that the Invention is to Solve

Accordingly, an object of the present invention is to provide a positive photosensitive composition ensuring wide exposure latitude and reduced line edge roughness not only in normal exposure (dry exposure) but also in immersion exposure even at the formation of a fine pattern of 100 nm or less, and a pattern forming method using the composition.

Means for Solving the Problems

The present invention is as follows.

[1] A positive photosensitive composition, characterized by comprising:

(A) a resin containing a repeating unit represented by the following formula (I) and being capable of increasing a solubility in an alkali developer by an action of an acid; and (B) a compound capable of generating an acid upon irradiation with an actinic ray or radiation:

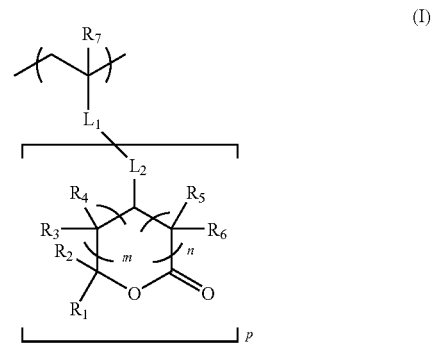

in formula (I), each of $R_1$ and $R_2$ represents a monovalent organic group, and $R_1$ and $R_2$ may be the same or different and may combine with each other to form a cyclic structure;

each of $R_3$ to $R_6$ represents a hydrogen atom or a monovalent organic group, and $R_3$ to $R_6$ may be the same or different and may combine with each other to form a cyclic structure;

$L_1$ represents a divalent linking group;

$L_2$ represents a single bond or a divalent linking group;

each of m and n represents an integer of 0 to 5, and m+n is 3 or more;

$R_7$ represents a hydrogen atom, an alkyl group or a —$CH_2$—O—Ra group, wherein Ra represents a hydrogen atom, an alkyl group or an acyl group; and p represents an integer of 1 to 3.

[2] The positive photosensitive composition as described in [1] above, characterized in that the resin of the component (A) further contains a repeating unit having a lactone structure.

[3] The positive photosensitive composition as described in [1] above, characterized in that the resin of the component (A)

further contains a repeating unit capable of decomposing by an action of an acid to produce an alkali-soluble group.

[4] The positive photosensitive composition as described in [2] above, characterized in that the resin of the component (A) further contains a repeating unit capable of decomposing by an action of an acid to produce an alkali-soluble group.

[5] A resin, characterized by comprising a repeating unit represented by the following formula (I):

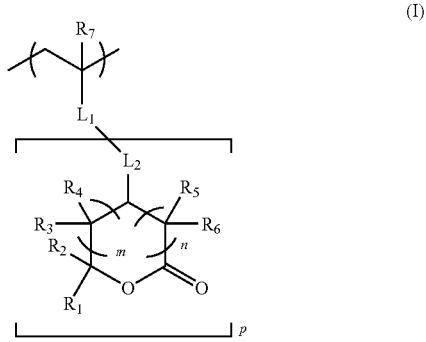

in formula (I), each of $R_1$ and $R_2$ represents a monovalent organic group, and $R_1$ and $R_2$ may be the same or different and may combine with each other to form a cyclic structure;

each of $R_3$ to $R_6$ represents a hydrogen atom or a monovalent organic group, and $R_3$ to $R_6$ may be the same or different and may combine with each other to form a cyclic structure;

$L_1$ represents a divalent linking group;

$L_2$ represents a single bond or a divalent linking group;

each of m and n represents an integer of 0 to 5, and m+n is 3 or more;

$R_7$ represents a hydrogen atom, an alkyl group or a —$CH_2$—O—Ra group, wherein Ra represents a hydrogen atom, an alkyl group or an acyl group; and p represents an integer of 1 to 3.

[6] A polymerizable compound represented by the following formula (I'):

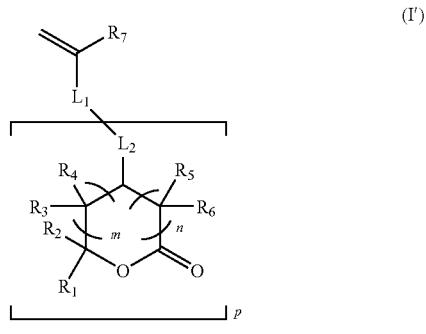

in formula (I'), each of $R_1$ and $R_2$ represents a monovalent organic group, and $R_1$ and $R_2$ may be the same or different and may combine with each other to form a cyclic structure;

each of $R_3$ to $R_6$ represents a hydrogen atom or a monovalent organic group, and $R_3$ to $R_6$ may be the same or different and may combine with each other to form a cyclic structure;

$L_1$ represents a divalent linking group;

$L_2$ represents a single bond or a divalent linking group;

each of m and n represents an integer of 0 to 5, and m+n is 3 or more;

$R_7$ represents a hydrogen atom, an alkyl group or a —$CH_2$—O—Ra group, wherein Ra represents a hydrogen atom, an alkyl group or an acyl group; and p represents an integer of 1 to 3.

[7] A pattern forming method, characterized by comprising:

steps of forming a film from the positive photosensitive composition described in any one of [1] to [4] above; and subjecting the film to exposure and development.

Advantage of the Invention

According to the present invention, a positive photosensitive composition ensuring wide exposure latitude and reduced line edge roughness not only in normal exposure (dry exposure) but also in immersion exposure, a pattern forming method using the positive photosensitive composition, and a compound for use in the positive photosensitive composition can be provided.

BEST MODE FOR CARRYING OUT THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The compounds for use in the present invention are described in detail below.

[1] Resin Capable of Increasing the Solubility in an Alkali Developer by the Action of an Acid (Component A)

The resin capable of decomposing by the action of an acid to increase the solubility in an alkali developer, which is used in the positive photosensitive composition of the present invention, contains a repeating unit represented by the following formula (I):

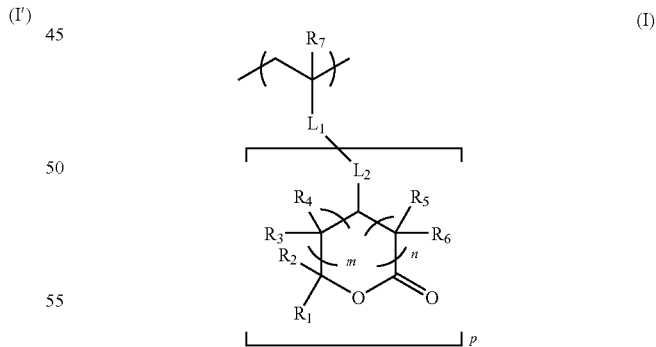

In formula (I), each of $R_1$ and $R_2$ represents a monovalent organic group, and $R_1$ and $R_2$ may be the same or different. Also, $R_1$ and $R_2$ may combine with each other to form a cyclic structure, but it is preferred not to form a cyclic structure.

Examples of the monovalent organic group in $R_1$ and $R_2$ include an alkyl group, a cycloalkyl group, an aryl group, an aralkyl group and an alkenyl group.

The alkyl group as the organic group of $R_1$ and $R_2$ may have a substituent and is preferably a linear or branched alkyl group having a carbon number of 1 to 30, and the alkyl chain may contain an oxygen atom, a sulfur atom or a nitrogen atom. Specifically, the alkyl group includes a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

The cycloalkyl group as the organic group of $R_1$ and $R_2$ may have a substituent and is preferably a cycloalkyl group having a carbon number of 3 to 20. The cycloalkyl group may be polycyclic and may have an oxygen atom in the ring. Specific examples of the cycloalkyl group include a cyclopropyl group, a cyclopentyl group, a cyclohexyl group, a norbornyl group and an adamantyl group.

The aryl group as the organic group of $R_1$ and $R_2$ may have a substituent and is preferably an aryl group having a carbon number of 6 to 14, and examples thereof include a phenyl group and a naphthyl group.

The aralkyl group as the organic group of $R_1$ and $R_2$ may have a substituent and is preferably an aralkyl group having a carbon number of 7 to 20, and examples thereof include a benzyl group, a phenethyl group, a naphthylmethyl group and a naphthylethyl group.

The alkenyl group as the organic group of $R_1$ and $R_2$ includes a group having a double bond at an arbitrary position of the above-described alkyl group.

Examples of the substituent which each of the groups as the organic group of $R_1$ and $R_2$ may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20) and an aminoacyl group (preferably having a carbon number of 2 to 10). The cyclic structure in the aryl group, cycloalkyl group and the like may have an alkyl group (preferably having a carbon number of 1 to 10) as the substituent, and the aminoacyl group may have one or two alkyl groups (each preferably having a carbon number of 1 to 10) as the substituent.

The organic groups $R_1$ and $R_2$ may combine with each other to form a cyclic structure. The cyclic structure includes a monocyclic hydrocarbon group and a polycyclic hydrocarbon group.

Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl. The monocyclic hydrocarbon group is preferably a monocyclic hydrocarbon group having a carbon number of 3 to 7, more preferably a cyclopentyl group, a cyclohexyl group or a cycloheptyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring. As for the crosslinked cyclic hydrocarbon ring, a norbornyl group is preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and examples of the substituent which the alkyl group may further have include a halogen atom, an alkyl group, a hydroxyl group protected by a protective group, and an amino group protected by a protective group.

The organic group of $R_1$ and $R_2$ is preferably an alkyl group or a cycloalkyl group, more preferably a methyl group, an ethyl group, an isopropyl group, an n-propyl group, a cyclopropyl group, a cyclopentyl group or a cyclohexyl group.

Each of $R_3$ to $R_6$ represents a hydrogen atom or a monovalent organic group, and $R_3$ to $R_6$ may be the same or different and may combine with each other to form a cyclic structure. At least two members of $R_3$ to $R_6$ may combine with each other to form a cyclic structure, but it is preferred not to form a cyclic structure.

Examples of the monovalent organic group in $R_3$ to $R_6$ include a hydroxy group, a halogen atom, a carboxyl group, a nitro group, an alkyl group, a cycloalkyl group, an aryl group, an aralkyl group, an alkenyl group, an alkoxy group, an alkoxycarbonylamino group, an acyl group and a cyano group.

The alkyl group as the organic group of $R_3$ to $R_6$ may have a substituent and is preferably a linear or branched alkyl group having a carbon number of 1 to 30, and the alkyl chain may contain an oxygen atom, a sulfur atom or a nitrogen atom. Specifically, the alkyl group includes a linear alkyl group such as methyl group, ethyl group, n-propyl group, n-butyl group, n-pentyl group, n-hexyl group, n-octyl group, n-dodecyl group, n-tetradecyl group and n-octadecyl group, and a branched alkyl group such as isopropyl group, isobutyl group, tert-butyl group, neopentyl group and 2-ethylhexyl group.

The cycloalkyl group as the organic group of $R_3$ to $R_6$ may have a substituent and is preferably a cycloalkyl group having a carbon number of 3 to 20. The cycloalkyl group may be polycyclic and may have an oxygen atom in the ring. Specific examples of the cycloalkyl group include a cyclopropyl group, a cyclopentyl group, a cyclohexyl group, a norbornyl group and an adamantyl group.

The aryl group as the organic group of $R_3$ to $R_6$ may have a substituent and is preferably an aryl group having a carbon number of 6 to 14, and examples thereof include a phenyl group and a naphthyl group.

The aralkyl group as the organic group of $R_3$ to $R_6$ may have a substituent and is preferably an aralkyl group having a carbon number of 7 to 20, and examples thereof include a benzyl group, a phenethyl group, a naphthylmethyl group and a naphthylethyl group.

The alkenyl group as the organic group of $R_3$ to $R_6$ includes a group having a double bond at an arbitrary position of the above-described alkyl group.

The alkoxy group and the alkoxy group in the alkoxycarbonylamino group as the organic group of $R_3$ to $R_6$ are preferably an alkoxy group having a carbon number of 1 to 30, and examples thereof include a methoxy group, an ethoxy group, a propoxy group, an n-butoxy group, a pentyloxy group, a hexyloxy group and a heptyloxy group.

The acyl group as the organic group of $R_3$ to $R_6$ may have a substituent and is preferably a formyl group or an acetyl group.

Examples of the substituent which each of the groups as the organic group of $R_3$ to $R_6$ may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20) and an aminoacyl group (preferably having a carbon number of 2 to 10). The cyclic structure in the aryl group, cycloalkyl group and the like may have an alkyl group (preferably having a carbon number of 1 to 10) as the substituent, and the aminoacyl group may have one or two alkyl groups (each preferably having a carbon number of 1 to 10) as the substituent.

At least two members of the organic groups $R_3$ to $R_6$ may combine with each other to form a cyclic structure. The cyclic structure includes a monocyclic hydrocarbon group and a polycyclic hydrocarbon group. Examples thereof include a cyclic structure formed by combining $R_b$ and $R_{b+1}$ (b is an integer of 3 to 5) with each other. The cyclic structure may further have a substituent.

The monocyclic hydrocarbon group and polycyclic hydrocarbon group in the organic groups $R_3$ to $R_6$ have the same meanings as the monocyclic hydrocarbon group and polycyclic hydrocarbon group in the organic groups $R_1$ and $R_2$.

Each of $R_3$ to $R_6$ is preferably an alkyl group, a cycloalkyl group or a hydrogen atom, more preferably an alkyl group or a hydrogen atom.

Each of m and n represents an integer of 0 to 5, and m+n is 3 or more. Preferably, m+n is from 3 to 5, and more preferably, m+n is from 3 to 4.

$R_7$ represents a hydrogen atom, an alkyl group or a —$CH_2$—O—Ra group. Ra represents a hydrogen atom, an alkyl group or an acyl group.

The alkyl group as $R_7$ may have a substituent and is preferably an alkyl group having a carbon number of 1 to 5, such as methyl group and ethyl group.

$R_7$ is preferably a hydrogen atom or a methyl group.

Ra represents a hydrogen atom, an alkyl group or an acyl group.

The alkyl group as Ra may have a substituent and is preferably an alkyl group having a carbon number of 1 to 5, such as methyl group and ethyl group.

The acyl group as Ra may have a substituent and is preferably a formyl group or an acetyl group.

Ra is preferably a hydrogen atom or a methyl group.

$L_1$ represents a divalent linking group. The linking group is preferably a phenyl group or an ester group, more preferably an ester group.

$L_2$ represents a single bond or a divalent linking group. The divalent linking group is preferably an ether group, an ester group, a carbonyl group, an alkylene group, a cycloalkylene group or a divalent group formed by combining these groups. A single bond, an alkylene group and a —COO-Rt- group are more preferred. The alkylene is preferably an alkylene having a carbon number of 1 to 5. Rt is preferably an alkylene group having a carbon number of 1 to 5, more preferably a —$CH_2$— group or a —$(CH_2)_3$— group.

The resin of the present invention having a repeating unit represented by formula (I) can be synthesized, for example, by a general method such as a dropping polymerization method of adding dropwise a solution containing other monomer species, a polymerizable compound represented by formula (I') and a polymerization initiator (for example, V-60 (produced by Wako Pure Chemical Industries, Ltd.)) to a heated solvent over 1 to 10 hours.

The weight average molecular weight of the resin containing a repeating unit represented by formula (I) is not particularly limited but is preferably from 2,000 to 50,000, more preferably from 3,000 to 20,000, in terms of a polystyrene-equivalent value measured by GPC method.

The polydispersity (Mw/Mn, sometimes referred to as a molecular weight distribution) is preferably from 1.2 to 2.5, more preferably from 1.5 to 2.0.

Also, the resin of the component (A) for use in the present invention can be obtained by polymerizing only a polymerizable compound (monomer) represented by the following formula (I') or polymerizing it together with other appropriate monomers.

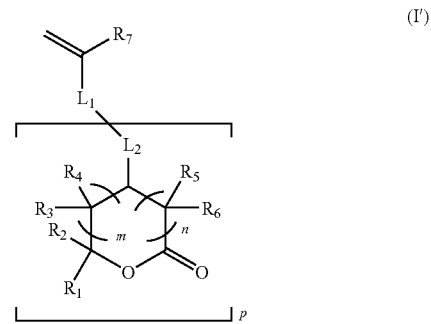

(I')

In formula (I'), each of $R_1$ and $R_2$ represents a monovalent organic group, and $R_1$ and $R_2$ may be the same or different and may combine with each other to form a cyclic structure.

Each of $R_3$ to $R_6$ represents a hydrogen atom or a monovalent organic group, and $R_3$ to $R_6$ may be the same or different and may combine with each other to form a cyclic structure.

$L_1$ represents a divalent linking group. $L_2$ represents a single bond or a divalent linking group.

Each of m and n represents an integer of 0 to 5, and m+n is 3 or more.

$R_7$ represents a hydrogen atom, an alkyl group or a —$CH_2$—O—Ra group.

In the formula above, Ra represents a hydrogen atom, an alkyl group or an acyl group.

p represents an integer of 1 to 3.

Specific examples and preferred ranges of $R_1$ to $R_7$, $L_1$, $L_2$, m, n and p are the same as those in formula (I).

The compound represented by formula (I') can be synthesized by general Baeyer-Villiger oxidation. For example, 3-hydroxy-2,2-dimethyl-cyclohexanone is reacted with a methacrylic acid ester derivative such as methacrylic acid chloride in the presence of triethylamine, and the obtained compound is treated with a peracid such as m-chlorobenzoic acid, whereby the target compound can be synthesized.

Examples of the polymerizable compound represented by formula (I') include monomers capable of forming structures corresponding to the repeating unit represented by formula (I), particularly the below-described specific examples of the repeating unit represented by formula (I).

Specific examples of the repeating unit represented by formula (I) are set forth below.

(1)
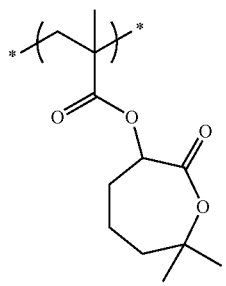

(2)
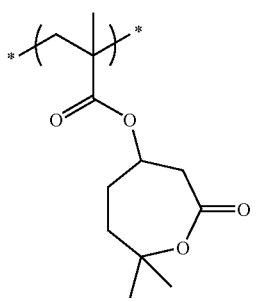

(3)
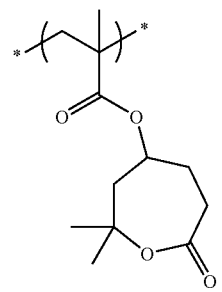

(4)
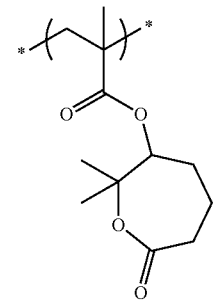

(5)
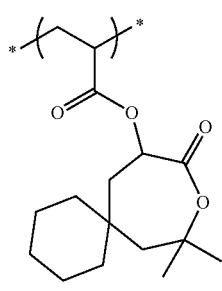

-continued (6)
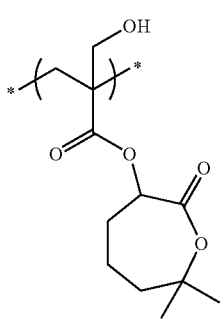

(7)
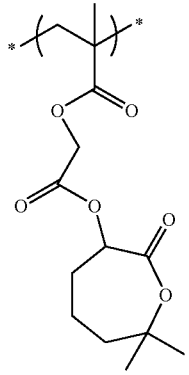

(8)
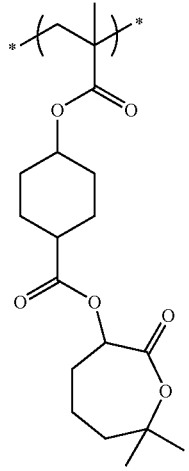

(9)
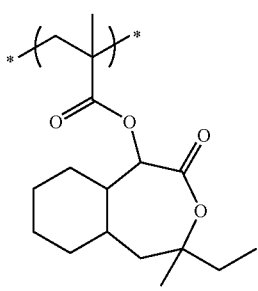

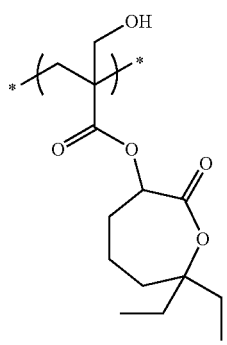 (10)
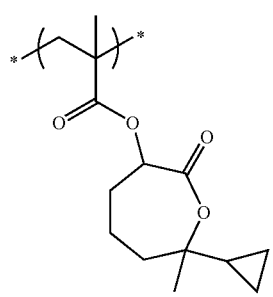 (11)
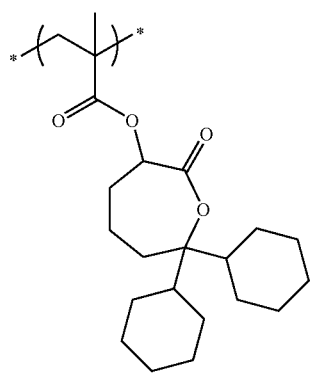 (12)
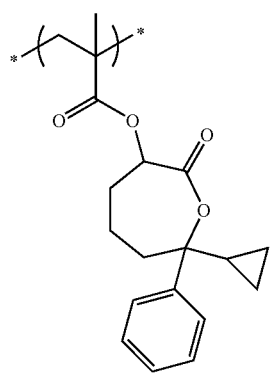 (13)
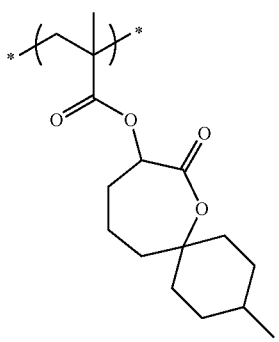 (14)
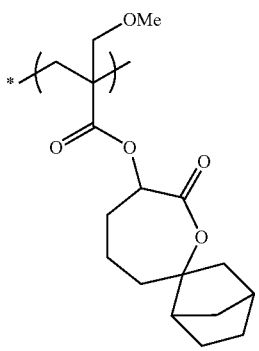 (15)
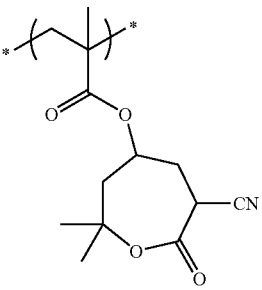 (16)
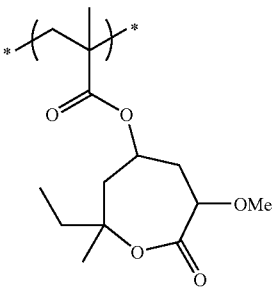 (17)
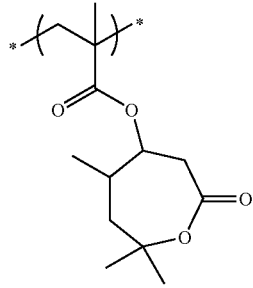 (18)

-continued

(19)
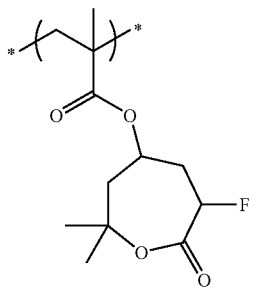

(20)
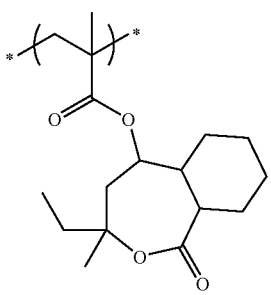

(21)
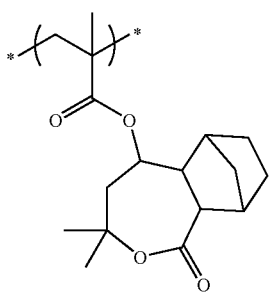

(22)
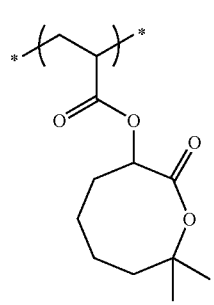

(23)
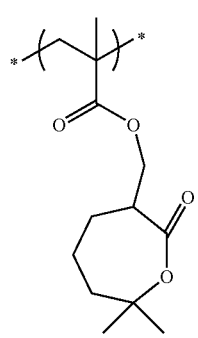

-continued

(24)
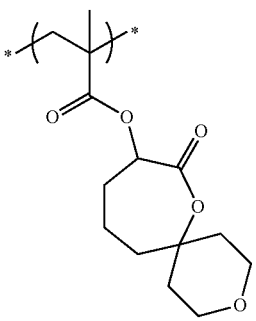

The content of the repeating unit represented by formula (I) is preferably from 1 to 100 mol %, more preferably from 5 to 40 mol %, based on all repeating units in the resin of the component (A).

The resin of the component (A) is a resin capable of increasing the solubility in an alkali developer by the action of an acid, and this is a resin having a group capable of decomposing by the action of an acid to produce an alkali-soluble group (hereinafter sometimes referred to as "an acid-decomposable group"), on either one or both of the main chain and the side chain of the resin.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

The alkali-soluble group is preferably a carboxyl group, a fluorinated alcohol group (preferably hexafluoroisopropanol) or a sulfonic acid group.

The acid-decomposable group is preferably a group formed by substituting a group capable of leaving by the action of an acid for a hydrogen atom of the alkali-soluble group above.

Examples of the group capable of leaving by the action of an acid include $-C(R_{36})(R_{37})(R_{38})$, $-C(R_{36})(R_{37})(OR_{39})$ and $-C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is, for example, preferably a cumyl ester group, an enol ester group, an acetal ester group or a tertiary alkyl ester group, more preferably a tertiary alkyl ester group.

The resin of the component (A) preferably contains a repeating unit having an acid-decomposable group. The repeating unit having an acid-decomposable group is preferably a repeating unit represented by the following formula (AI):

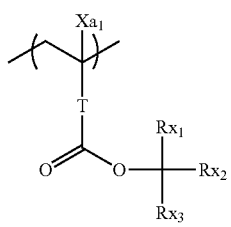
(AI)

In formula (AI), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

At least two members out of $Rx_1$ to $Rx_3$ may combine with each other to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described cycloalkyl group is preferred.

The content of the repeating unit having an acid-decomposable group (excluding the repeating unit represented by formula (I)) is preferably from 10 to 50 mol %, more preferably from 10 to 30 mol %, based on all repeating units in the resin of the component (A).

Specific preferred examples of the repeating unit having an acid-decomposable group represented by formula (AI) are set forth below, but the present invention is not limited thereto.

(In formulae, Rx represents H, $CH_3$, $CF_3$ or $CH_2OH$, and each of Rxa and Rxb represents an alkyl group having a carbon number of 1 to 4.)

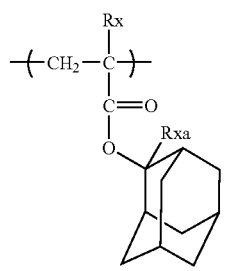
1

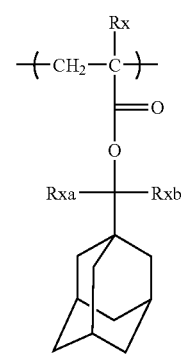
2

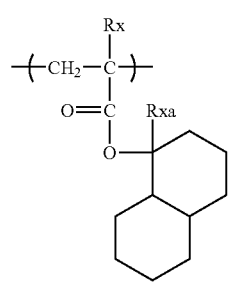
3

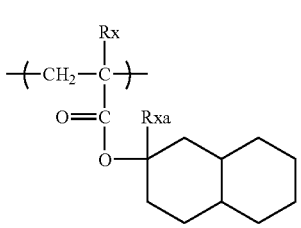
4

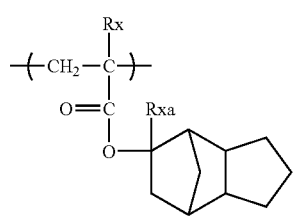
5

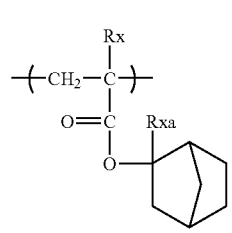
6

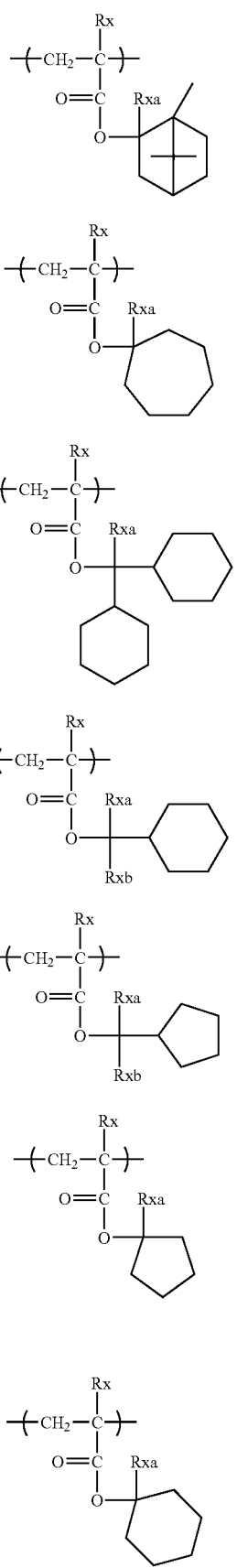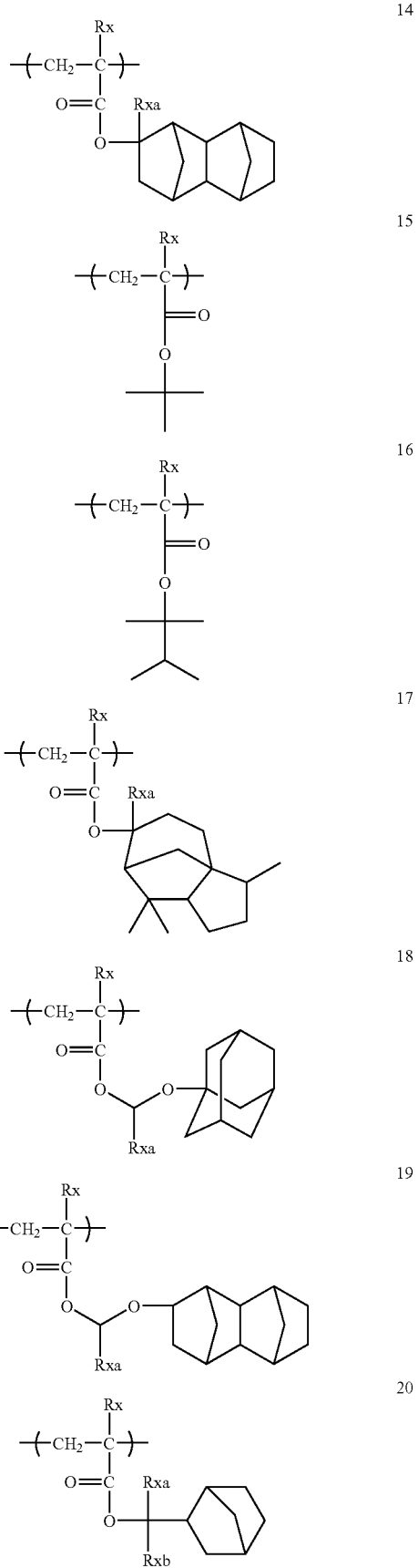

21
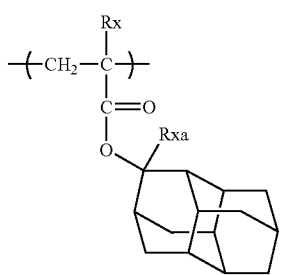
22
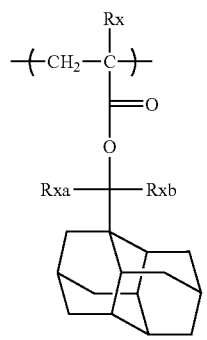
23
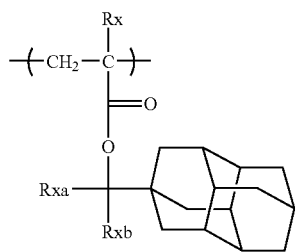
24
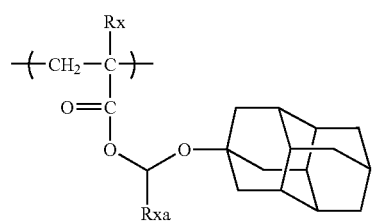
25
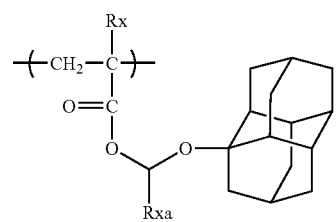
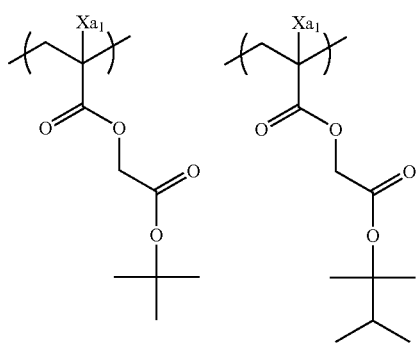
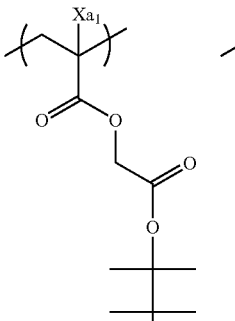
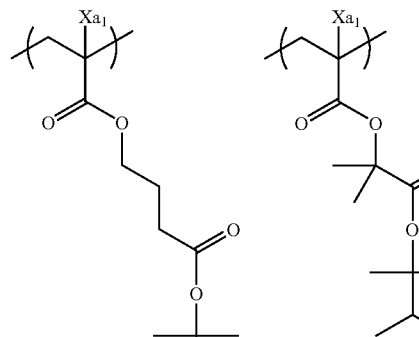
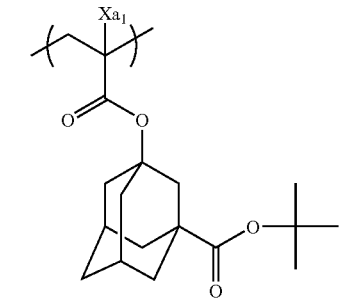
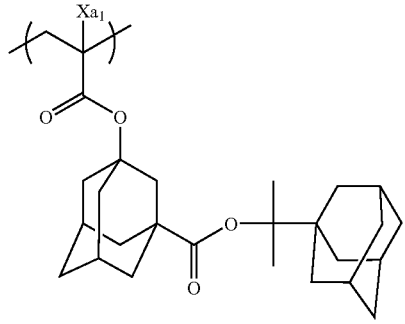
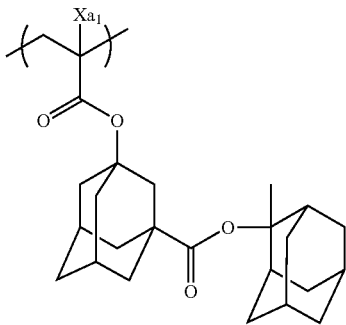

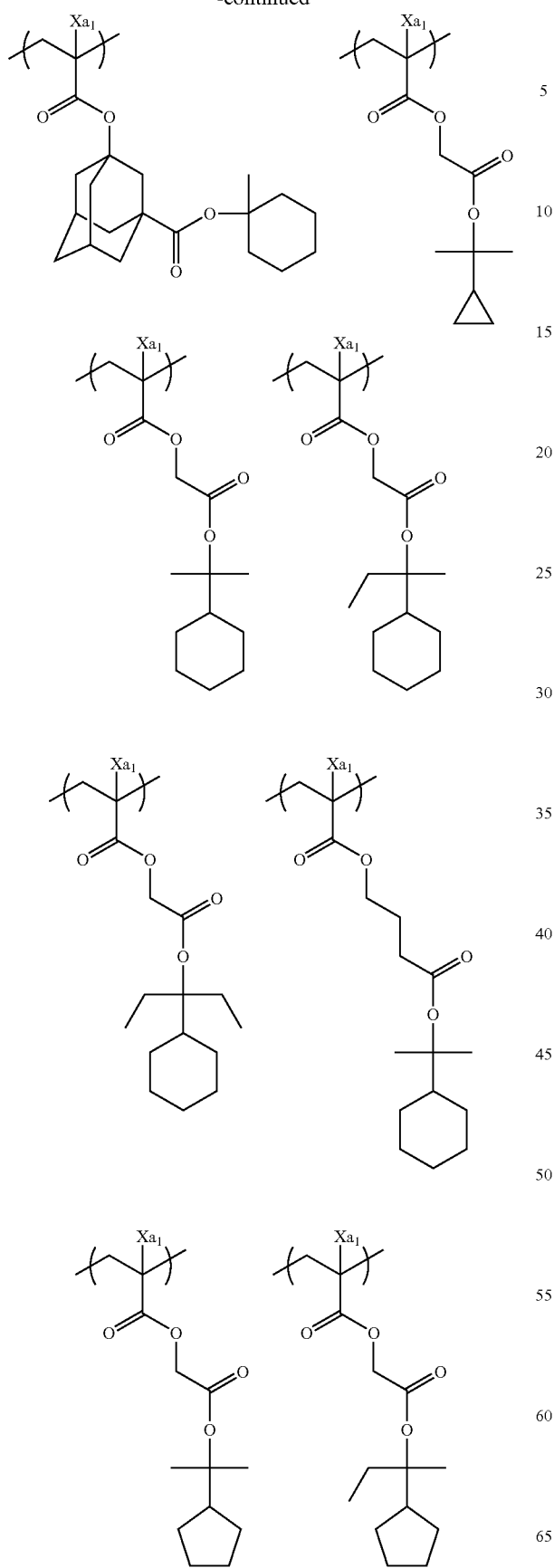
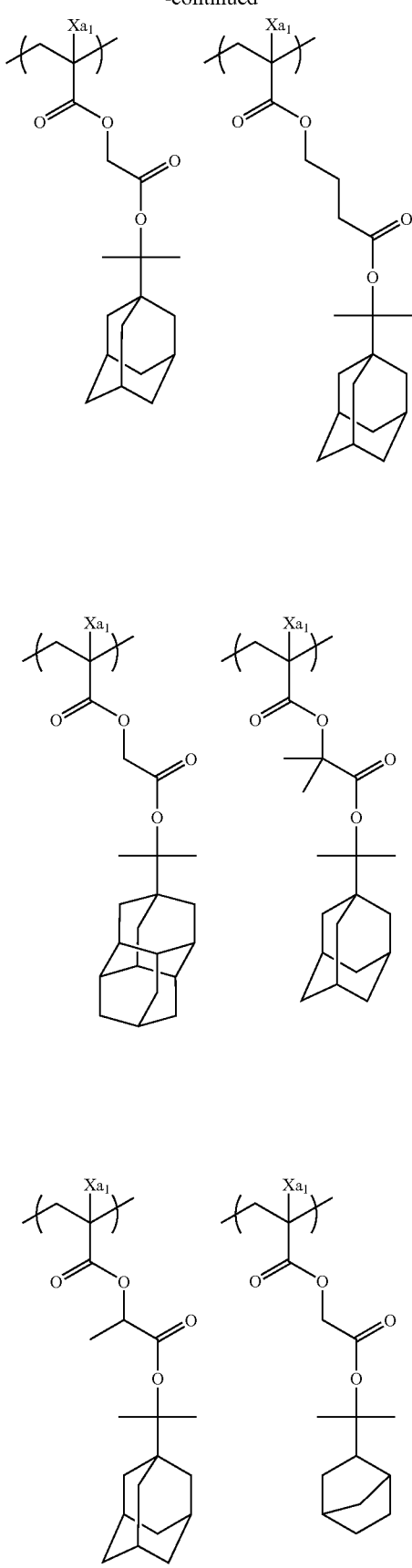

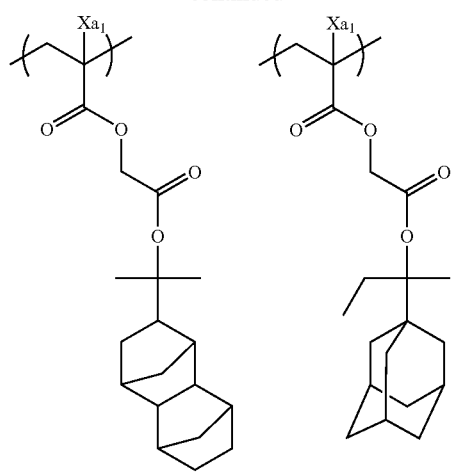
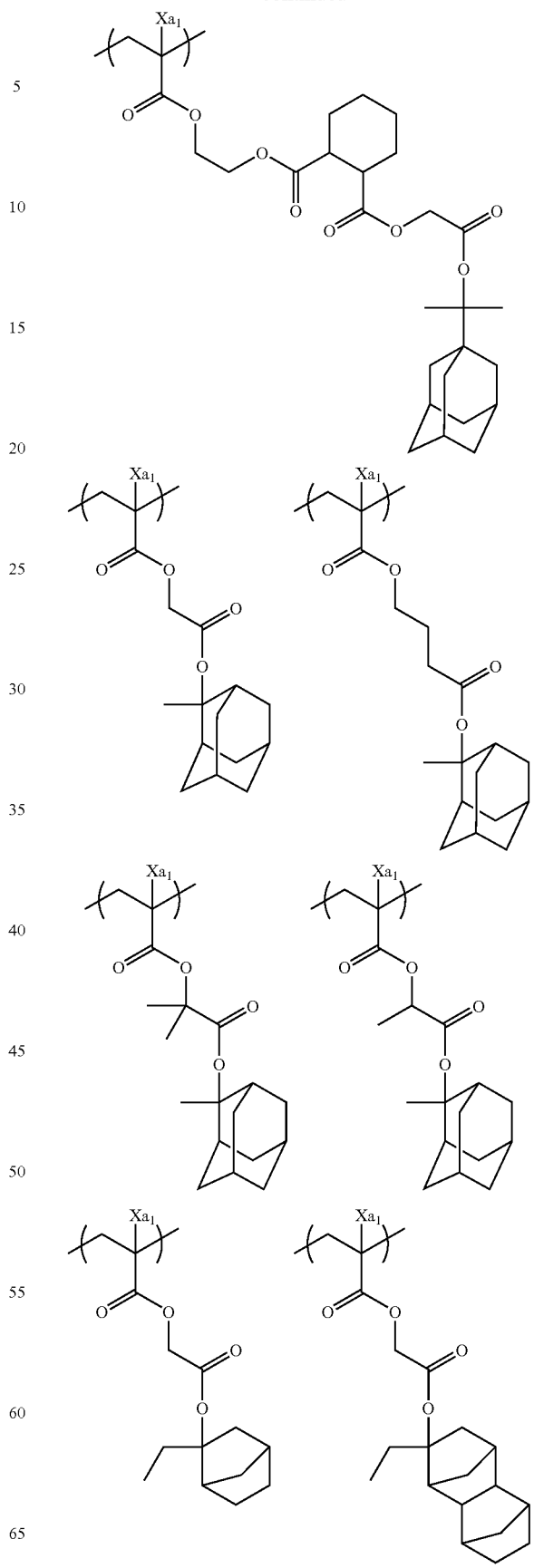

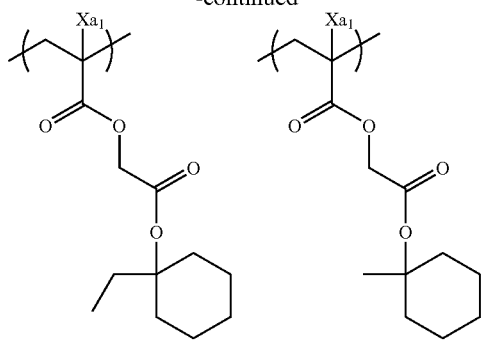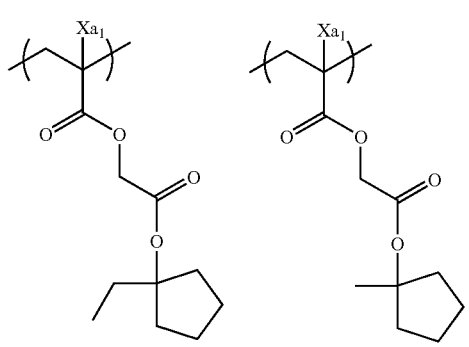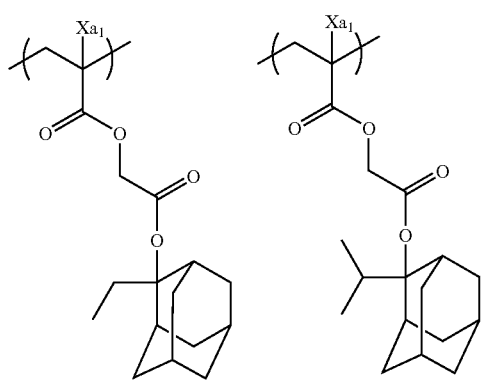

The resin of the component (A) preferably contains a repeating unit having at least one kind of a group selected from a lactone group, a hydroxyl group, a cyano group and an alkali-soluble group.

The resin of the component (A) may further contain a repeating unit having a lactone group.

As for the lactone group, any group may be used as long as it has a lactone structure, but the lactone structure is preferably a 5- to 7-membered ring lactone structure, and a structure where another ring structure is condensed with a 5- to 7-membered ring lactone structure in the form of forming a bicyclo or Spiro structure is preferred. The resin more preferably contains a repeating unit having a lactone structure represented by any one of the following formulae (LC1-1) to (LC1-16). The lactone structure may be bonded directly to the main chain. Among these lactone structures, preferred are (LC1-1), (LC1-4), (LC1-5), (LC1-6), (LC1-13) and (LC1-14). By using a specific lactone structure, the line edge roughness and development defect are improved.

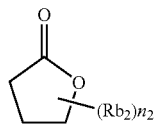 LC1-1

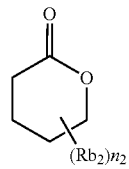 LC1-2

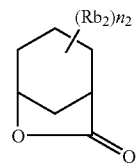 LC1-3

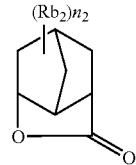 LC1-4

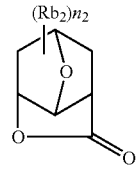 LC1-5

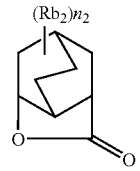 LC1-6

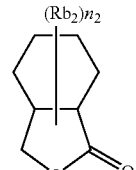 LC1-7

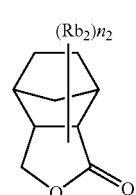 LC1-8

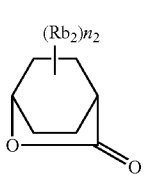 LC1-9

LC1-10
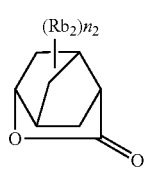

LC1-11
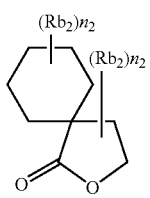

LC1-12
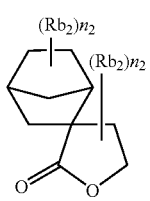

LC1-13
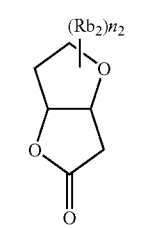

LC1-14
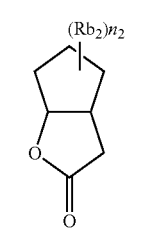

LC1-15
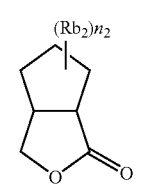

LC1-16
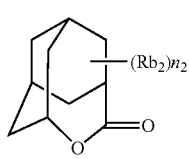

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$) and also, the plurality of substituents ($Rb_2$) may combine with each other to form a ring.

The repeating unit having a lactone structure represented by any one of formulae (LC1-1) to (LC1-16) includes a repeating unit represented by the following formula (AII):

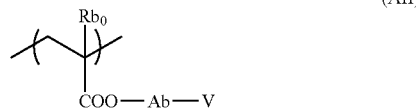
(AII)

In formula (AII), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group formed by a combination thereof, and is preferably a single bond or a divalent linking group represented by -$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a structure represented by any one of formulae (LC1-1) to (LC1-16).

The lactone group-containing repeating unit represented by formula (AII) usually has an optical isomer, but any optical isomer may be used. One optical isomer may be used alone, or a plurality of optical isomers may be mixed and used. In the case of mainly using one optical isomer, the optical purity (ee) thereof is preferably 90 or more, more preferably 95 or more.

The content of the lactone group-containing repeating unit represented by formula (AII) is preferably from 15 to 60 mol %, more preferably from 20 to 50 mol %, still more preferably from 30 to 50 mol %, based on all repeating units in the resin of the component (A).

Specific examples of the lactone group-containing repeating unit other than the repeating unit represented by formula (I) are set forth below, but the present invention is not limited thereto.

(In the formulae, Rx is H, $CH_3$, $CH_2OH$ or $CF_3$.)

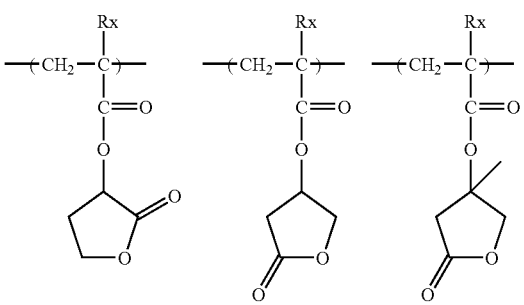

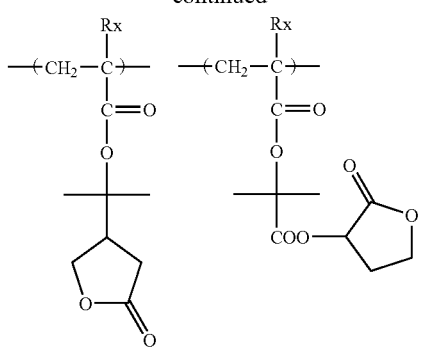
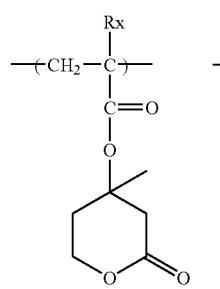
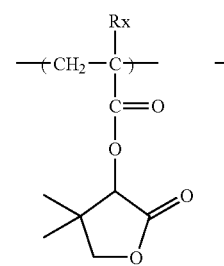
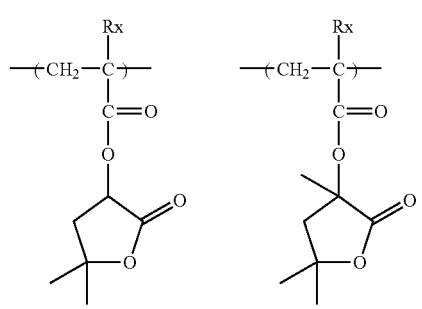
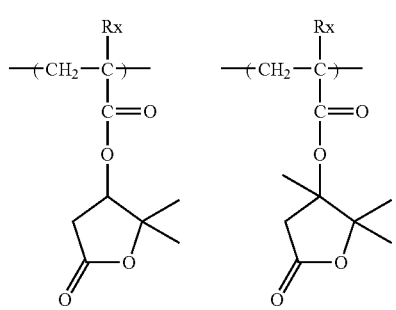
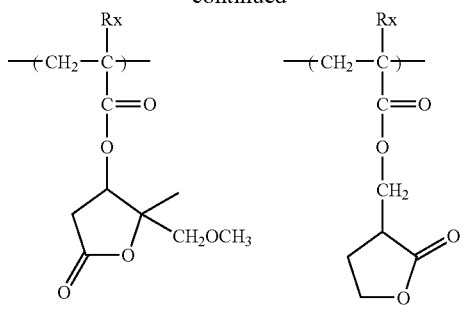
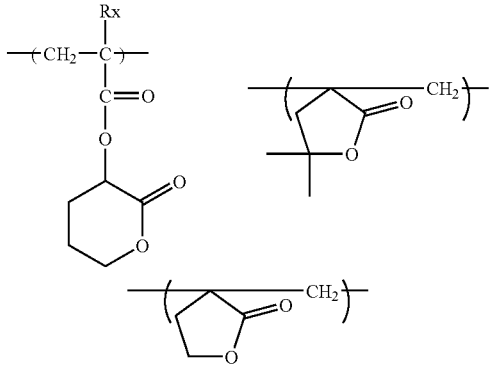
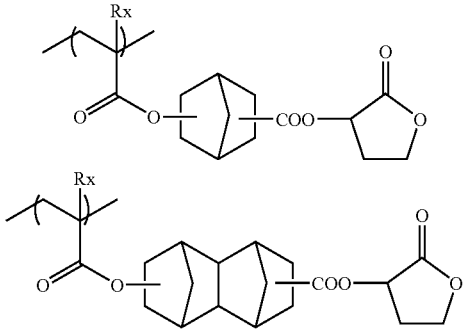
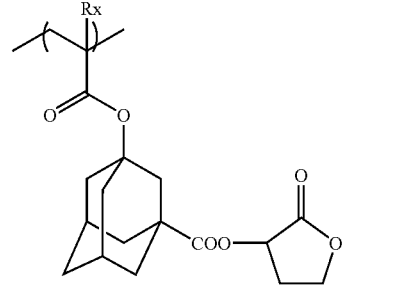
(In the formulae, Rx is H, CH$_3$, CH$_2$OH or CF$_3$.)
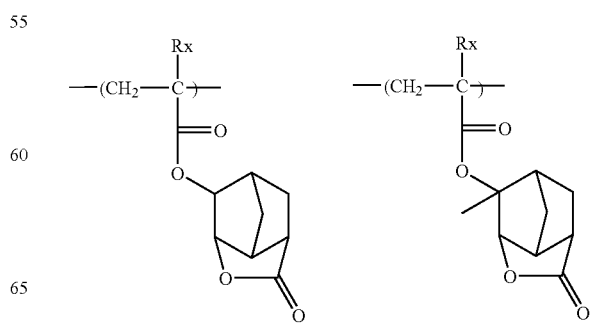

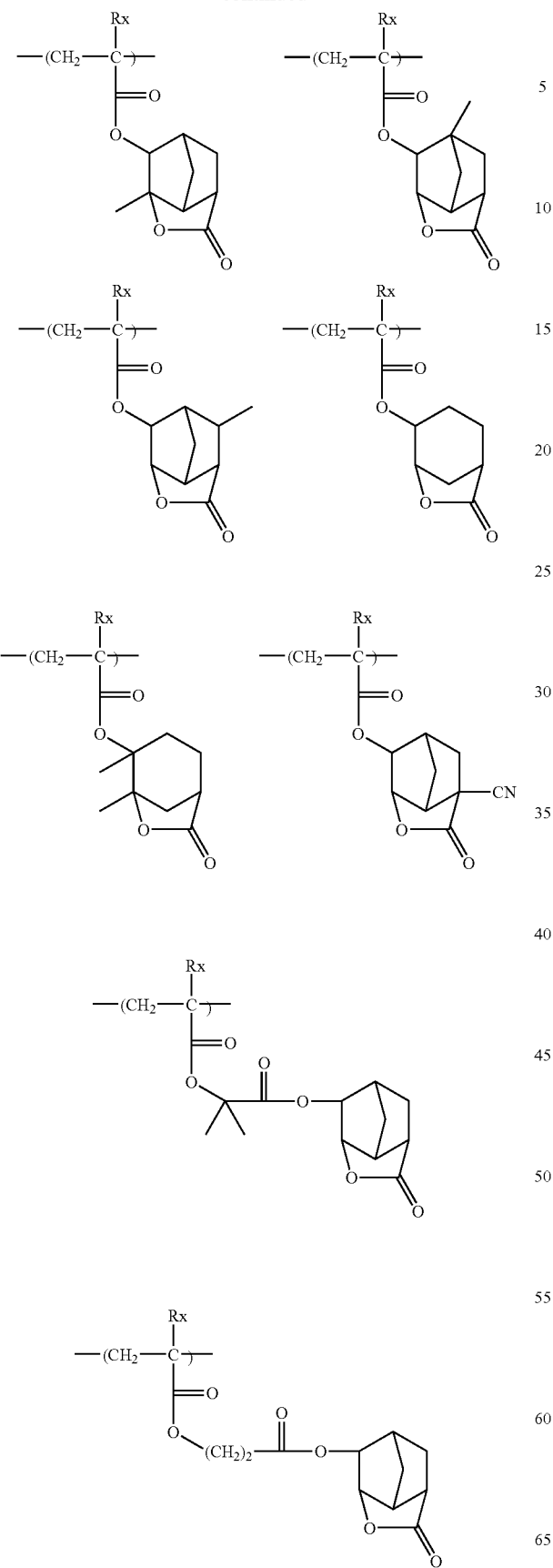
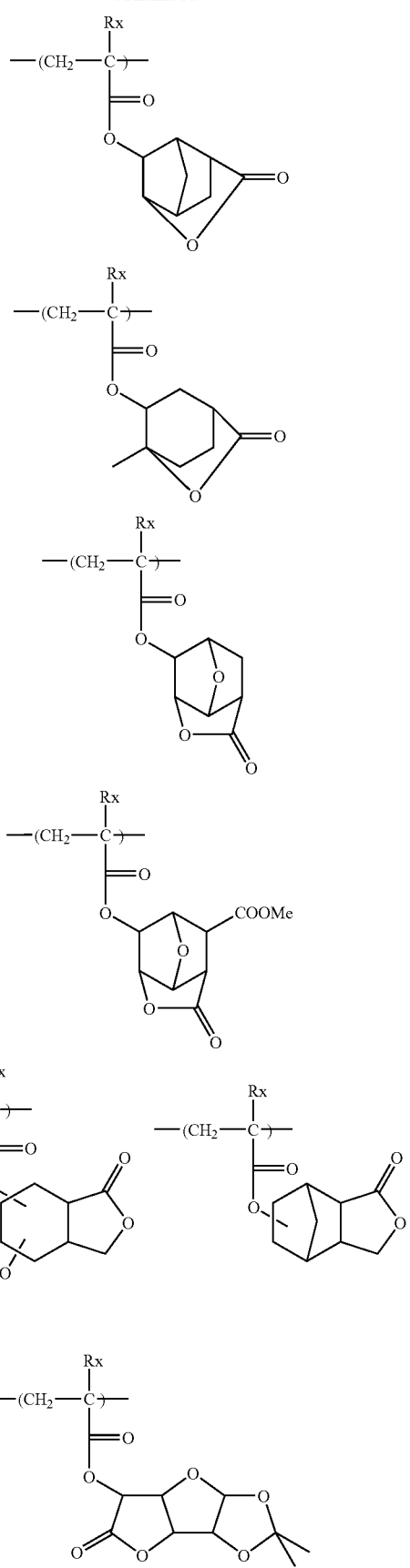

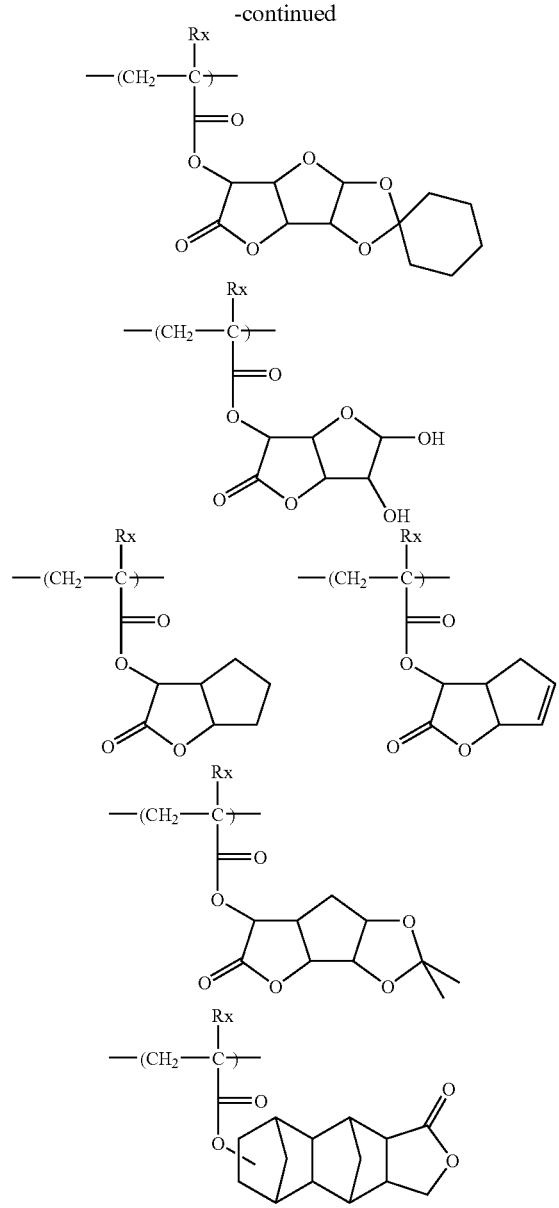
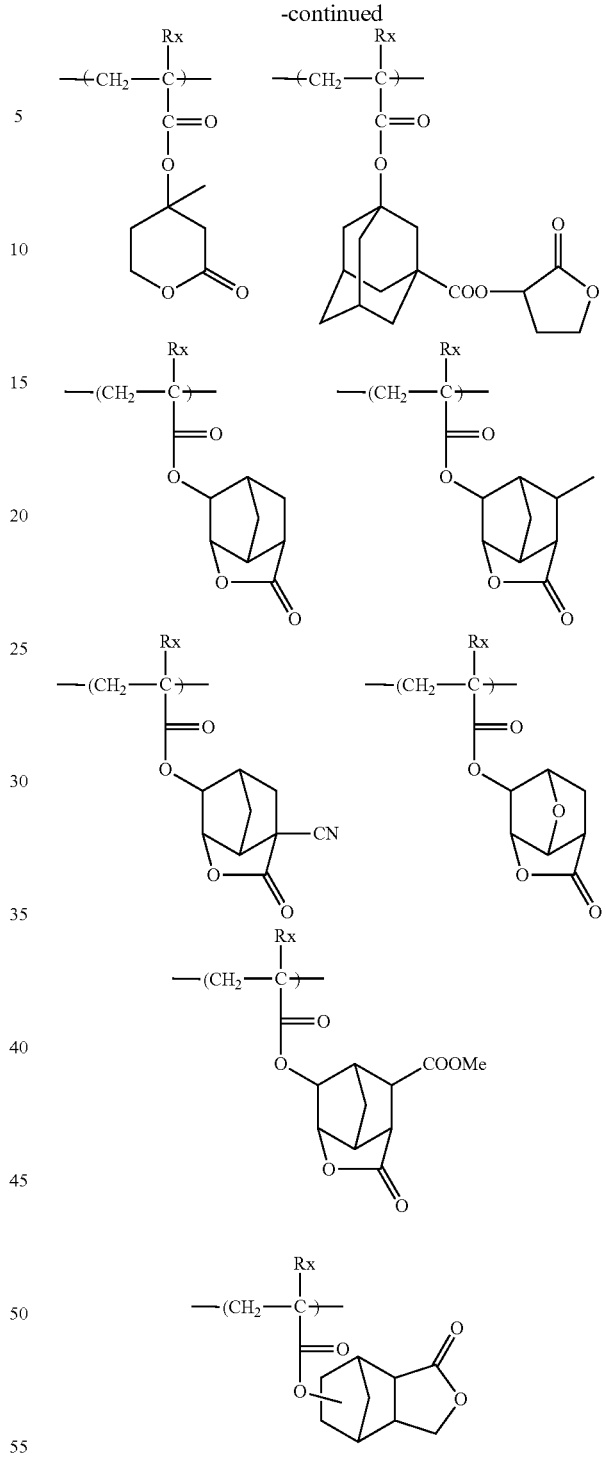
As for the lactone group-containing repeating unit represented by formula (AII), the repeating units shown below are particularly preferred. By selecting an optimal lactone group, the pattern profile and the iso/dense bias are improved.
(In the formulae, Rx is H, CH₃, CH₂OH or CF₃.)
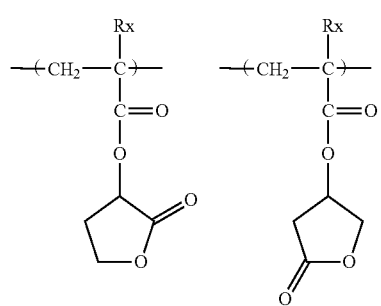
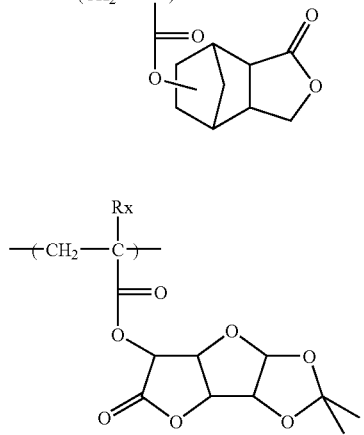

-continued

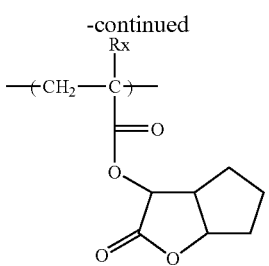

The resin of the component (A) preferably contains a repeating unit having a hydroxyl group or a cyano group. Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by the following formulae (VIIa) to (VIId):

(VIIa)

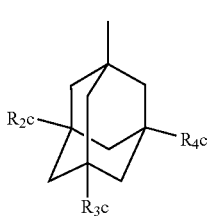

(VIIb)

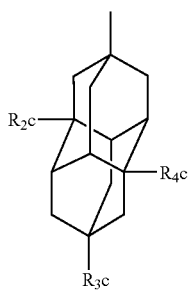

(VIIc)

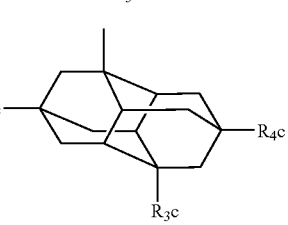

(VIId)

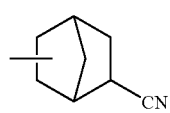

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)

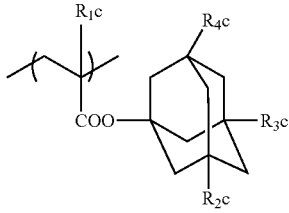

(AIIb)

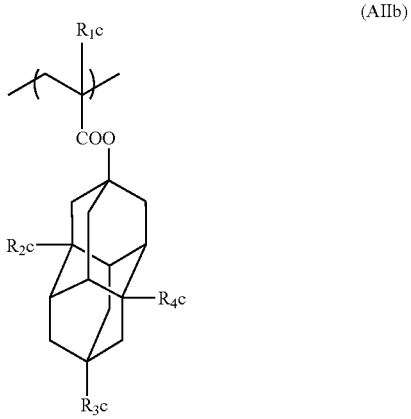

(AIIc)

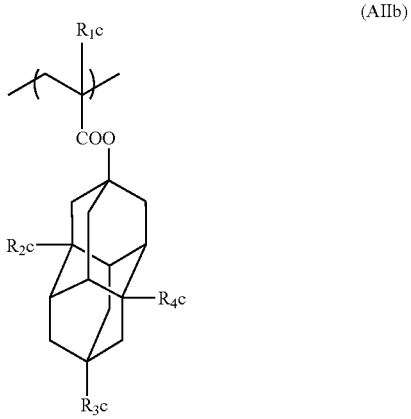

(AIId)

In formulae (AIIa) to (AIId), $R_1c$ represents a hydrogen atom, a methyl group, a trifluoromethyl group or a hydroxymethyl group.

$R_2c$ to $R_1c$ have the same meanings as $R_2c$ to $R_4c$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the resin of the component (A).

Specific examples of the repeating unit having a hydroxyl group or a cyano group are set forth below, but the present invention is not limited thereto.

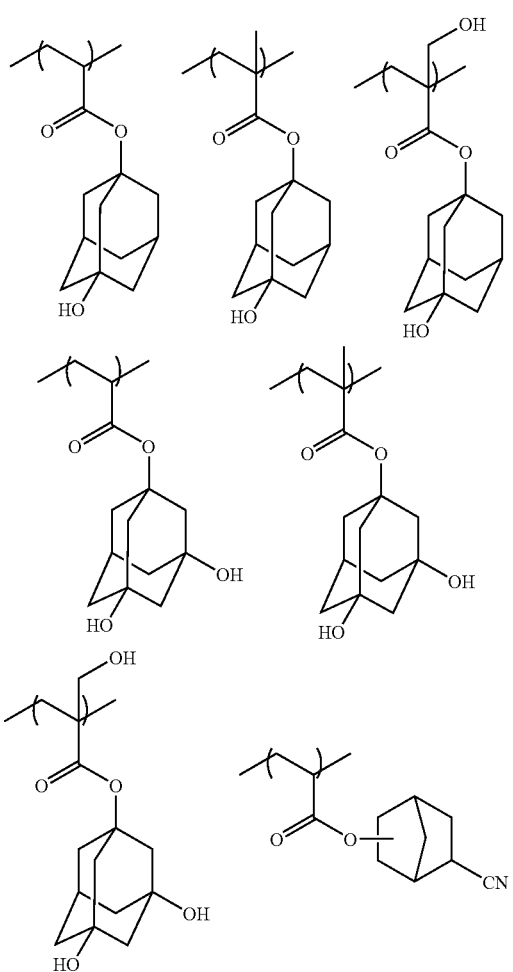
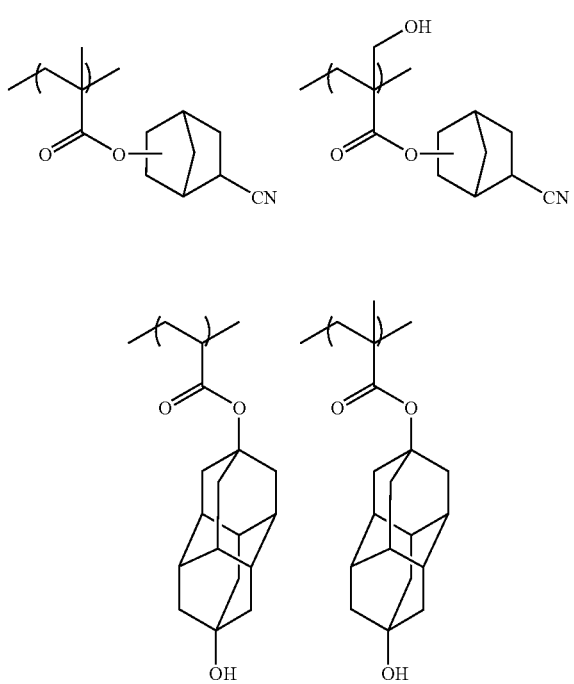
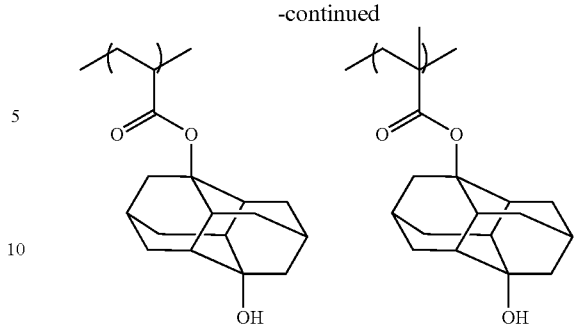

The resin of the component (A) preferably contains a repeating unit having an alkali-soluble group. The alkali-soluble group includes a carboxyl group, a sulfonamide group, a sulfonylimide group, a bissulfonylimide group, and an aliphatic alcohol with the α-position being substituted by an electron-withdrawing group, such as hexafluoroisopropanol group. It is more preferred to contain a repeating unit having a carboxyl group. By virtue of containing a repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic hydrocarbon structure. Above all, a repeating unit by an acrylic acid or a methacrylic acid is preferred.

The content of the repeating unit having an alkali-soluble group is preferably from 1 to 20 mol %, more preferably from 3 to 15 mol %, still more preferably from 5 to 10 mol %, based on all repeating units in the resin of the component (A).

Specific examples of the repeating unit having an alkali-soluble group are set forth below, but the present invention is not limited thereto.

(In the formulae, Rx is H, $CH_3$, $CF_3$ or $CH_2OH$.)

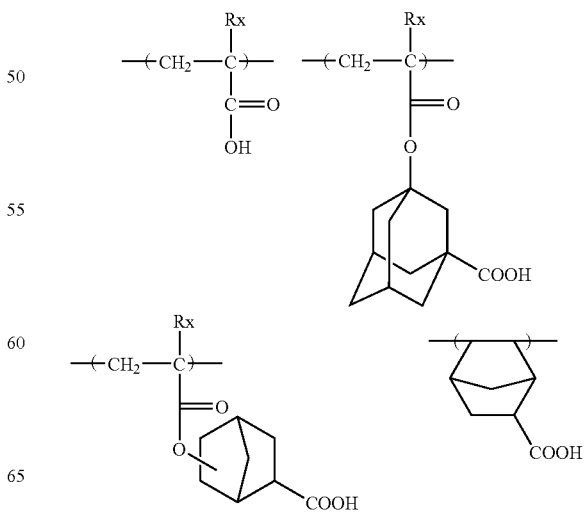

-continued

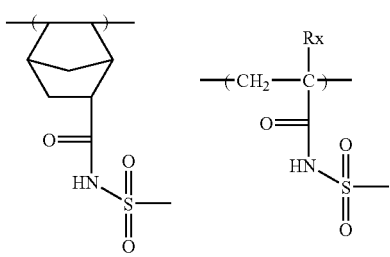
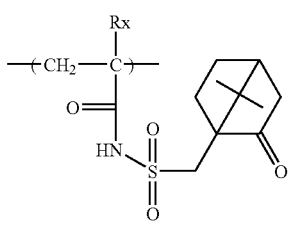
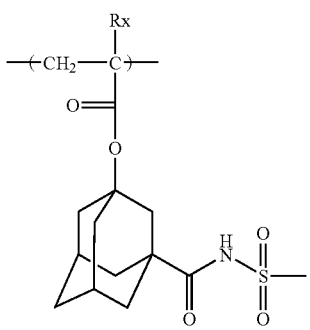
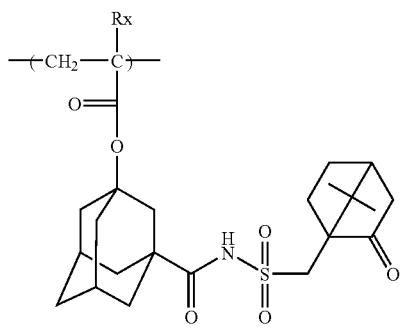
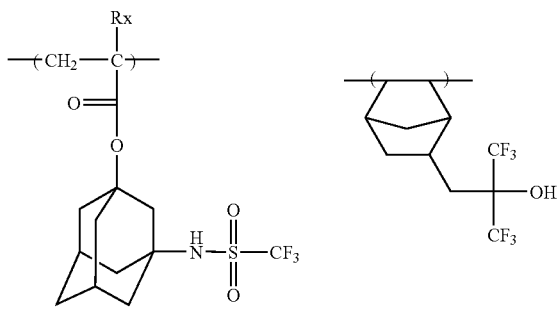

-continued

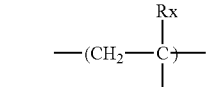
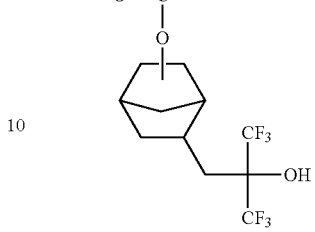

The repeating unit having at least one kind of a group selected from a lactone group, a hydroxyl group, a cyano group and an alkali-soluble group is preferably a repeating unit having at least two members selected from a lactone group, a hydroxyl group, a cyano group and an alkali-soluble group, more preferably a repeating unit having a cyano group and a lactone group. Above all, a repeating unit having a structure where a cyano group is substituted on the lactone structure of (LCI-4) is preferred.

The resin of the component (A) may further contain a repeating unit having an alicyclic hydrocarbon structure and not exhibiting acid decomposability. Thanks to this repeating unit, the dissolving out of low molecular components from the resist film to the immersion liquid at the immersion exposure can be reduced. Examples of such a repeating unit include a repeating unit composed of 1-adamantyl(meth)acrylate, diamantyl (meth)acrylate, tricyclodecanyl(meth)acrylate or cyclohexyl(meth)acrylate.

The content of the repeating unit having no acid-decomposable group is preferably from 0 to 30 mol %, more preferably from 0 to 10 mol %, based on all repeating units in the resin of the component (A).

The resin of the component (A) may contain, in addition to the above-described repeating structural units, various repeating structural units for the purpose of controlling dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

Thanks to such a repeating structural unit, the performance required of the resin of the component (A), particularly,
(1) solubility in coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin of the component (A), the molar ratio of respective repeating structural units contained is appropriately determined to control dry etching resistance of resist, suitability for standard developer, adherence to substrate, resist profile and performances generally required of the resist, such as resolution, heat resistance and sensitivity.

In the case where the positive photosensitive composition of the present invention is used for ArF exposure, the resin of the component (A) preferably has no aromatic group in view of transparency to ArF light.

The resin of the component (A) is preferably a resin where all repeating units are composed of a (meth)acrylate-based repeating unit. In this case, all repeating units may be a methacrylate-based repeating unit, all repeating units may be an acrylate-based repeating unit, or all repeating unit may be composed of a methacrylate-based repeating unit and an acrylate-based repeating unit, but the content of the acrylate-based repeating unit is preferably 50 mol % or less based on all repeating units.

In the case where the positive photosensitive composition of the present invention is irradiated with KrF excimer laser light, electron beam, X-ray or high-energy beam at a wavelength of 50 nm or less (e.g., EUV), the resin of the component (A) preferably contains a hydroxystyrene-based repeating unit, in addition to the repeating unit represented by formula (AI). The resin more preferably contains a hydroxystyrene-based repeating unit, a hydroxystyrene-based repeating unit protected by an acid-decomposable group, and an acid-decomposable repeating unit such as tertiary alkyl (meth)acrylate.

Preferred examples of the repeating unit having an acid-decomposable group include a repeating unit composed of a tert-butoxycarbonyloxystyrene, a 1-alkoxyethoxystyrene or a tertiary alkyl(meth)acrylate. A repeating unit composed of a 2-alkyl-2-adamantyl (meth)acrylate or a dialkyl(1-adamantyl)methyl(meth)acrylate is more preferred.

The resin of the component (A) can be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the positive photosensitive composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is collected by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin of the component (A) is, as a polystyrene-equivalent value by the GPC method, preferably from 1,000 to 200,000, more preferably from 2,000 to 20,000, still more preferably from 3,000 to 15,000, yet still more preferably from 3,000 to 10,000. When the weight average molecular weight is from 1,000 to 200,000, degradation of the heat resistance, dry etching resistance and developability can be prevented and the film-forming property can be prevented from deteriorating due to increase in the viscosity.

The polydispersity is usually from 1 to 3, preferably from 1 to 2, more preferably from 1.4 to 1.7. As the polydispersity is smaller, the resolution and resist profile are more excellent, the side wall of the resist pattern is smoother, and the roughness is more improved.

In the positive photosensitive composition of the present invention, the amount of the resin of the component (A) blended in the entire composition is preferably from 50 to 99.99 mass %, more preferably from 60 to 99.0 mass %, based on the entire solid content.

As regards the resin of the component (A) for use in the present invention, one kind may be used, or a plurality of kinds may be used in combination.

(B) Compound Capable of Generating an Acid Upon Irradiation with an Actinic Ray or Radiation The positive photosensitive composition of the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for a microresist and the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, preferred compounds include compounds represented by the following formulae (ZI), (ZII) and (ZIII):

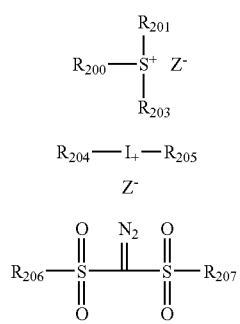

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine with each other to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can suppress decomposition with aging due to an intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl groups and cycloalkyl groups as in the aliphatic sulfonate anion.

Examples of the aromatic group in the aromatic carboxylate anion include the same aryl groups as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atoms, alkyl groups, cycloalkyl groups, alkoxy groups and alkylthio groups as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8, or a benzenesulfonate anion having a fluorine atom, still more preferably nonafluorobutanesulfonate anion, perfluoro octane sulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in a compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

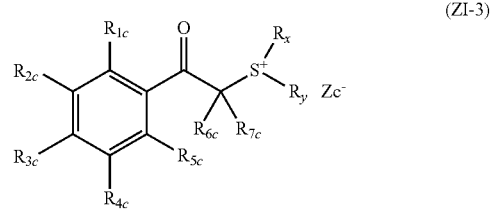

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, and a pair of $R_x$ and $R_y$, each may combine together to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ include the same alkyl groups and cycloalkyl groups as in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group include the same alkoxy groups as in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formulae (ZII) and (MI), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

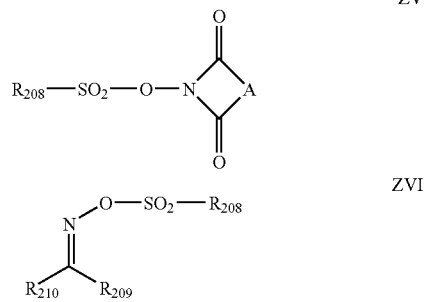

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted by a monovalent fluorine atom or a fluorine atom-containing group, or a compound capable of generating an imide acid substituted by a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In the acid generator which can be used, the acid generated is preferably a fluoro-substituted alkanesulfonic acid, fluoro-substituted benzenesulfonic acid or fluoro-substituted imide acid having a pKa of −1 or less, and in this case, the sensitivity can be enhanced.

Out of the acid generators, particularly preferred examples are set forth below.

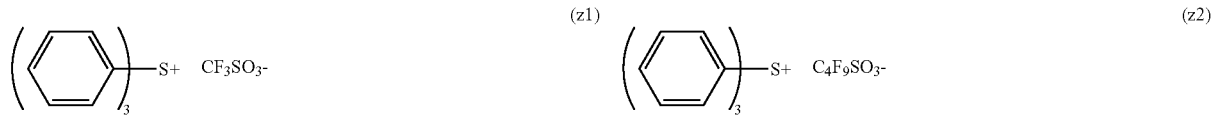

-continued
(z3) 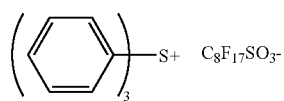
(z4) 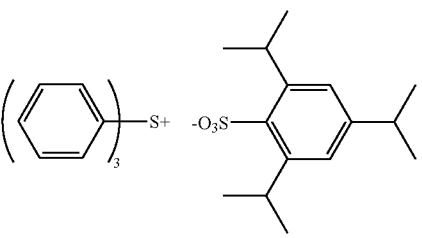
(z5) 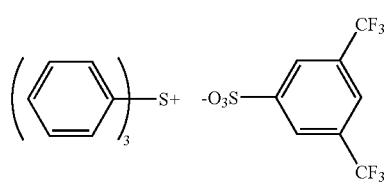
(z6) 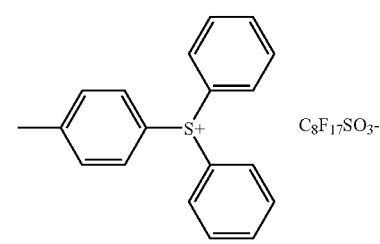
(z7) 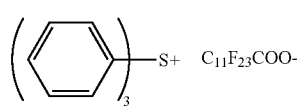
(z8) 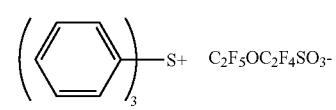
(z9) 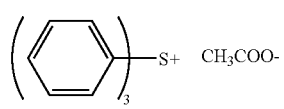
(z10) 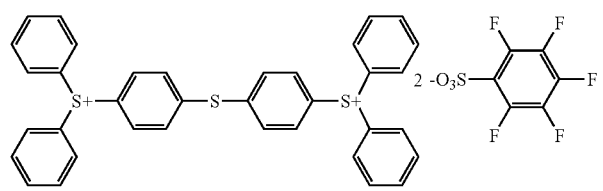
(z11) 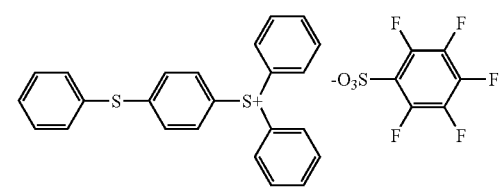
(z12) 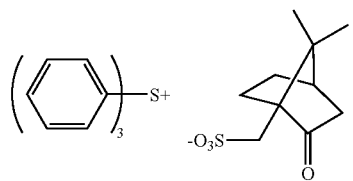
(z13) 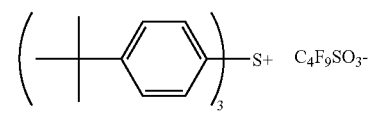
(z14) 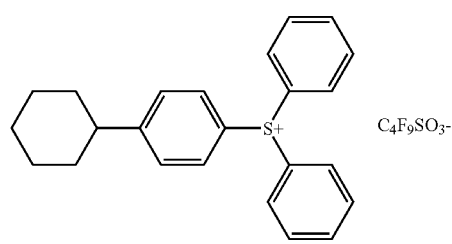
(z15) 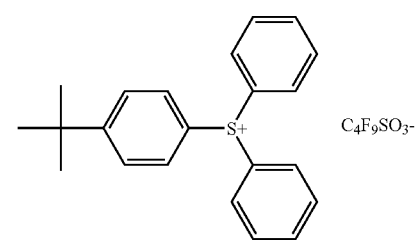
(z16) 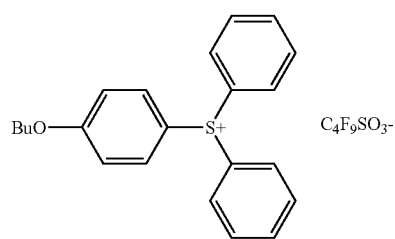
(z17) 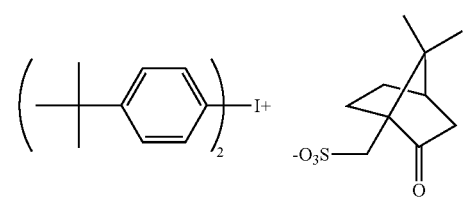

-continued
(z18) 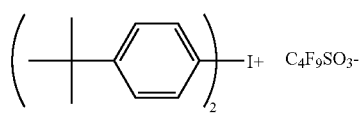
(z19) 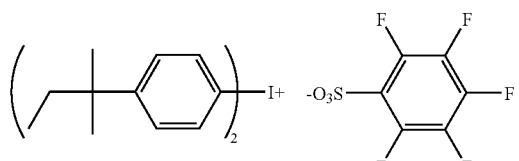
(z20) 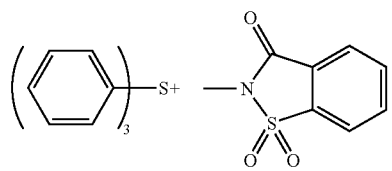
(z21) 
(z22) 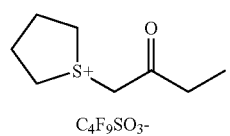
(z23) 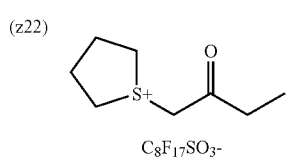
(z24) 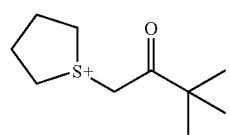
(z25) 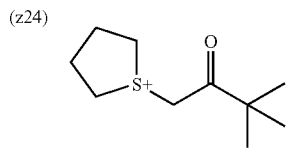
(z26) 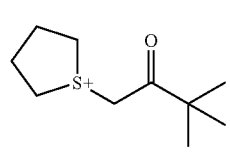
(z27) 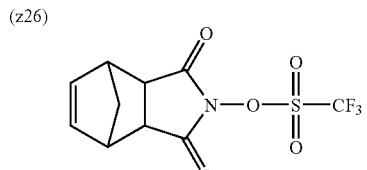
(z28) 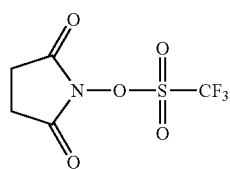
(z29) 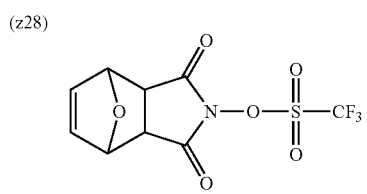
(z30) 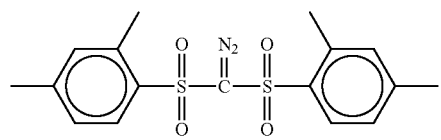
(z31) 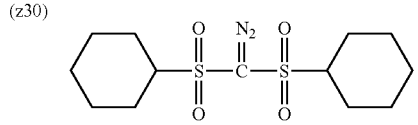
(z32) 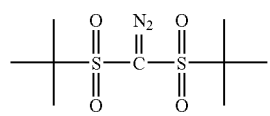
(z33) 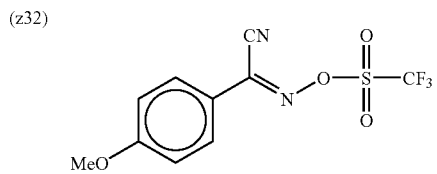
(z34) 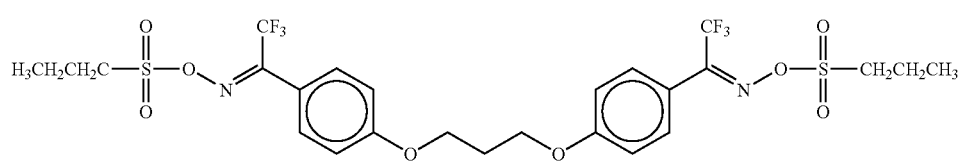

-continued
(z35)
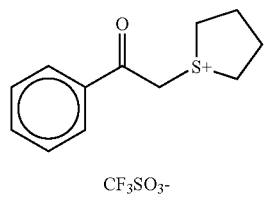
CF₃SO₃⁻
(z36)
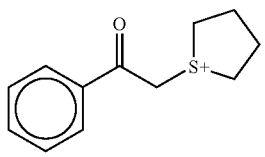
C₄F₉SO₃⁻
(z37)
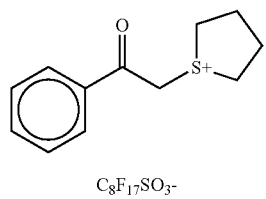
C₈F₁₇SO₃⁻
(z38)
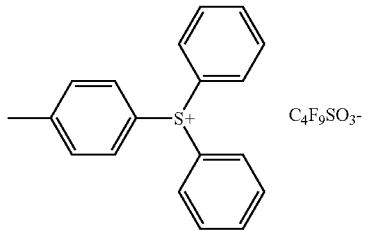
C₄F₉SO₃⁻
(z39)
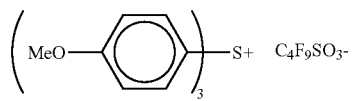
(z40)
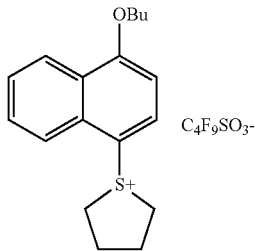
C₄F₉SO₃⁻
(z41)
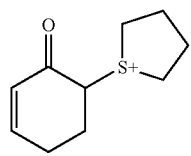
C₄F₉SO₃⁻
(z42)
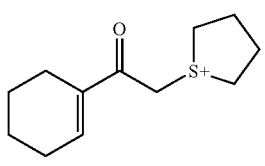
C₄F₉SO₃⁻
(z43)
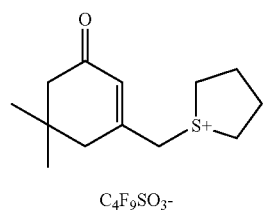
C₄F₉SO₃⁻
(z44)
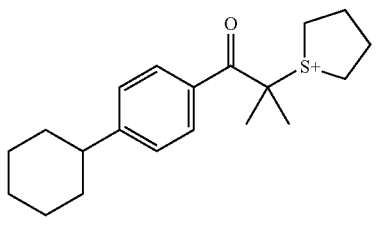
C₄F₉SO₃⁻
(z45)
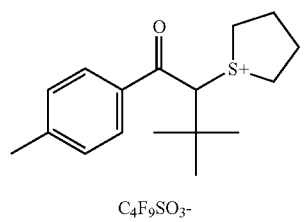
C₄F₉SO₃⁻
(z46)
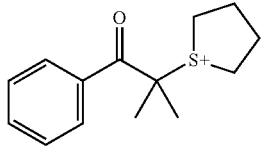
C₄F₉SO₃⁻

-continued

-continued
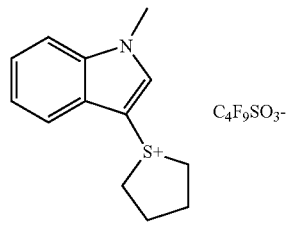 (z63)
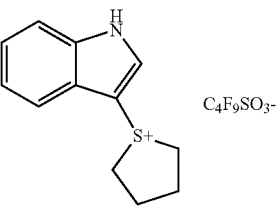 (z64)
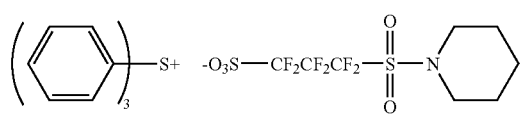 (z65)
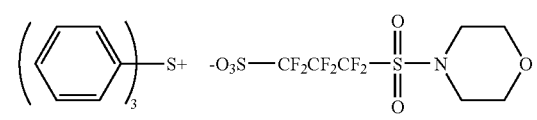 (z66)
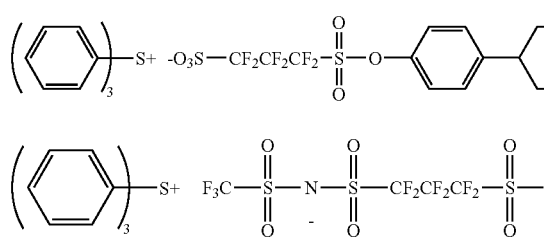 (z67)
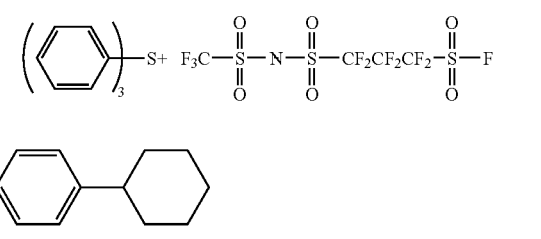 (z68)
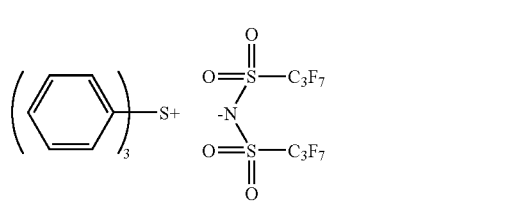 (z69)
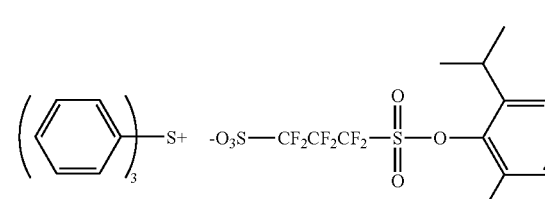 (z71)
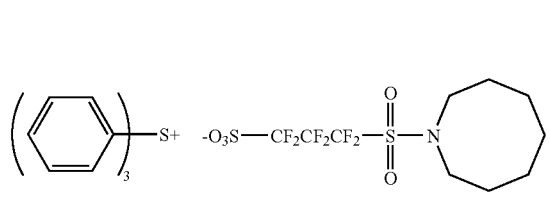 (z70)
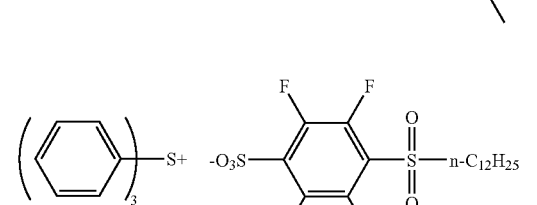 (z72)
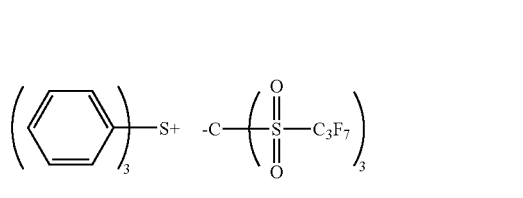 (z73)
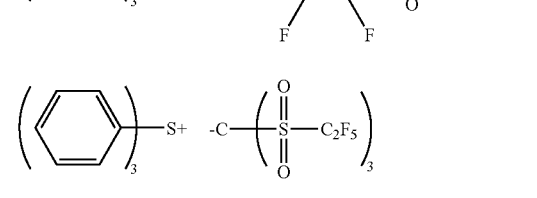 (z74)
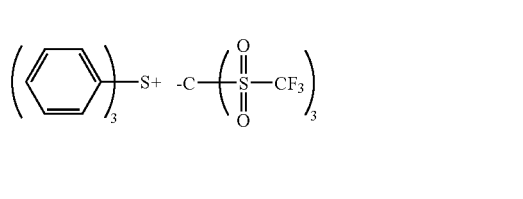 (z75)
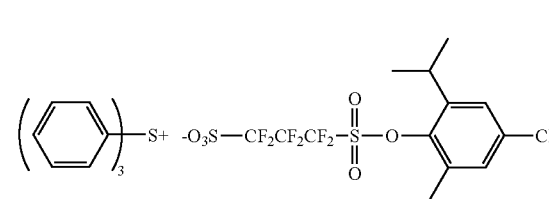 (z76)
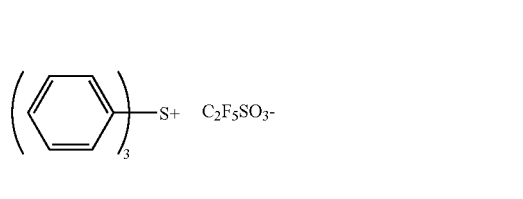 (z77)
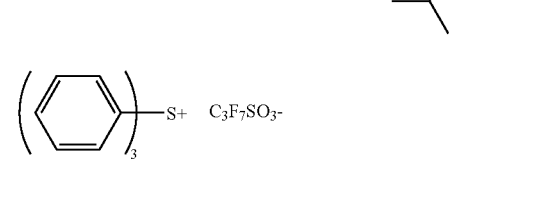 (z78)
 (z79)

-continued
(z80) 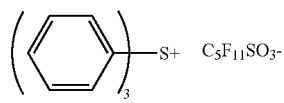
(z81) 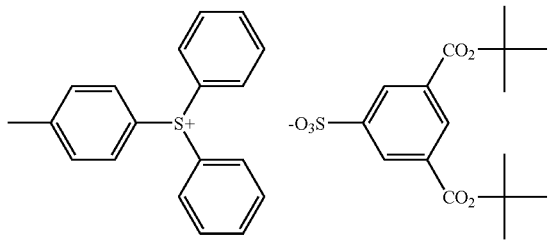
(z82) (z83) 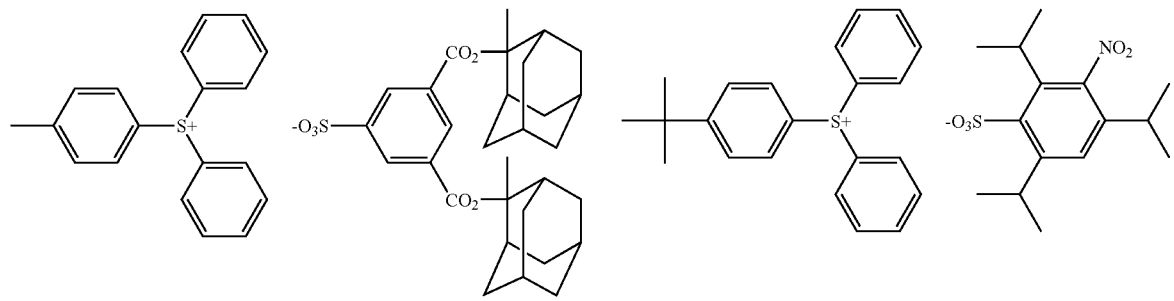
(z84) (z85) 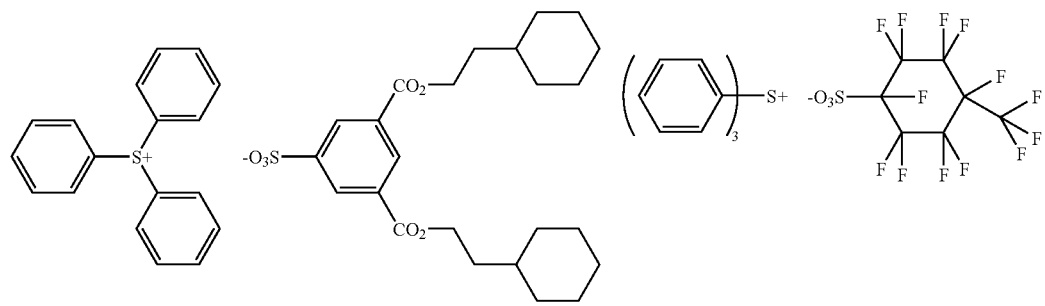
(z86) 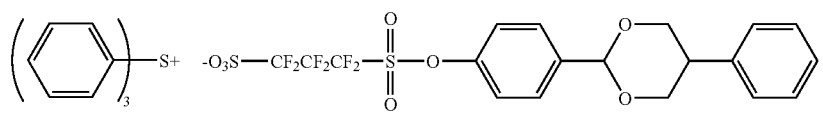
(z87) (z88) 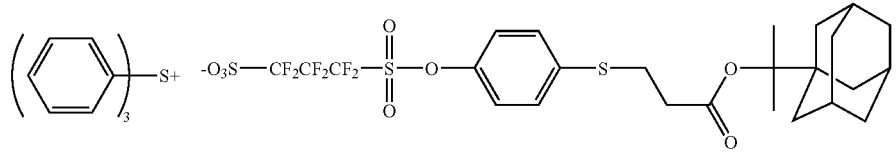
(z89) (z90) 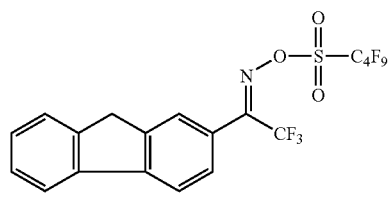

One kind of an acid generator may be used alone, or two or more kinds of acid generators may be used in combination.

The content of the acid generator in the positive resist composition is preferably from 0.1 to 20 mass %, more preferably from 0.5 to 10 mass %, still more preferably from 1 to 7 mass %, based on the entire solid content of the positive resist composition.

Solvent:

Examples of the solvent which can be used at the time of preparing the positive resist composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, (3-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound that may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethyl cyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group and the solvent containing no hydroxyl group is from 1/99 to 99/1, preferably from 10/90 to 90/10, more preferably from 20/80 to 60/40. A mixed solvent in which the solvent containing no hydroxyl group is contained in an amount of 50 mass % or more is preferred in view of coating uniformity.

The solvent is preferably a mixed solvent of two or more kinds of solvents including propylene glycol monomethyl ether acetate.

Basic Compound:

The positive resist composition of the present invention preferably contains a basic compound so as to reduce the change of performance with aging from exposure to heating.

Preferred basic compounds include a compound having a structure represented by the following formulae (A) to (E):

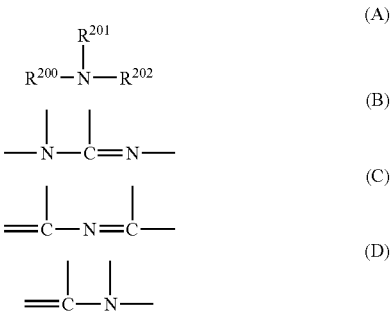

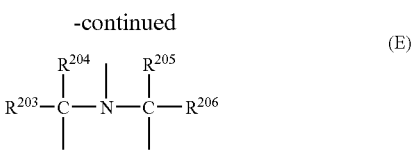

(E)

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in these formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide, and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

One of these basic compounds may be used alone, or two or more kinds thereof may be used in combination.

The amount of the basic compound used is usually from 0.001 to 10 mass %, preferably from 0.01 to 5 mass %, based on the solid content of the positive resist composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

Surfactant:

The positive photosensitive composition of the present invention preferably further contains a surfactant, more preferably any one of fluorine-containing and/or silicon-containing surfactants (a fluorine-containing surfactant, a silicon-containing surfactant and a surfactant containing both a fluorine atom and a silicon atom), or two or more kinds thereof.

By incorporating the above-described surfactant into the positive photosensitive composition of the present invention, a resist pattern with good performance in terms of sensitivity, resolution and adherence as well as less development defect can be provided when an exposure light source of 250 nm or less, particularly 220 nm or less, is used.

Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound that is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of such surfactants may be used alone, or some of them may be used in combination.

The amount of the surfactant used is preferably from 0.01 to 10 mass %, more preferably from 0.1 to 5 mass %, based on the entire amount of the positive photosensitive composition (excluding the solvent).

Onium Carboxylate:

The positive photosensitive composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear or branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. By virtue of such a construction, transparency to light at 220 nm or less is ensured, the sensitivity and resolution are enhanced, and the iso/dense bias and exposure margin are improved.

Examples of the fluorine-substituted carboxylate anion include fluoroacetate, difluoro acetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

Dissolution inhibiting compound having a molecular weight of 3,000 or less and being capable of decomposing by the action of an acid to increase the solubility in an alkali developer:

The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less. Examples of the acid-decomposable group and alicyclic structure are the same as those described above with respect to the resin as the component (A).

In the case where the positive photosensitive composition of the present invention is exposed to KrF excimer laser or irradiated with electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive photosensitive composition.

Specific examples of the dissolution inhibiting compound are set forth below, but the present invention is not limited thereto.

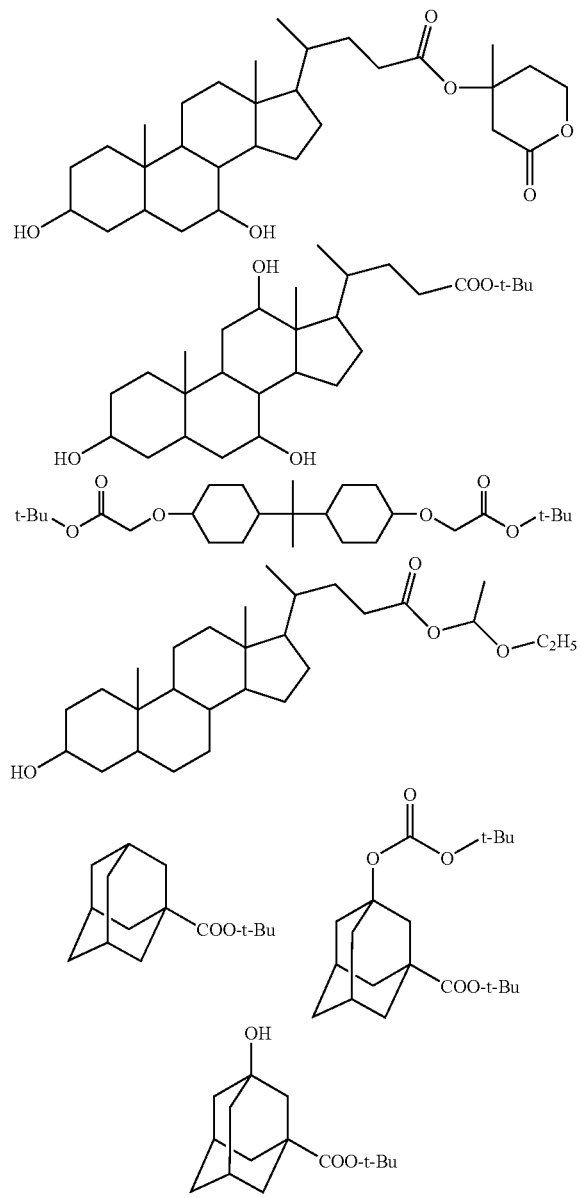

Other Additives:

The positive photosensitive composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

The positive photosensitive composition of the present invention is preferably used in a film thickness of 30 to 250 nm, more preferably from 30 to 200 nm, from the standpoint of enhancing the resolution. Such a film thickness can be obtained by setting the solid content concentration in the positive photosensitive composition to an appropriate range, thereby imparting an appropriate viscosity and enhancing the coatability and film-forming property.

The entire solid content concentration in the positive photosensitive composition is generally from 1 to 10 mass %, preferably from 1 to 8.0 mass %, more preferably from 1.0 to 6.0 mass %.

The positive photosensitive composition of the present invention is used by dissolving the components above in a predetermined organic solvent, preferably in the above-described mixed solvent, filtering the solution, and applying it on a predetermined support as follows. The filter used for filtering is preferably a polytetrafluoroethylene-, polyethylene- or nylon-made filter having a pore size of 0.1 μm or less, more preferably 0.05 μm or less, still more preferably 0.03 μm or less.

For example, the positive photosensitive composition is applied on such a substrate (e.g., silicon/silicon dioxide-coated substrate) as used in the production of a precision integrated circuit device, by an appropriate coating method such as spinner or coater and dried to form a resist film.

The resist film is irradiated with an actinic ray or radiation through a predetermined mask, preferably heated (baked) and then subjected to development and rinsing, whereby a good pattern can be obtained.

Examples of the actinic ray or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, EUV (13 nm) and electron beam. Of these, ArF excimer laser, $F_2$ excimer laser, EUV and electron beam are preferred, and ArF excimer laser is most preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. Also, a commercially available organic antireflection film such as DUV30 Series and DUV-40 Series produced by Brewer Science, Inc., and AR-2, AR-3 and AR-5 produced by Shipley Co., Ltd. can be used as the organic antireflection film.

In the development step, an alkali developer is used as follows. The alkali developer which can be used for the positive photosensitive composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid.

The exposure may also be performed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability, in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. The water is preferably subjected to a deaeration treatment.

Also, the lithography performance can be enhanced by increasing the refractive index of the immersion liquid. From such a standpoint, an additive for increasing the refractive index may be added to water, or deuterated water ($D_2O$) may be used in place of water.

In the case where the resist film formed of the positive photosensitive composition of the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin (HR) may be any resin as long as the receding contact angle on the surface can be enhanced by its addition, but a resin having at least either a fluorine atom or a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive photosensitive composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The fluorine atom or silicon atom in the hydrophobic resin (HR) may be present in the main chain of the resin or may be substituted on the side chain.

The hydrophobic resin (HR) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

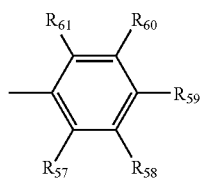
(F2)

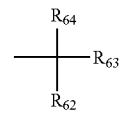
(F3)

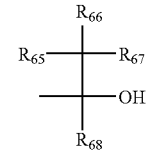
(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine together to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

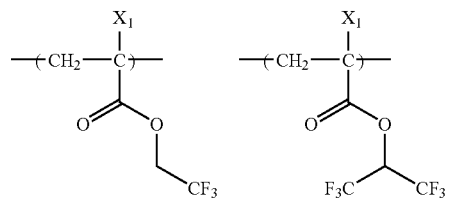

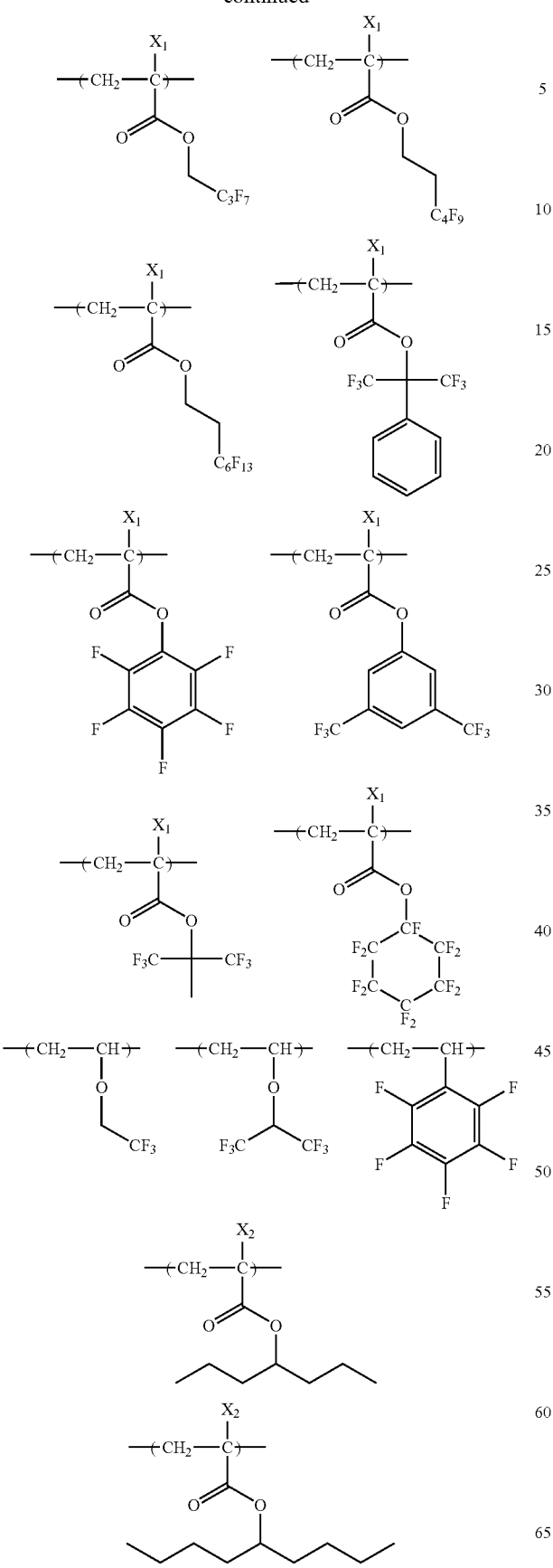
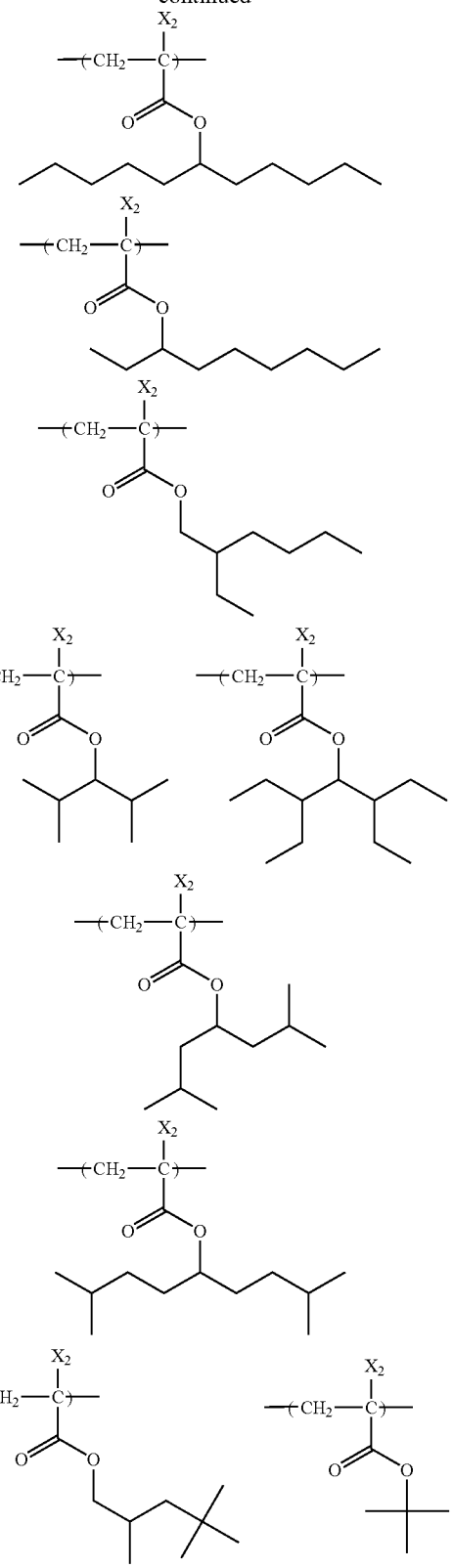
The hydrophobic resin (FIR) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include groups represented by the following formulae (CS-1) to (CS-3):

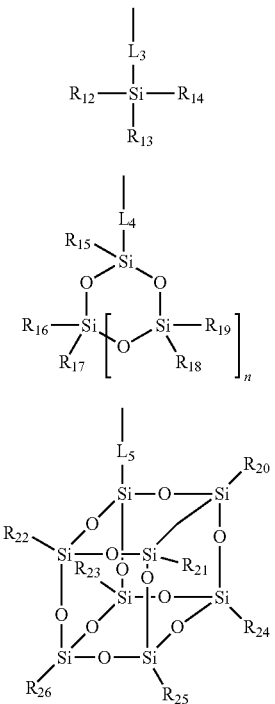

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. Examples of the divalent linking group include a single group and a combination of two or more groups, selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a silicon atom are set forth below, but the present invention is not limited thereto.

In specific examples, $X_1$ represents a hydrogen atom, —$CH_3$, —F or —$CF_3$.

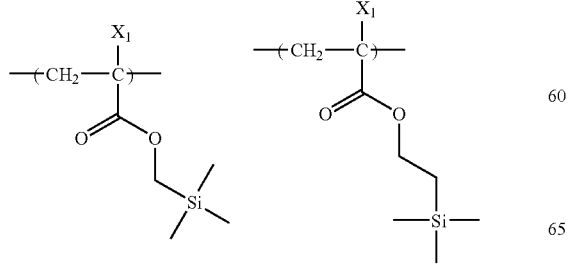

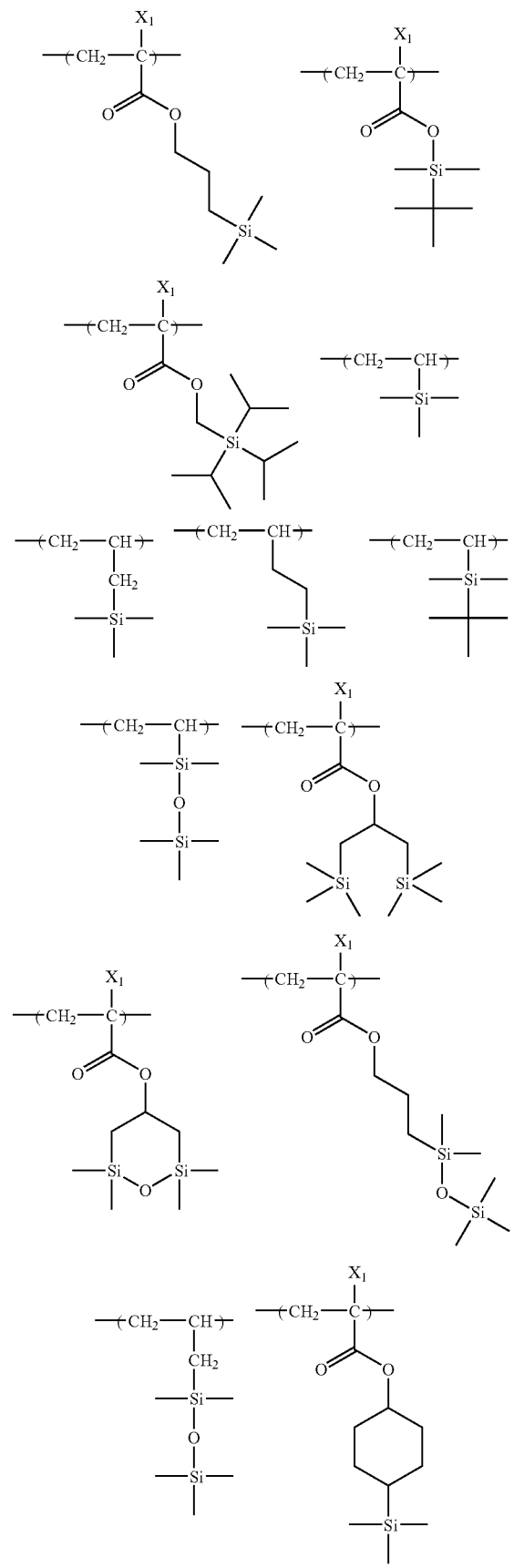

-continued

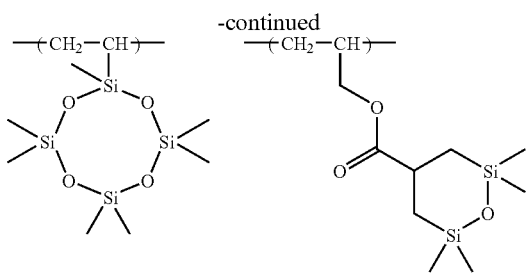

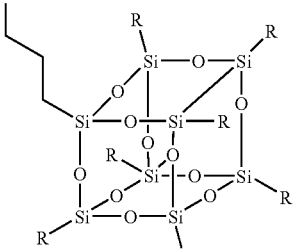

R = CH₃, C₂H₅, C₃H₇, C₄H₉

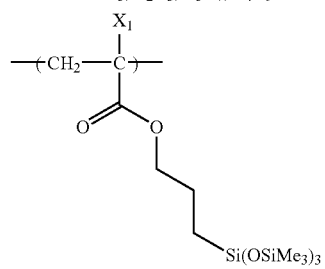

Furthermore, the hydrophobic resin (HR) may contain at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid.

Examples of the (x) alkali-soluble group include a group having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a bis(alkylsulfonyl)methylene group.

Preferred alkali-soluble groups include a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the hydrophobic resin (HR).

Specific examples of the repeating unit having (x) an alkali-soluble group are set forth below, but the present invention is not limited thereto.

In the formulae, Rx represents H, CH₃, CF₃ or CH₂OH.

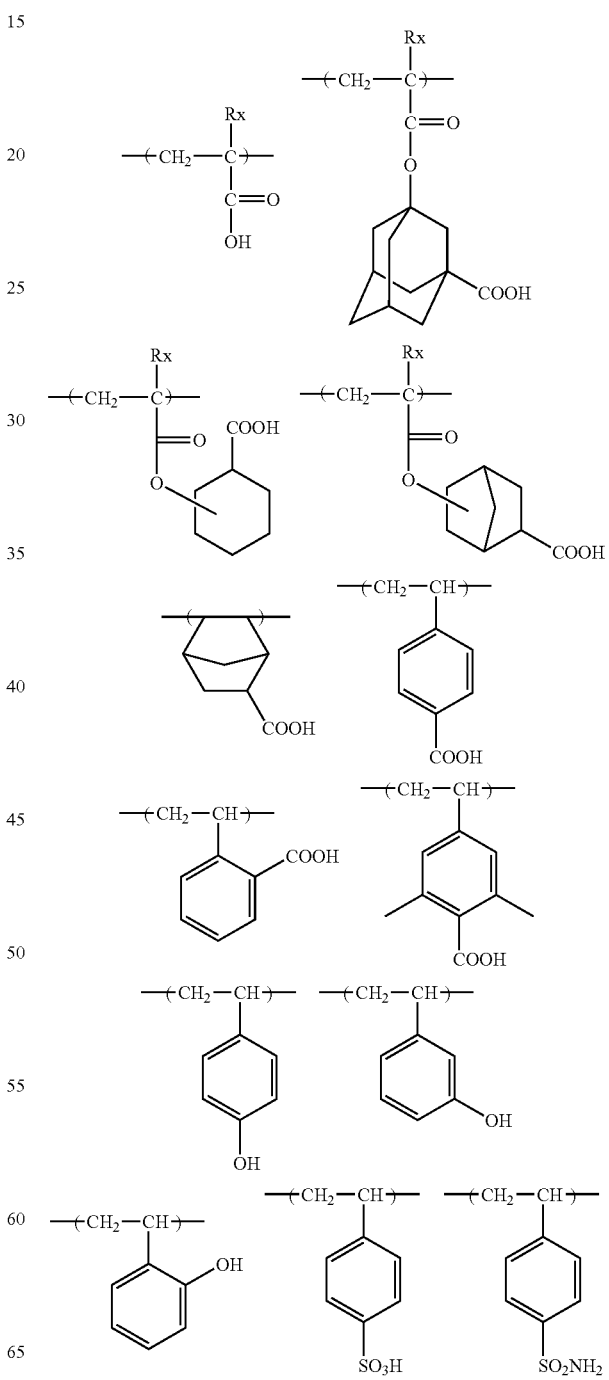

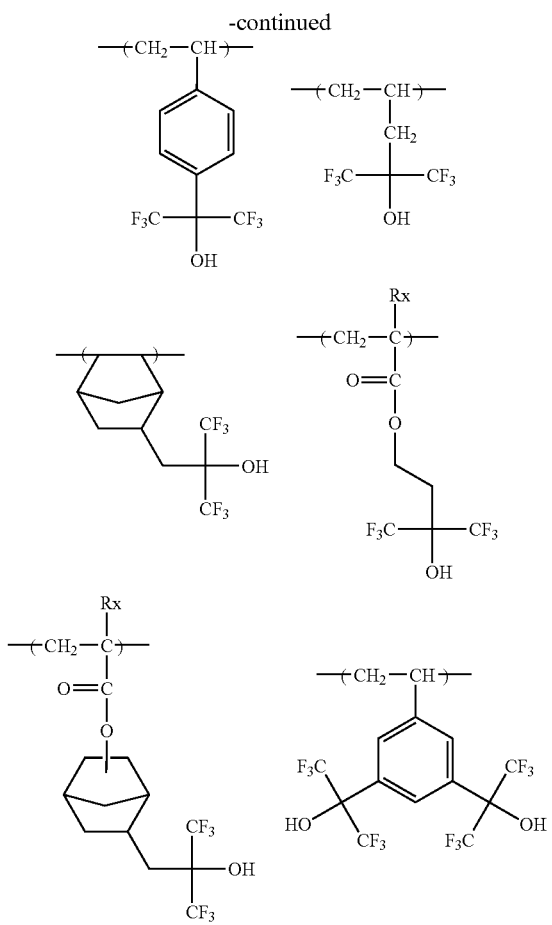
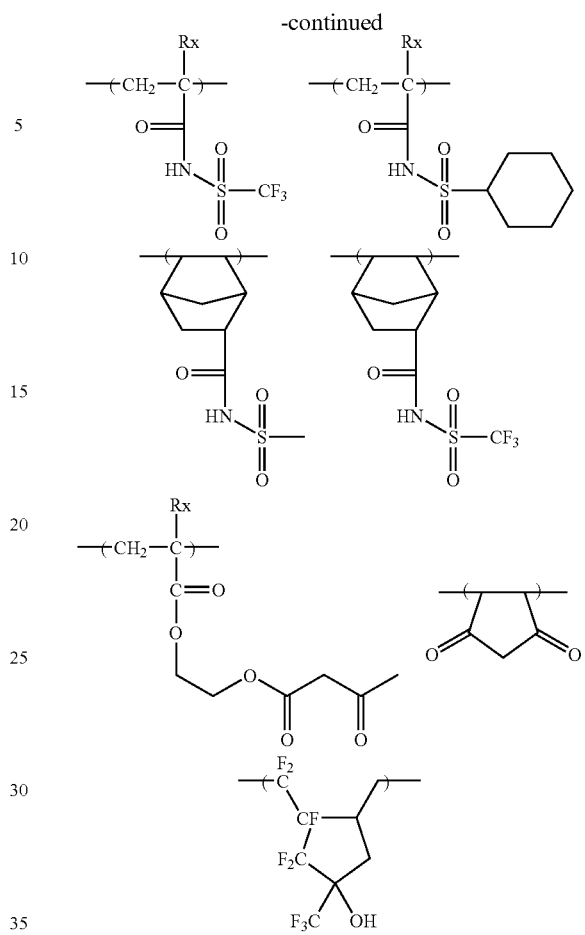
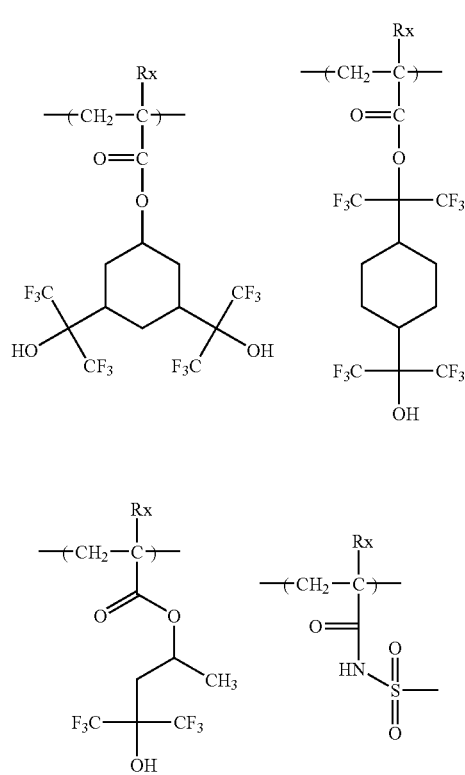

Examples of the (y) group capable of decomposing by the action of an alkali developer to increase the solubility in an alkali developer include a lactone structure-containing group, an acid anhydride group and an acid imide group, with a lactone group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing the group (y) at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the hydrophobic resin (HR).

Specific examples of the repeating unit having (y) a group capable of increasing the solubility in an alkali developer are the same as those of the repeating unit having a lactone structure described for the resin as the component (A).

Examples of the repeating unit having (z) a group capable of decomposing by the action of an acid, contained in the hydrophobic resin (HR), are the same as those of the repeating unit having an acid-decomposable group described for the resin as the component (A). In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the hydrophobic resin (HR).

The hydrophobic resin (HR) may further contain a repeating unit represented by the following formula (III):

(III)

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-equivalent weight average molecular of the hydrophobic resin (HR) is preferably from 1,000 to 100,000, more preferably from 1,000 to 50,000, still more preferably from 2,000 to 15,000.

In the hydrophobic resin (HR), similarly to the resin of the component (A), it is of course preferred that the content of impurities such as metal is small, but the content of residual monomers or oligomer components is also preferably from 0 to 10 mass %, more preferably from 0 to 5 mass %, still more preferably from 0 to 1 mass %. When these conditions are satisfied, a resist free of in-liquid extraneous substances and change with aging of sensitivity and the like can be obtained. Also, in view of resolution, resist profile, side wall of resist pattern, roughness and the like, the polydispersity is preferably from 1 to 5, more preferably from 1 to 3, still more preferably from 1 to 2.

As for the hydrophobic resin (HR), various commercial products may be used or the resin may be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the positive photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of combining water washing and an appropriate solvent to remove residual monomers or oligomer components; a purification method in a solution sate, such as ultrafiltration of removing by extraction only those having a molecular weight not more than a specific value; a reprecipitation method of adding dropwise the resin solution in a poor solvent to solidify the resin in the poor solvent and thereby remove residual monomers or the like; and a purification method in a solid state, such as washing of a resin slurry separated by filtration with a poor solvent. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units from the left), weight average molecular weight and dispersity of each resin are shown in Table 1 below.

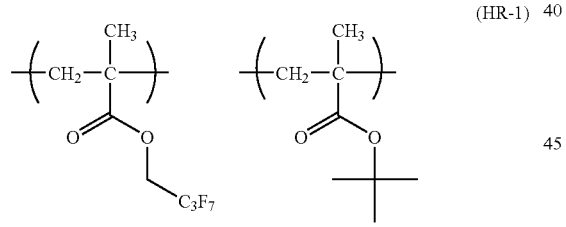
(HR-1)

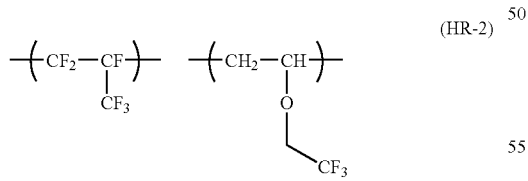
(HR-2)

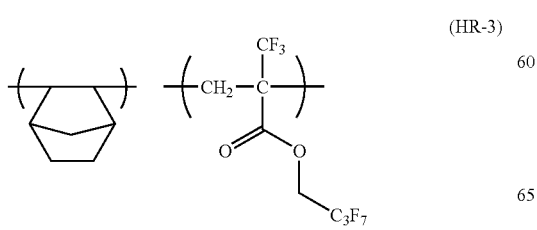
(HR-3)

-continued

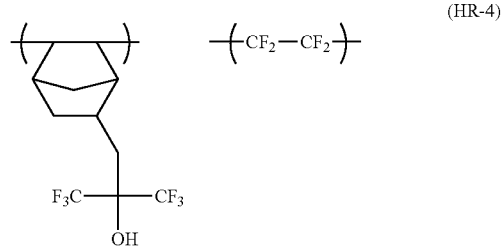
(HR-4)

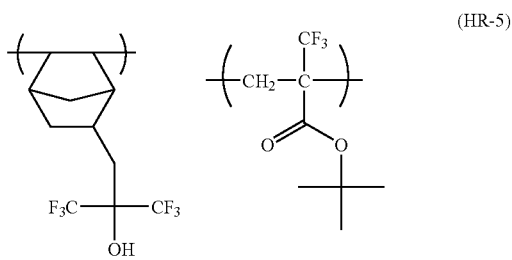
(HR-5)

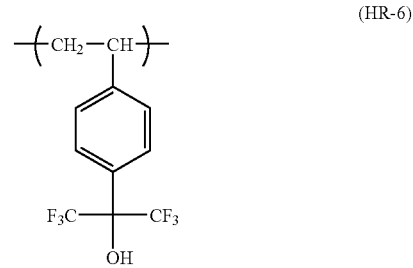
(HR-6)

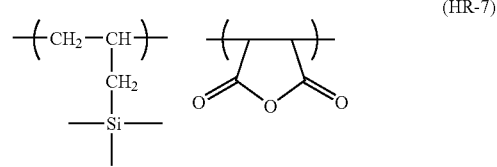
(HR-7)

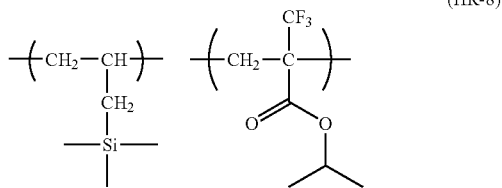
(HR-8)

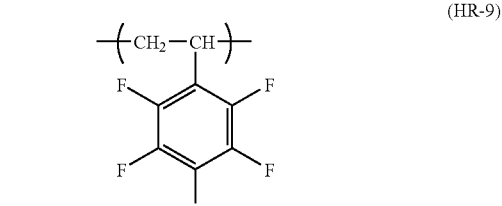
(HR-9)

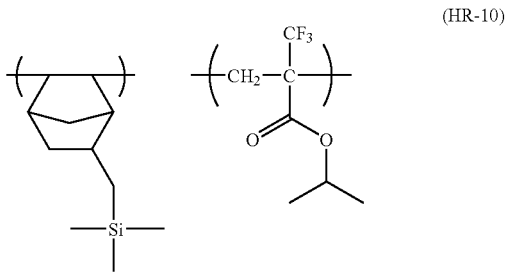
(HR-10)

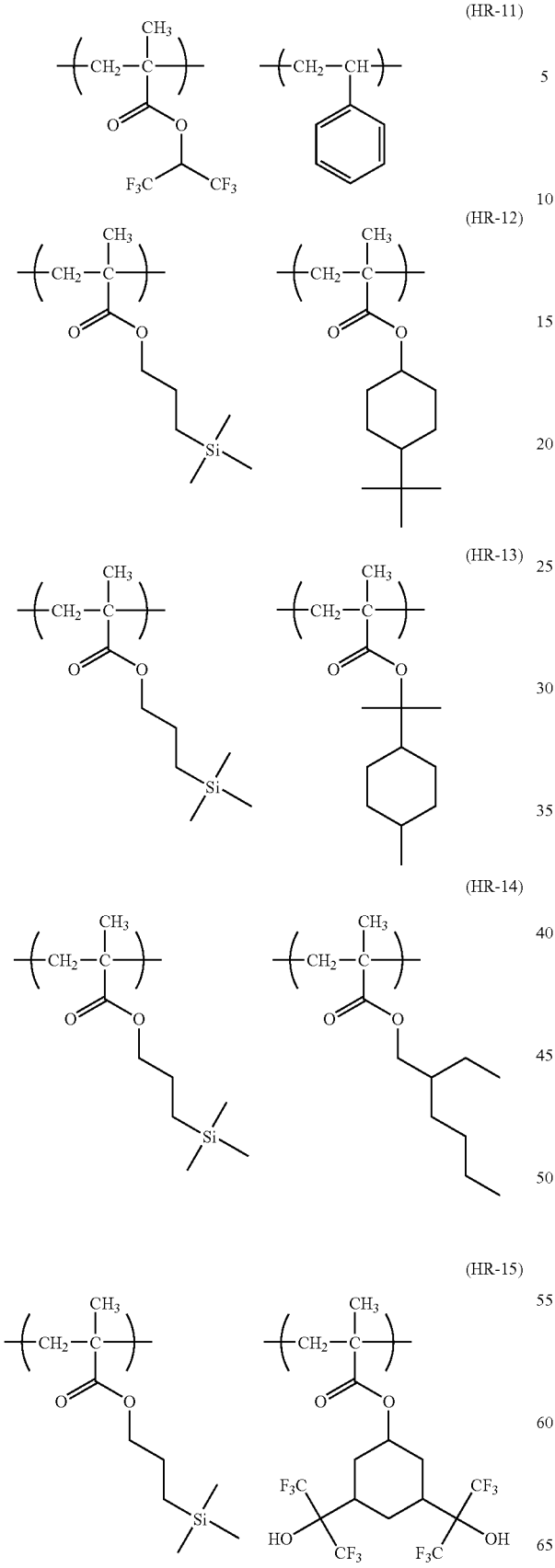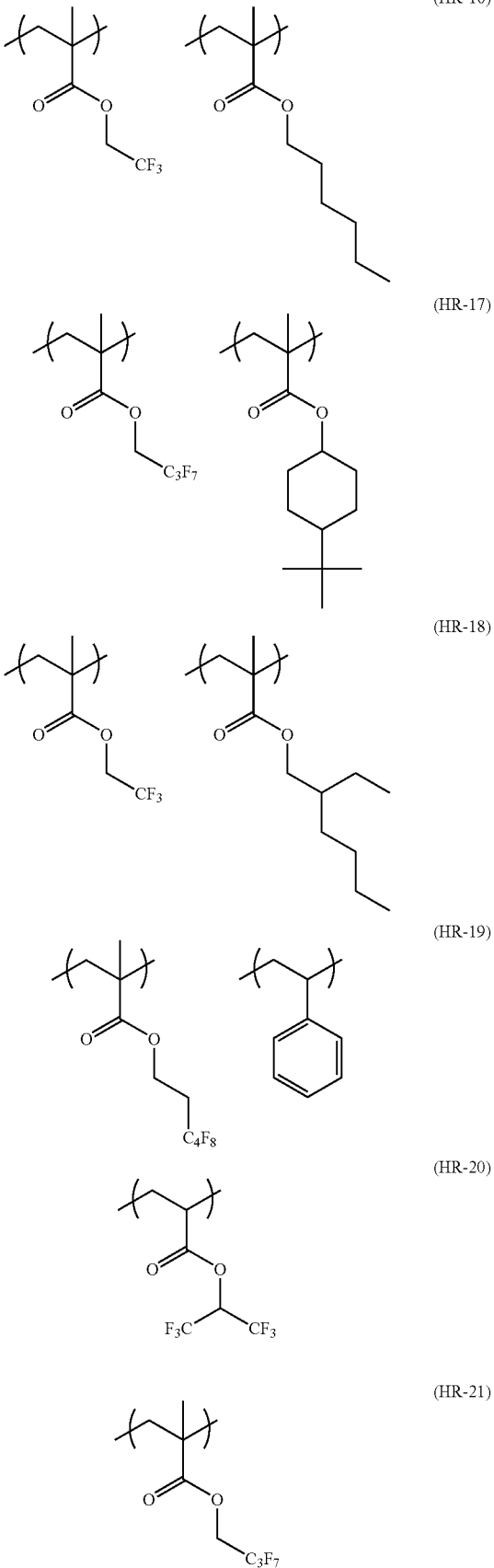

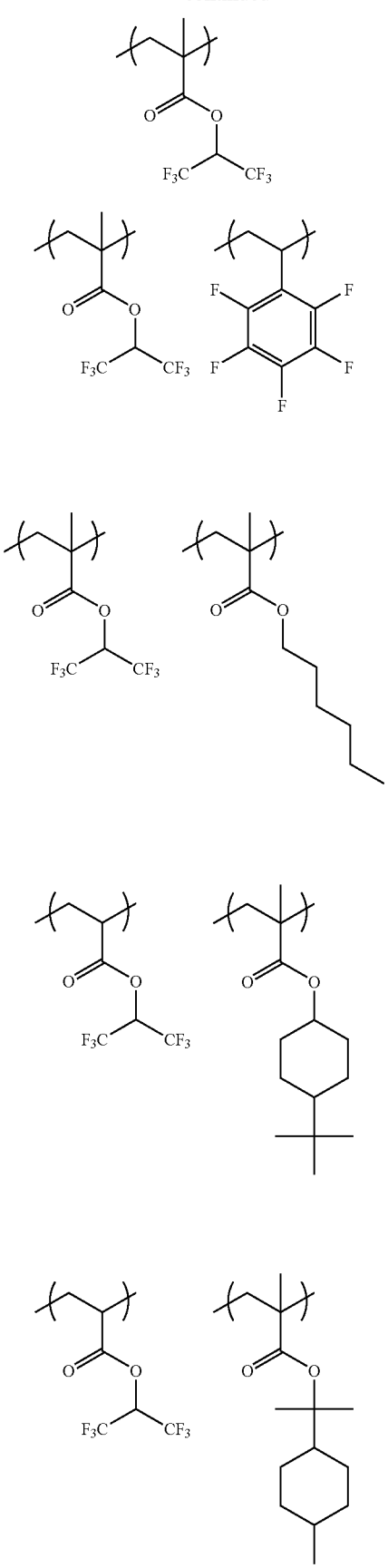
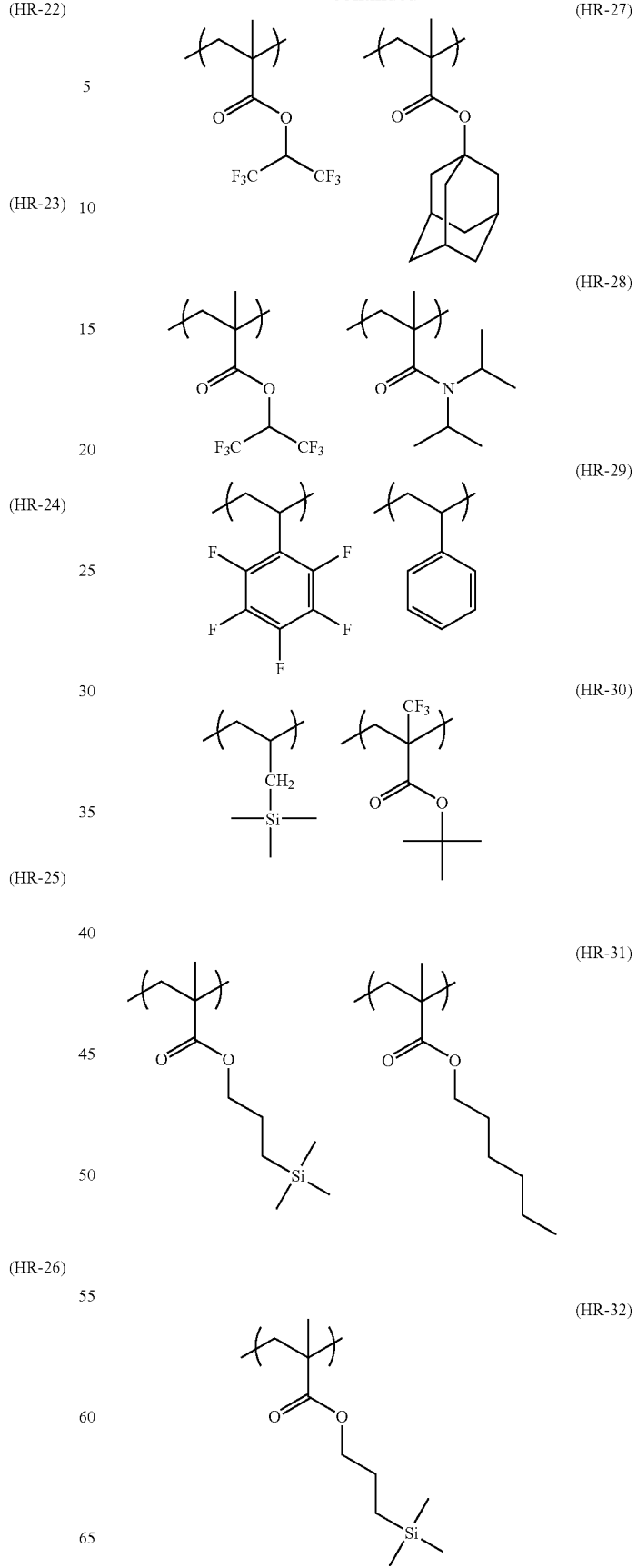

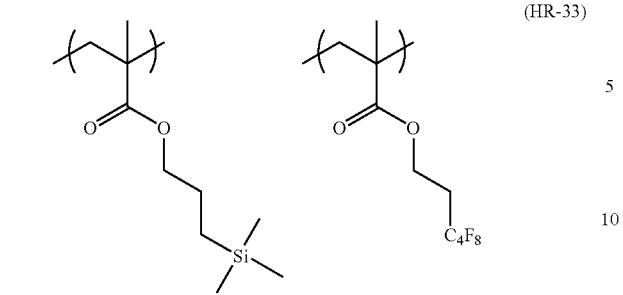
(HR-33)
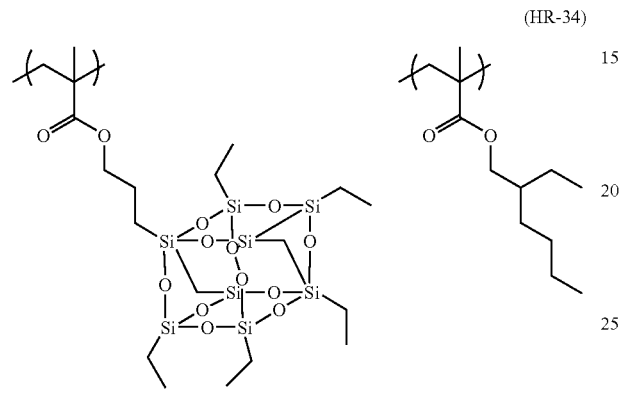
(HR-34)
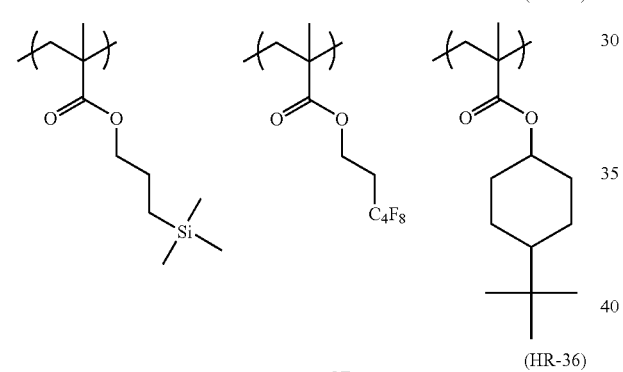
(HR-35)
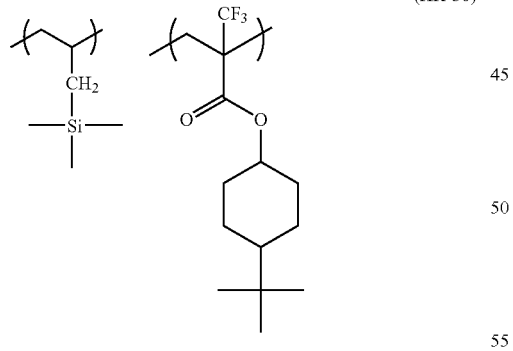
(HR-36)
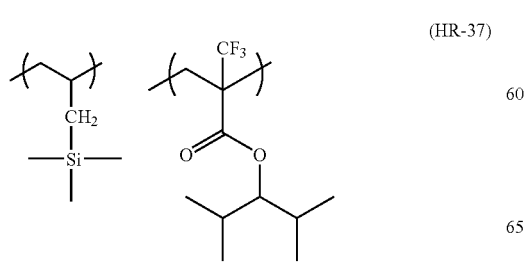
(HR-37)
(HR-38)
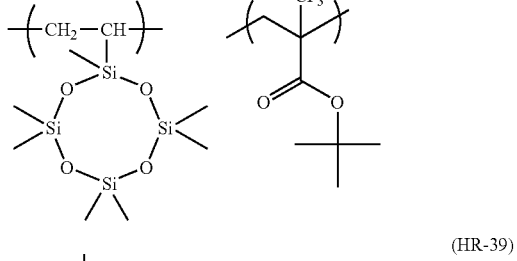
(HR-39)
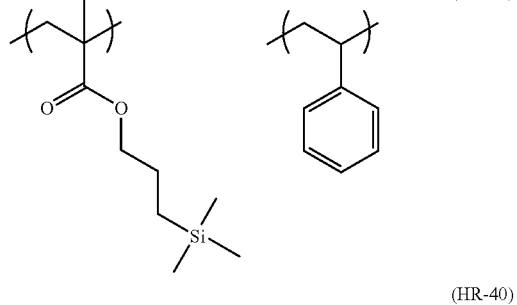
(HR-40)
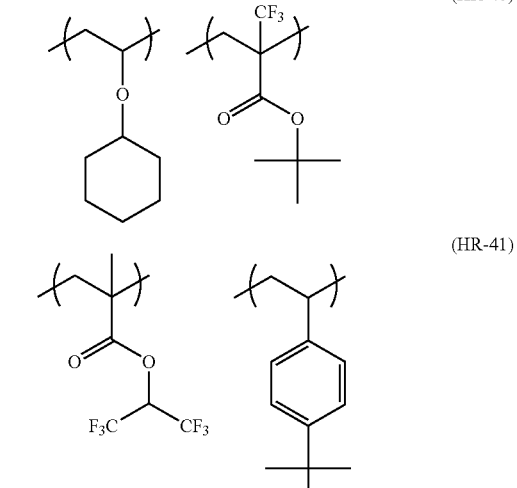
(HR-41)
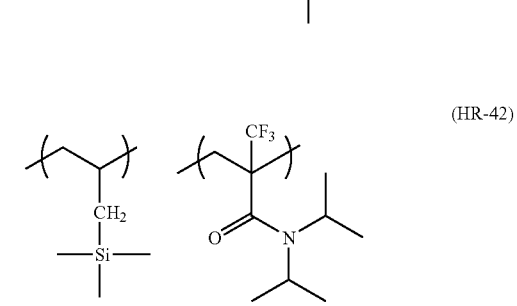
(HR-42)
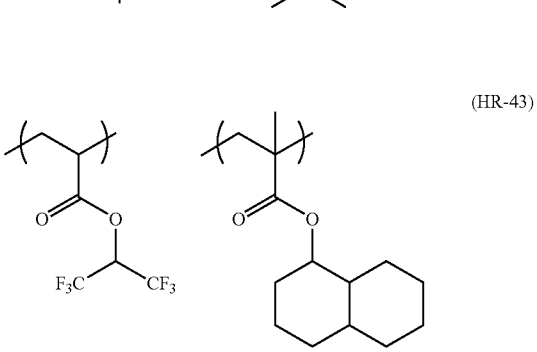
(HR-43)

(HR-44)
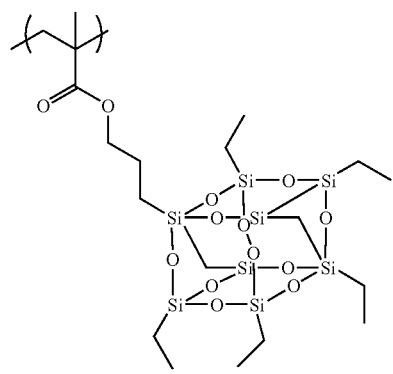
(HR-45)
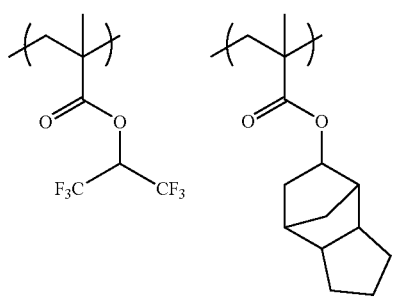
(HR-46)
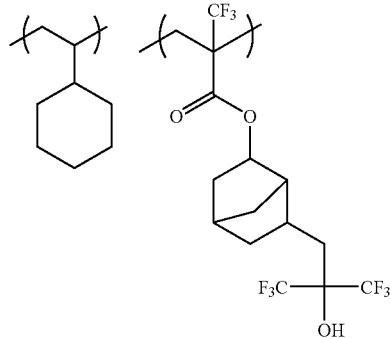
(HR-47)
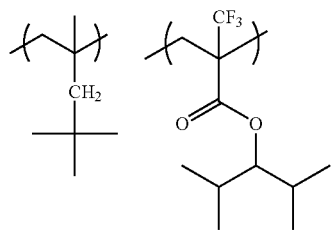
(HR-48)
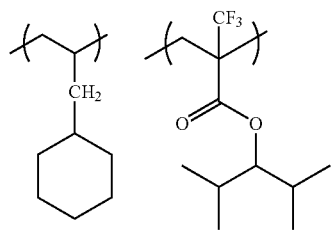
(HR-49)
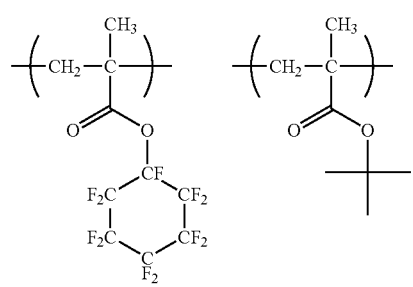
(HR-50)
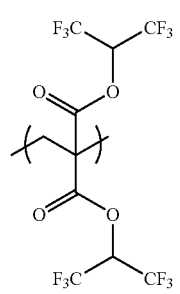
(HR-51)
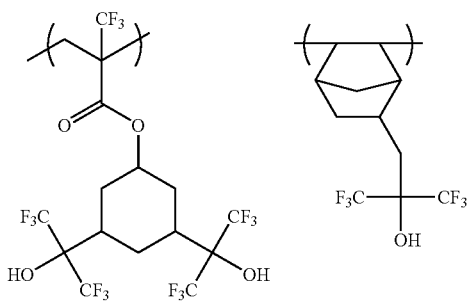
(HR-52)
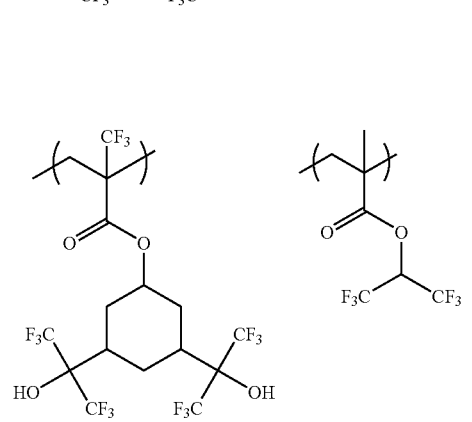
(HR-53)
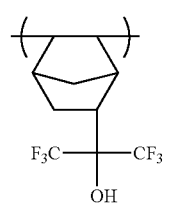

(HR-54) 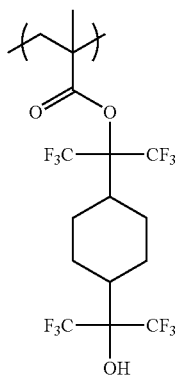
(HR-55) 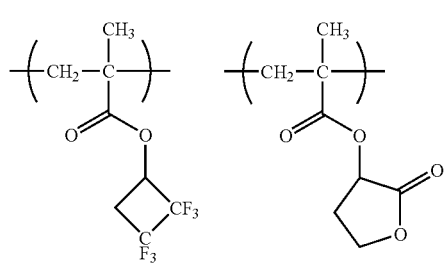
(HR-56) 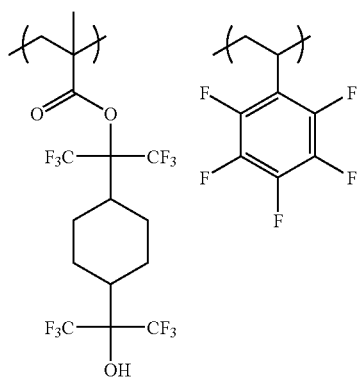
(HR-57) 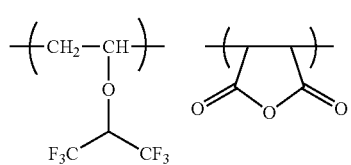
(HR-58) 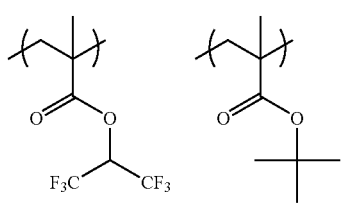
(HR-59) 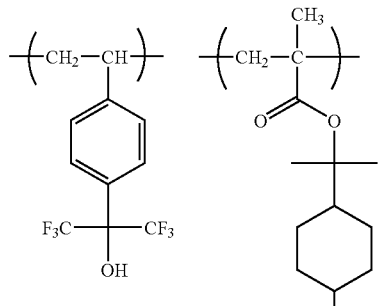
(HR-60) 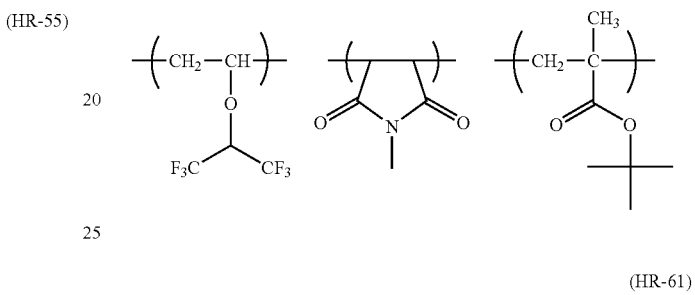
(HR-61) 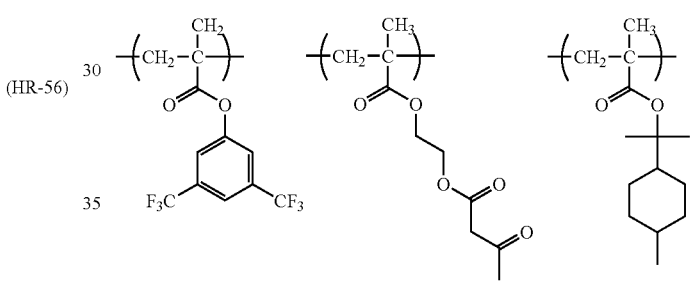
(HR-62) 
(HR-63) 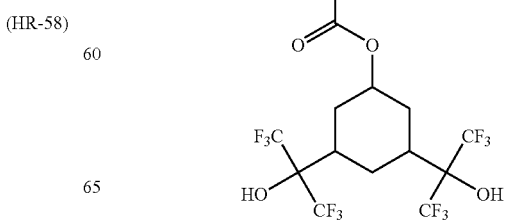

-continued
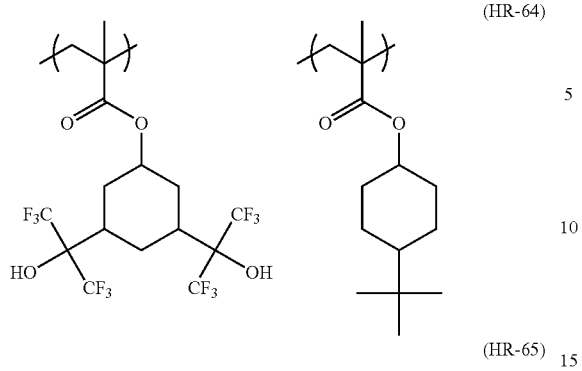
(HR-64)
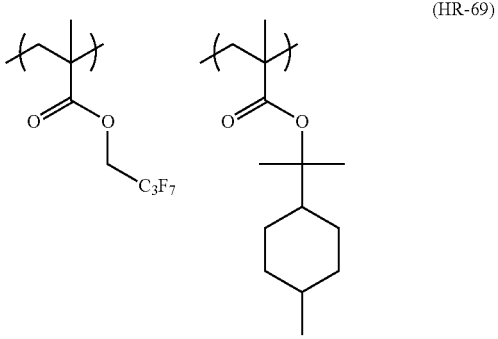
(HR-69)
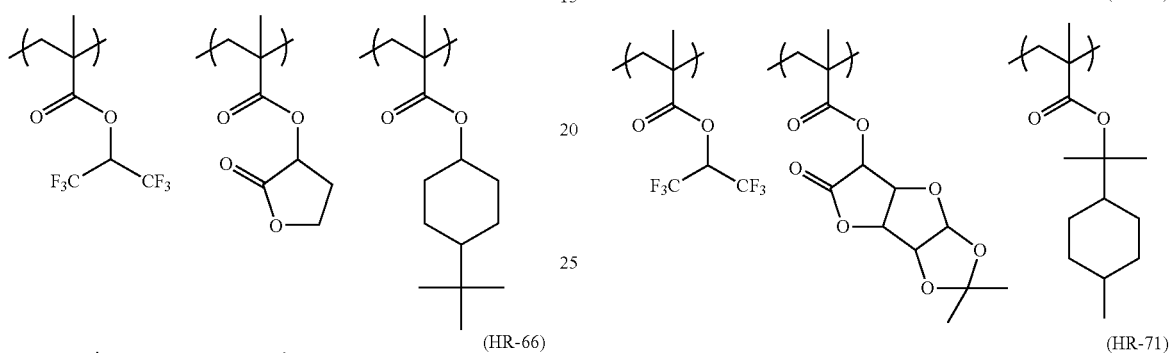
(HR-65)
(HR-70)
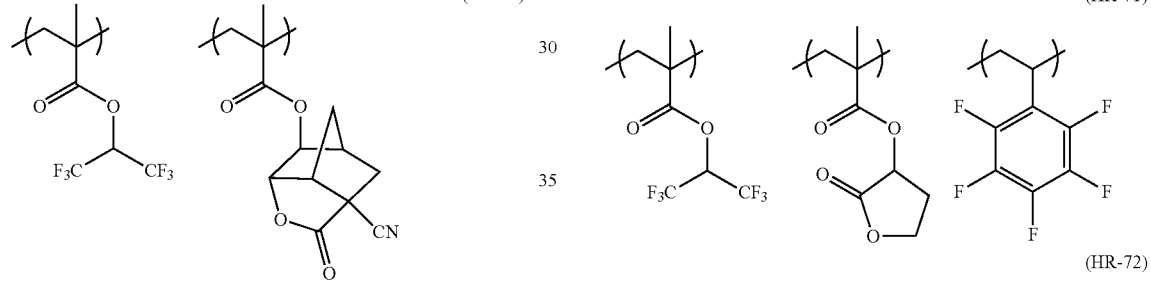
(HR-66)
(HR-71)
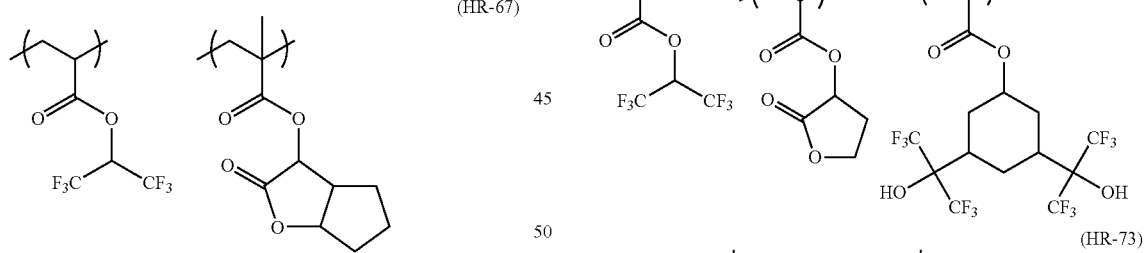
(HR-67)
(HR-72)
(HR-73)
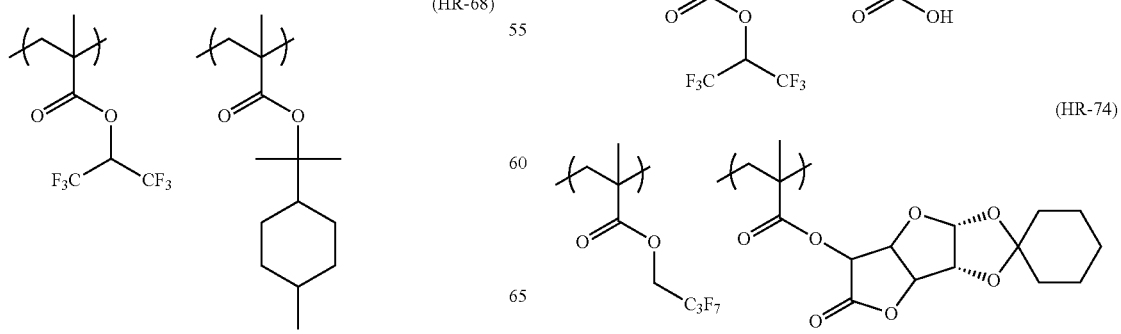
(HR-68)
(HR-74)

-continued
(HR-75)
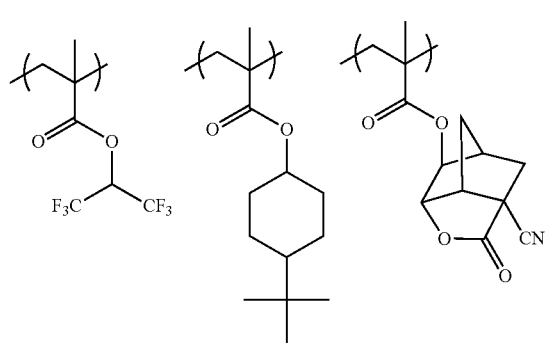
(HR-76)
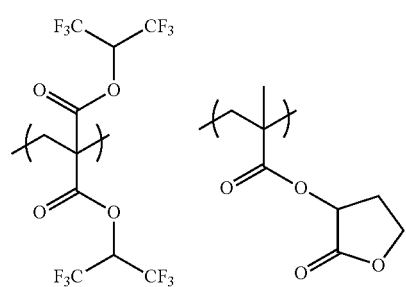
(HR-77)
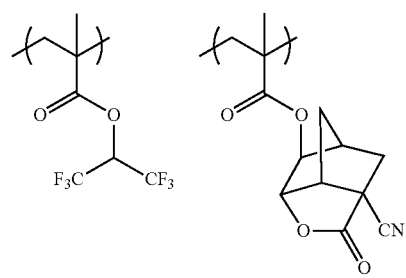
(HR-78)
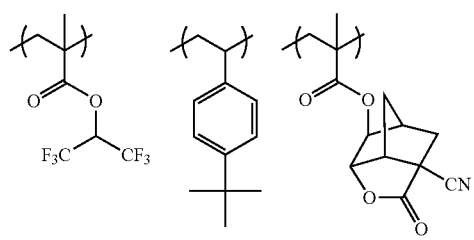
(HR-79)
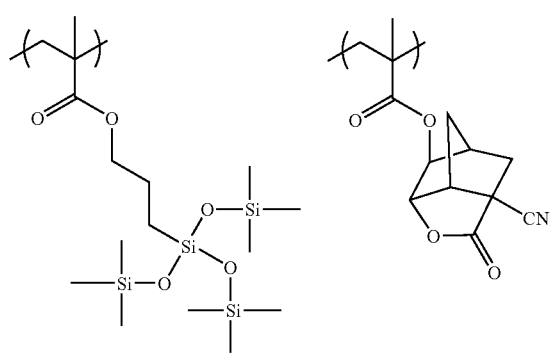
-continued
(HR-80)
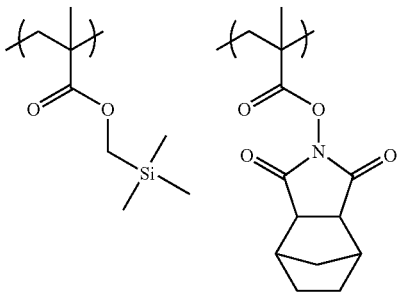
(HR-81)
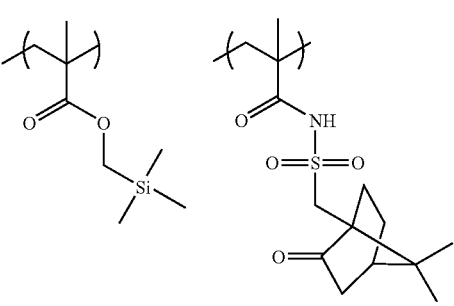
(HR-82)
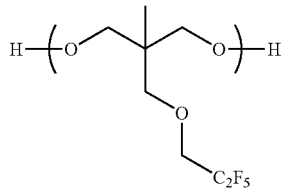
(HR-83)
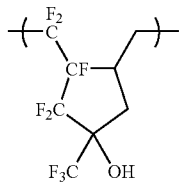
(HR-84)
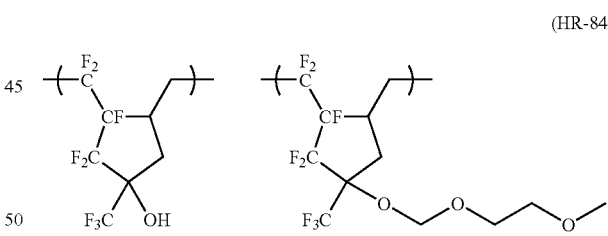
TABLE 1
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |

TABLE 1-continued

| Resin | Composition | Mw | Mw/Mn |
|---|---|---|---|
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

In order to prevent the resist film from directly contacting with the immersion liquid, a film (hereinafter, sometimes referred to as a "topcoat") sparingly soluble in the immersion liquid may be provided between the resist film formed of the positive photosensitive composition of the present invention and the immersion liquid. The functions required of the topcoat are suitability for coating as an overlayer of the resist, transparency to radiation particularly at 193 nm, and scarce solubility in the immersion liquid. The topcoat is preferably unmixable with the resist and capable of being uniformly applied as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. If impurities are dissolved out into the immersion liquid from the topcoat, the optical lens is contaminated. In this viewpoint, the amount of residual monomers of the polymer contained in the topcoat is preferably smaller.

On peeling off the topcoat, a developer may be used or a releasing agent may be separately used. The releasing agent is preferably a solvent less permeating into the resist film. From the standpoint that the peeling step can be performed simultaneously with the development step of the resist film, the topcoat is preferably peelable with an alkali developer and in terms of peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. At the exposure with ArF excimer laser (wavelength: 193 nm), when water is used as the immersion liquid, the topcoat for ArF immersion exposure preferably has a refractive index close to the refractive index of the immersion liquid. From the standpoint of approximating the refractive index to that of the immersion liquid, the topcoat preferably contains a fluorine atom. Also, in view of transparency and refractive index, the topcoat is preferably a thin film.

The topcoat is preferably unmixable with the resist film and further unmixable with the immersion liquid. From this standpoint, when the immersion liquid is water, the topcoat solvent is preferably a medium that is sparingly soluble in the solvent used for the positive photosensitive composition and insoluble in water. Furthermore, when the immersion liquid is an organic solvent, the topcoat may be either water-soluble or water-insoluble.

EXAMPLES

Synthesis of Monomer

10 Grams of 3-hydroxy-2,2-dimethylcyclohexanone was dissolved in 80 ml, and 0.75 g of sodium bicarbonate and further 30 g of m-chlorobenzoic acid were added thereto. The resulting mixture was stirred at room temperature for 4 hours, and an aqueous sodium thiosulfate solution was added thereto. Furthermore, 100 ml of ethyl acetate was added, and the organic layer was washed with water, dried and concentrated to obtain 8.7 g of a crude product.

tion and dried to obtain 6.20 g of Resin (P1). The weight average molecular weight of the obtained Resin (P1) was 13,600, and the polydispersity (Mw/Mn) was 1.91.

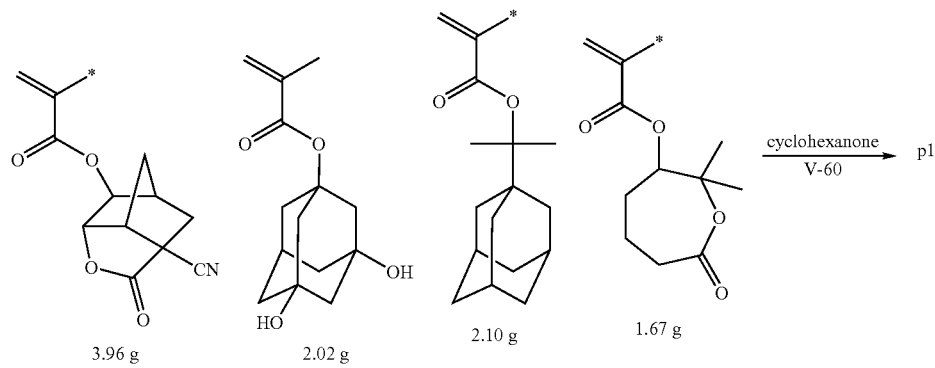

The obtained crude product and 11.5 g of triethylamine were dissolved in 100 ml of tetrahydrofuran (Solution A). A solution prepared by dissolving 8.8 g of methacrylic acid chloride in 50 ml of tetrahydrofuran was added dropwise to Solution A under ice cooling over 30 minutes, and the resulting mixture was stirred at room temperature for 5 hours. Subsequently, 200 ml of ethyl acetate was added thereto, and the organic layer was washed with water, dried and concentrated to obtain a crude product. The crude product was purified by silica gel chromatography, as a result, 8.0 g of a monomer was obtained. 300 MHz-$^1$H-NMR (CDCl$_3$) $\delta$1.45 (s, 3H), $\delta$1.54 (s, 3H), $\delta$1.55-$\delta$2.07 (m, 7H), $\delta$2.65-2.80 (m, 2H), $\delta$5.05 (s, 1H), $\delta$5.60 (s, 1H), $\delta$6.15 (s, 1H).

With respect to Acid-Decomposable Resins (P1) to (P19) used in Examples and Resins (Q1) and (Q2) used in Comparative Examples, the structure, compositional ratio (by mol), weight average molecular weight and polydispersity are shown below.

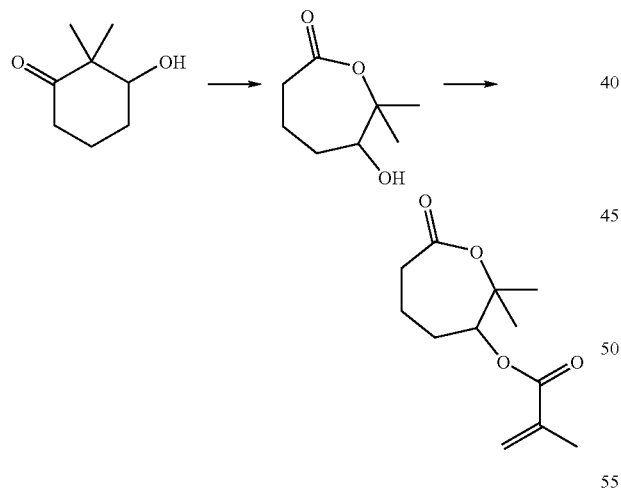

(Synthesis of Polymer)

Under a nitrogen stream, 3.90 g of cyclohexanone was charged into a three-neck flask and heated at 80° C. Thereto, a solution prepared by dissolving the monomers shown below in 35.1 g of cyclohexanone and further dissolving a polymerization initiator, V-60 (produced by Wako Pure Chemical Industries, Ltd.), in a ratio of 8 mol % based on the monomers was added dropwise over 6 hours. After the completion of dropwise addition, the reaction was allowed to further proceed at 80° C. for 2 hours. The reaction solution was left to cool and then poured in 350 ml of hexane/150 ml of ethyl acetate, and the precipitated powder was collected by filtra-

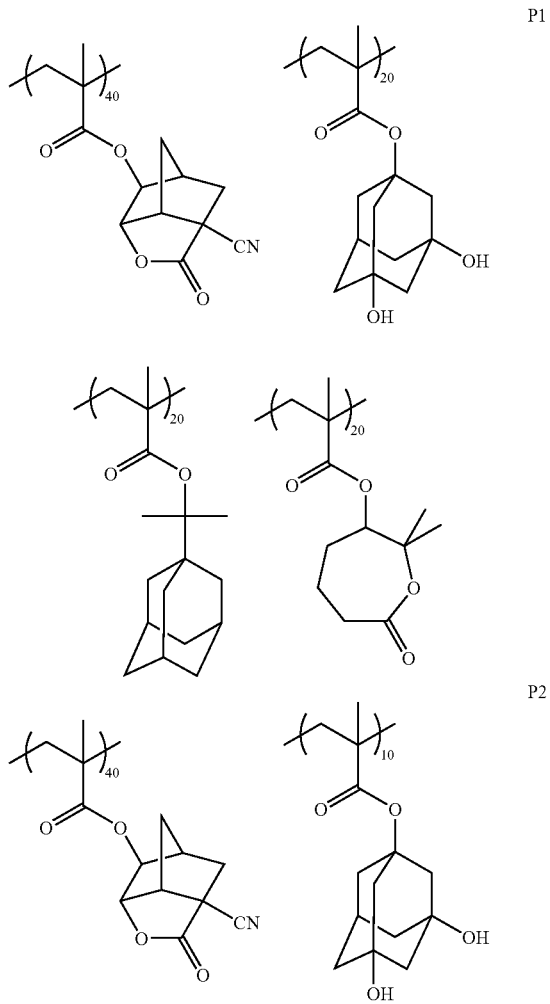

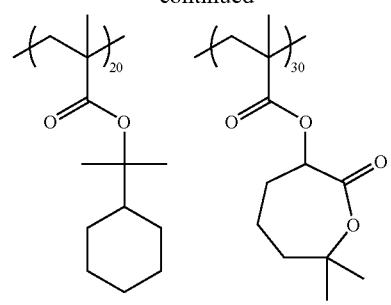
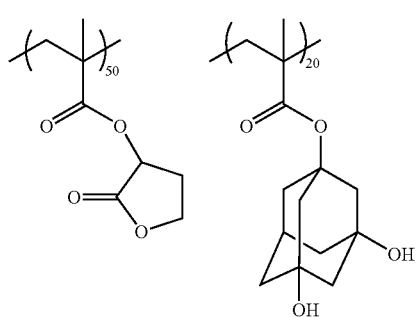
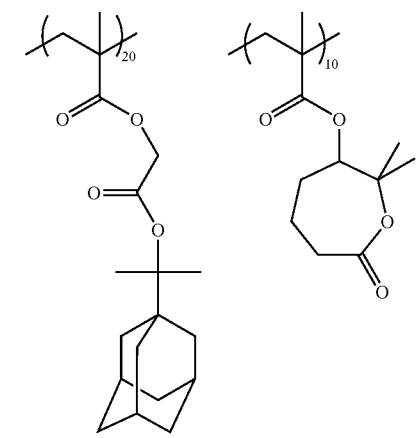
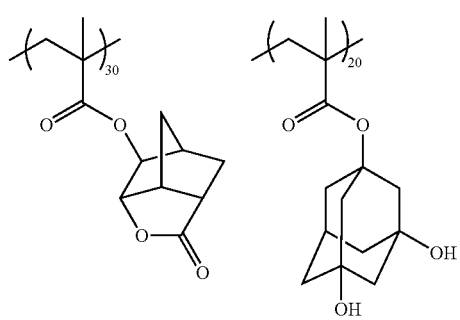
P3
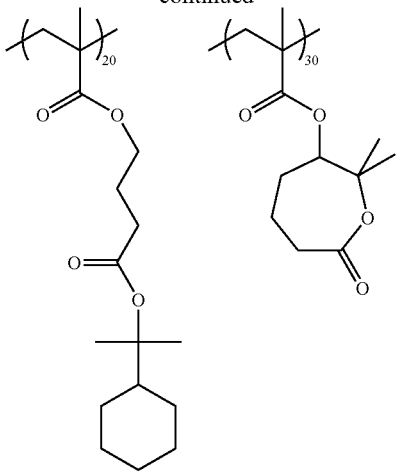
P5
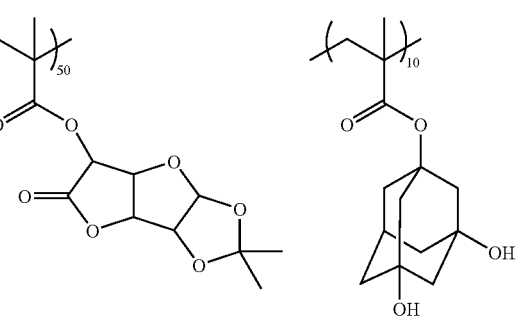
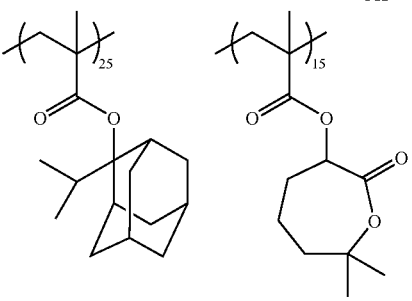
P6
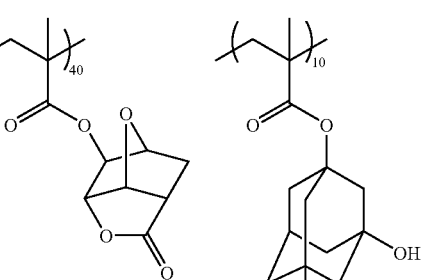
P4
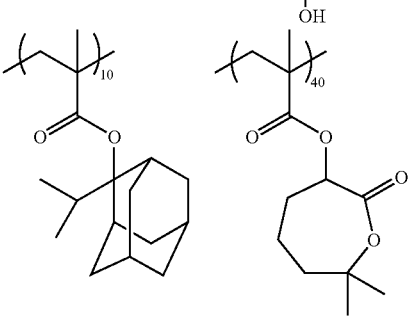

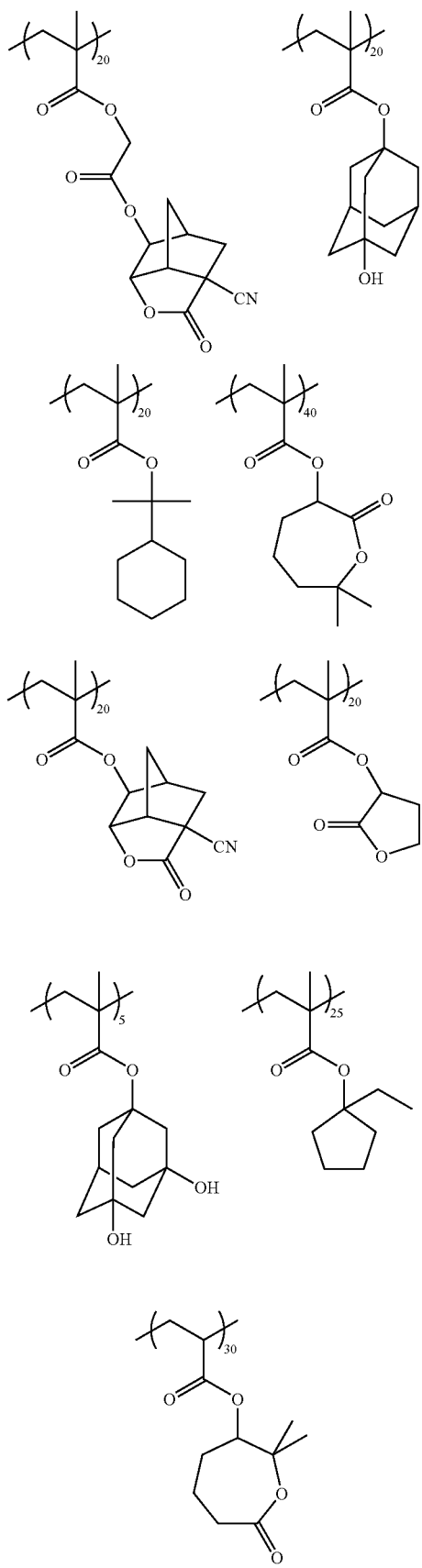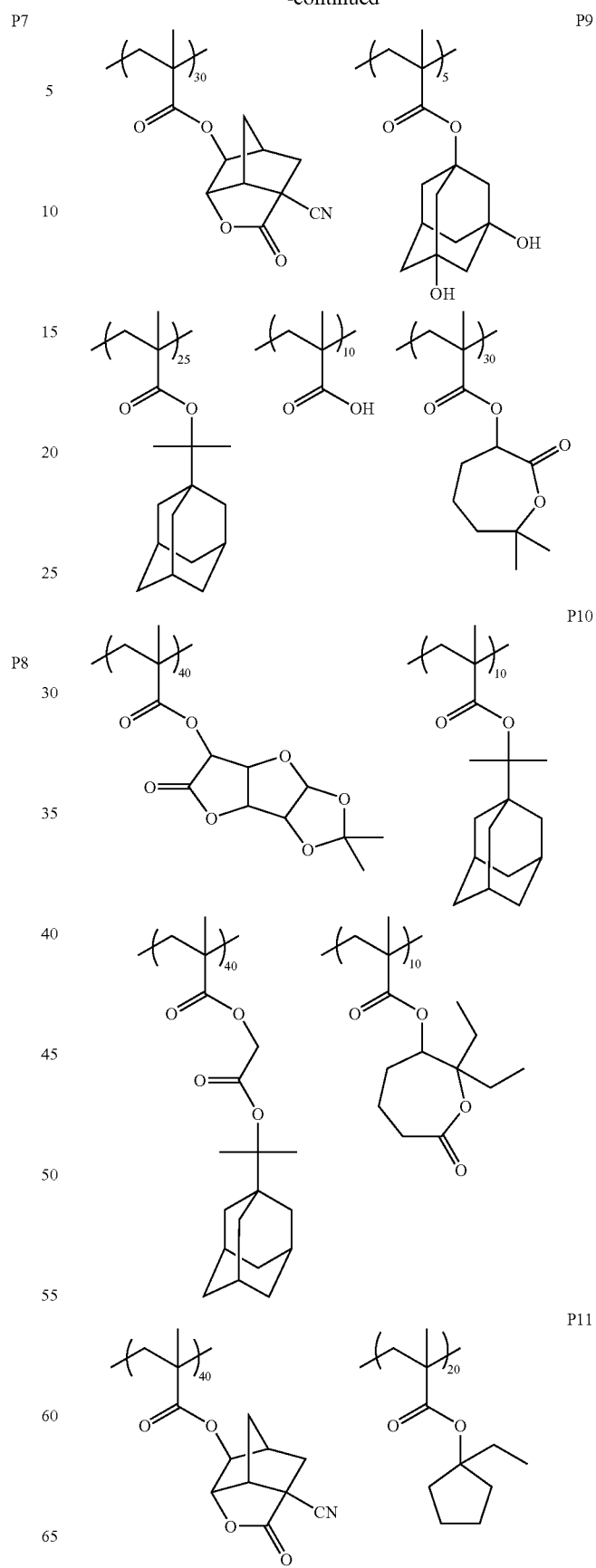

-continued
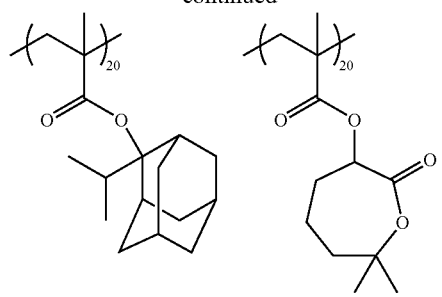
P12
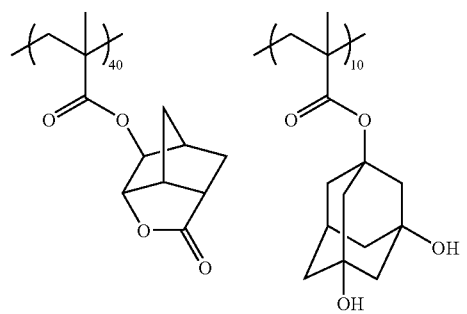
P13
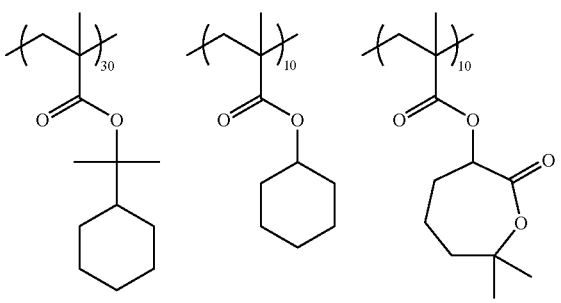
-continued
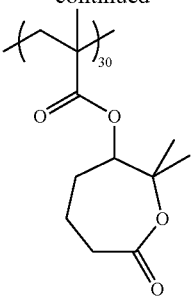
P14
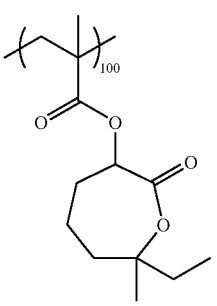
P15
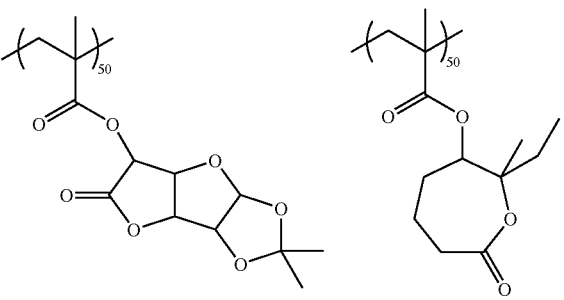
P16
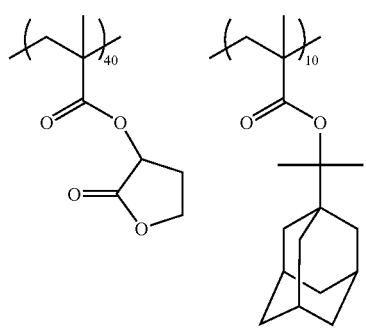
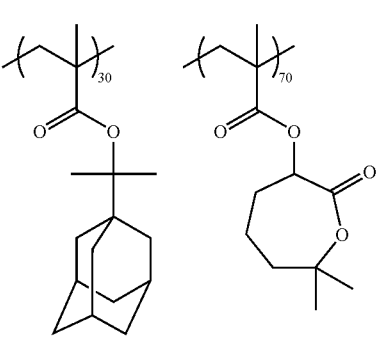
P17
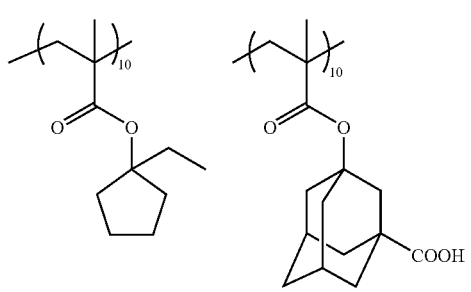

-continued

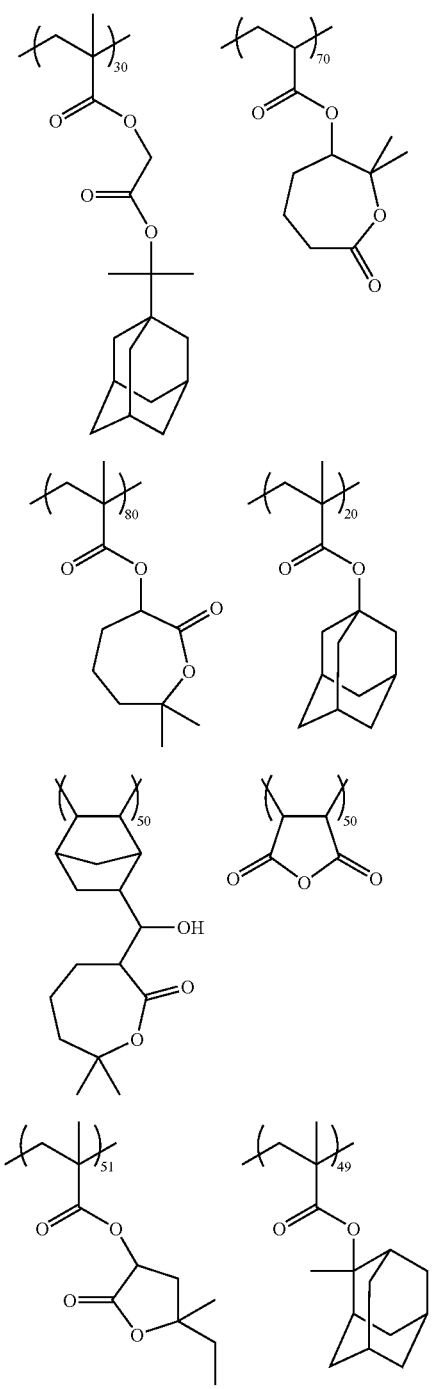

TABLE 2

| | Molecular Weight | Polydispersity (Mw/Mn) |
|---|---|---|
| P2 | 11000 | 1.84 |
| P3 | 10000 | 1.82 |
| P4 | 8200 | 1.68 |
| P5 | 7000 | 1.76 |
| P6 | 8900 | 1.79 |
| P7 | 8600 | 1.90 |
| P8 | 8400 | 1.94 |
| P9 | 6500 | 1.74 |

TABLE 2-continued

| | Molecular Weight | Polydispersity (Mw/Mn) |
|---|---|---|
| P10 | 12550 | 2.06 |
| P11 | 10000 | 1.95 |
| P12 | 12300 | 2.37 |
| P13 | 9500 | 1.78 |
| P14 | 20100 | 2.10 |
| P15 | 9200 | 1.67 |
| P16 | 12000 | 2.24 |
| P17 | 14500 | 2.12 |
| P18 | 13600 | 1.99 |
| P19 | 10800 | 1.92 |
| Q1 | 6200 | 1.80 |
| Q2 | 7500 | 1.80 |

Examples 1 to 19 and Comparative Examples 1 and 2

Dry Exposure

<Preparation of Resist>

The components shown in Table 3 below were dissolved in a solvent to prepare a solution having a solid content concentration of 5 mass %, and the obtained solution was filtered through a polyethylene filter having a pore size of 0.1 μm to prepare a positive resist composition. The positive resist compositions prepared were evaluated by the following methods, and the results are shown in Table 3.

<Evaluation of Resist>

(Exposure Condition (1): Normal Dry Exposure)

An organic antireflection film, ARC29A (produced by Nissan Chemical Industries, Ltd.), was applied on a silicon wafer and baked at 205° C. for 60 seconds to form a antireflection film with a film thickness of 78 nm, and the positive resist composition prepared was applied thereon and baked at 130° C. for 60 seconds to form a resist film with a film thickness of 120 nm. The obtained wafer was exposed using an ArF excimer laser scanner (PAS5500/1100, manufactured by ASML, NA: 0.75) through a 6% halftone mask having a line-and-space pattern (line:space=1:1) with a line width of 65 nm. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

(Exposure Latitude)

The exposure dose for reproducing a line-and-space mask pattern (line:space=1:1) with a line width of 65 nm was defined as an optimal exposure dose, the exposure dose latitude allowing a pattern size of 65 nm±10% when varying the exposure dose was determined, this value was divided by the optimal exposure dose, and the value obtained was expressed in percentage. A larger value indicates smaller fluctuation of performance due to change in the exposure dose and better exposure latitude (EL (%)).

(Line Edge Roughness)

In the measurement of line edge roughness (nm), the resist was exposed with an optimal exposure dose by using a line-and-space (line:space=1:1) pattern having a line width of 65 nm and developed, and the obtained line of 65 nm in line width was observed using a critical dimension scanning electron microscope (SEM). With respect to the longitudinal edge in the range of 5 μm of the line pattern, the distance from the reference line where the edge should be present was measured at 50 points by a Critical Dimension SEM (S-8840, manufactured by Hitachi Ltd.), the standard deviation was determined, and 3σ was computed. A smaller value indicates higher performance.

TABLE 3

| | Resin (10 g) | (B) Photo-Acid Generator (g) | Basic Compound (g) | Surfactant (g) | Dissolution Inhibiting Compound (g) | Organic Solvent | EL (%) | Line Edge Roughness (nm) |
|---|---|---|---|---|---|---|---|---|
| Example 1 | P1 | z54 (0.5) | N-1 (0.05) | W-1 (0.02) | — | SL-2/SL-4 = 6/4 | 15.5 | 5.8 |
| Example 2 | P2 | z2 (0.55) | N-2 (0.05) | W-1 (0.02) | — | SL-2/SL-4 = 6/4 | 14.8 | 5.4 |
| Example 3 | P3 | z2 (0.25), z42 (0.2) | N-3 (0.045) | W-3 (0.02) | — | SL-2 = 1 | 15.6 | 5.6 |
| Example 4 | P4 | z54 (0.35), z51 (0.2) | N-2 (0.05) | W-1 (0.02) | D-1 (0.5) | SL-2/SL-4 = 6/4 | 13.8 | 5.6 |
| Example 5 | P5 | z38 (0.5) | N-1 (0.01), N-2 (0.04) | W-1 (0.02) | — | SL-1/SL-5 = 7/3 | 14.8 | 5.7 |
| Example 6 | P6 | z2 (0.55) | N-3 (0.003) | W-1 (0.02) | — | SL-2/SL-4 = 6/4 | 15.7 | 5.7 |
| Example 7 | P7 | z14 (0.5) | N-2 (0.04) | W-1 (0.02) | — | SL-1 = 1 | 15.0 | 5.4 |
| Example 8 | P8 | z2 (0.4) | N-7 (0.02) | W-1 (0.10) | — | SL-2/SL-4 = 6/4 | 14.4 | 5.3 |
| Example 9 | P9 | z2 (0.2), z42 (0.35) | N-2 (0.055) | W-4 (0.02) | D-1 (0.5) | SL-1/SL-3 = 9/1 | 13.7 | 5.6 |
| Example 10 | P10 | z2 (0.4), z29 (0.1) | N-4 (0.04) | W-2 (0.05) | — | SL-2/SL-4 = 6/4 | 15.2 | 5.5 |
| Example 11 | P11 | z12 (0.37), z30 (0.25) | N-6 (0.02) | W-1 (0.02) | — | SL-2 = 1 | 14.6 | 5.3 |
| Example 12 | P12 | z2 (0.56) | N-2 (0.05) | W-1 (0.02) | — | SL-2/SL-4 = 4/6 | 13.8 | 5.7 |
| Example 13 | P13 | z38 (0.35) | N-5 (0.035) | W-1 (0.02) | — | SL-2/SL-4 = 6/4 | 14.3 | 5.5 |
| Example 14 | P14 | z54 (0.60) | N-2 (0.055) | W-1 (0.02) | — | SL-1 = 1 | 12.0 | 6.5 |
| Example 15 | P15 | z54 (0.50) | N-1 (0.05) | W-1 (0.02) | — | SL-2/SL-4 = 6/4 | 11.9 | 6.0 |
| Example 16 | P16 | z38 (0.50) | N-1 (0.01), N-2 (0.04) | W-2 (0.01) | — | SL-1/SL-5 = 7/3 | 12.8 | 6.4 |
| Example 17 | P17 | z38 (0.55) | N-2 (0.04), N-6 (0.02) | W-1 (0.02) | — | SL-1 = 1 | 12.5 | 6.3 |
| Example 18 | P18 | z2 (0.55) | N-2 (0.05) | W-1 (0.02) | — | SL-2/SL-4 = 4/6 | 11.8 | 6.3 |
| Example 19 | P19 | z38 (0.5) | N-1 (0.01), N-2 (0.04) | W-1 (0.02) | — | SL-1/SL-5 = 7/3 | 11.0 | 6.5 |
| Comparative Example 1 | Q1 | z2 (0.35) | N-1 (0.03) | W-1 (0.02) | — | SL-2/SL-4 = 6/4 | 8.6 | 8.0 |
| Comparative Example 2 | Q2 | z38 (0.55) | N-2 (0.05) | W-1 (0.02) | — | SL-1 = 1 | 9.2 | 7.8 |

As apparent from the results in Table 3, the positive photosensitive composition of the present invention ensures good performances of wide exposure latitude and small line edge roughness.

Examples 20 to 38 and Comparative Examples 3 and 4

Immersion Exposure

<Preparation of Resist>

The components shown in Table 4 below were dissolved in a solvent to prepare a solution having a solid content concentration of 5 mass %, and the obtained solution was filtered through a polyethylene filter having a pore size of 0.1 µm to prepare a positive resist composition. The positive resist compositions prepared were evaluated by the following methods, and the results are shown in Table 4. With respect to each component in the Table, the ratio when using a plurality of kinds is a ratio by mass Incidentally, in the Table, when the positive resist composition contained a hydrophobic resin (HR), the mode of addition is denoted by "added", and when the positive resist composition did not contain a hydrophobic resin (HR) and after the formation of a resist film, a topcoat protective film containing a hydrophobic resin (HR) was formed as an overlayer of the resist film, the mode of addition is denoted by "TC".

(Exposure Condition (2): Immersion Exposure)

An organic antireflection film, ARC29A (produced by Nissan Chemical Industries, Ltd.), was applied on a silicon wafer and baked at 205° C. for 60 seconds to form an antireflection film having a film thickness of 78 nm, and the positive resist composition prepared was applied thereon and baked at 130° C. for 60 seconds to form a resist film having a film thickness of 120 nm.

When the addition mode of the hydrophobic resin (HR) is "TC", the following operation was performed after the formation of the resist film.

<Topcoat Forming Method>

The hydrophobic resin (HR) shown in Table 4 was dissolved in the solvent shown in Table 4 and applied by a spin coater on the resist film above, and the wafer was dried by heating at 115° C. for 60 seconds to form a 0.05 µm-thick topcoat layer. At this time, the topcoat was observed whether coating unevenness was present or not, and it was confirmed that the topcoat was uniformly applied without coating unevenness.

The obtained wafer was exposed using an ArF excimer laser immersion scanner (PAS5500/1250i, manufactured by ASML, NA: 0.85) through a 6% halftone mask having a line-and-space pattern (line:space=1:1) of 65 nm in line width. The immersion liquid used was ultrapure water. Thereafter, the resist film was heated at 130° C. for 60 seconds, developed with an aqueous tetramethylammonium hydroxide solution (2.38 mass %) for 30 seconds, rinsed with pure water and spin-dried to obtain a resist pattern.

The exposure latitude and the line edge roughness were evaluated in the same manner as in normal exposure above.

TABLE 4

| | Resin (10 g) | (B) Photo-Acid Generator (g) | Basic Compound (g) | Surfactant (g) | Dissolution Inhibiting Compound (g) | Organic Solvent | Hydrophobic Resin | (g) or (Solvent) | Mode of Addition | EL (%) | Line Edge Roughness (nm) |
|---|---|---|---|---|---|---|---|---|---|---|---|
| Example 20 | P1 | z54 (0.5) | N-1 (0.05) | W-1 (0.02) | — | SL-2/SL-4 = 6/4 | HR-83 | SL-6 | TC | 15.4 | 5.4 |
| Example 21 | P2 | z2 (0.55) | N-2 (0.05) | W-1 (0.02) | — | SL-2/SL-4 = 6/4 | HR-1 | 0.1 | added | 14.7 | 5.0 |
| Example 22 | P3 | z2 (0.25), z42 (0.2) | N-3 (0.045) | W-3 (0.02) | — | SL-2 = 1 | HR-53 | SL-6 | TC | 15.5 | 5.6 |
| Example 23 | P4 | z54 (0.35), z51 (0.2) | N-2 (0.05) | W-1 (0.02) | D-1 (0.5) | SL-2/SL-4 = 6/4 | HR-53 | SL-6 | TC | 12.7 | 5.6 |
| Example 24 | P5 | z38 (0.5) | N-1 (0.01), N-2 (0.04) | W-1 (0.02) | — | SL-1/SL-5 = 7/3 | HR-25 | 0.2 | added | 14.7 | 5.3 |
| Example 25 | P6 | z2 (0.55) | N-3 (0.003) | W-1 (0.02) | — | SL-2/SL-4 = 6/4 | HR-36 | 0.1 | added | 15.6 | 5.0 |
| Example 26 | P7 | z14 (0.5) | N-2 (0.04) | W-1 (0.02) | — | SL-1 = 1 | HR-53 | SL-6 | TC | 14.9 | 5.0 |
| Example 27 | P8 | z2 (0.4) | N-7 (0.02) | W-1 (0.10) | — | SL-2/SL-4 = 6/4 | HR-31 | 0.1 | added | 14.3 | 5.3 |
| Example 28 | P9 | z2 (0.2), z42 (0.35) | N-2 (0.055) | W-4 (0.02) | D-1 (0.5) | SL-1/SL-3 = 9/1 | HR-53 | SL-7 | TC | 13.7 | 5.1 |
| Example 29 | P10 | z2 (0.4), z29 (0.1) | N-4 (0.04) | W-2 (0.05) | — | SL-2/SL-4 = 6/4 | HR-83 | SL-6 | TC | 13.8 | 5.1 |
| Example 30 | P11 | z12 (0.37), z30 (0.25) | N-6 (0.02) | W-1 (0.02) | — | SL-2 = 1 | HR-53 | SL-6 | TC | 14.6 | 5.3 |
| Example 31 | P12 | z2 (0.56) | N-2 (0.05) | W-1 (0.02) | — | SL-2/SL-4 = 4/6 | HR-48 | 0.3 | added | 13.9 | 4.9 |
| Example 32 | P13 | z38 (0.35) | N-5 (0.035) | W-1 (0.02) | — | SL-2/SL-4 = 6/4 | HR-80 | 0.1 | added | 15.0 | 5.1 |
| Example 33 | P14 | z54 (0.60) | N-2 (0.055) | W-1 (0.02) | — | SL-1 = 1 | HR-83 | SL-6 | TC | 14.4 | 6.4 |
| Example 34 | P15 | z54 (0.50) | N-1 (0.05) | W-1 (0.02) | — | SL-2/SL-4 = 6/4 | HR-83 | SL-7 | TC | 11.7 | 5.9 |
| Example 35 | P16 | z38 (0.50) | N-1 (0.01), N-2 (0.04) | W-2 (0.01) | — | SL-1/SL-5 = 7/3 | HR-27 | 0.2 | added | 12.0 | 6.0 |
| Example 36 | P17 | z38 (0.55) | N-2 (0.04), N-6 (0.02) | W-1 (0.02) | — | SL-1 = 1 | HR-53 | SL-6 | TC | 11.9 | 5.9 |
| Example 37 | P18 | z2 (0.55) | N-2 (0.05) | W-1 (0.02) | — | SL-2/SL-4 = 4/6 | HR-15 | 0.2 | added | 10.5 | 6.2 |
| Example 38 | P19 | z38 (0.5) | N-1 (0.01), N-2 (0.04) | W-1 (0.02) | — | SL-1/SL-5 = 7/3 | HR-53 | SL-6 | TC | 11.0 | 6.4 |
| Comparative Example 3 | Q1 | z2 (0.35) | N-1 (0.03) | W-1 (0.02) | — | SL-2/SL-4 = 6/4 | HR-83 | SL-6 | TC | 8.2 | 9.5 |
| Comparative Example 4 | Q2 | z38 (0.55) | N-2 (0.05) | W-1 (0.02) | — | SL-1 = 1 | HR-83 | SL-6 | TC | 9.0 | 8.0 |

As seen from the results in Table 4, the positive photosensitive composition of the present invention ensures good performances of wide exposure latitude and small line edge roughness not only in normal exposure (dry exposure) but also in immersion exposure.

The abbreviations in Tables 3 and 4 are as follows.
N-1: Trioctylamine
N-2: 2,6-Diisopropylaniline
N-3: N-phenyldiethanolamine
N-4: Diazabicyclo[4.3.0]nonene
N-5: Dicyclohexylmethylamine
N-6: 2,4,5-Triphenylimidazole
N-7: 4-Dimethylaminopyridine
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: Troysol S-366 (produced by Troy Chemical)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: 2-Ethylbutanol
SL-7: Perfluorobutyltetrahydrofuran In Tables 3 and 4, the ratio when using a plurality of kinds of solvents is a ratio by mass.
D-1: tert-Butyl lithocholate

INDUSTRIAL APPLICABILITY

According to the present invention, a positive photosensitive composition ensuring wide exposure latitude and reduced line edge roughness not only in normal exposure (dry exposure) but also in immersion exposure, a pattern forming method using the positive photosensitive composition, and a compound for use in the positive photosensitive composition can be provided.

The positive photosensitive composition, the pattern forming method using the positive photosensitive composition, and the compound for use in the positive photosensitive composition are suitably used in the process of producing a semiconductor such as IC, in the production of a circuit board for liquid crystal, thermal head and the like or in other photofabrication processes.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2007-239572) filed on Sep. 14, 2007 and Japanese Patent Application (Patent Application No. 2008-201279) filed on Aug. 4, 2008, the contents of which are incorporated herein by way of reference.

The invention claimed is:

1. A positive photosensitive composition, comprising:
(A) a resin containing a repeating unit represented by the following formula (I) and being capable of increasing a solubility of the resin (A) in an alkali developer by an action of an acid; and
(B) a compound capable of generating an acid upon irradiation with an actinic ray or radiation:

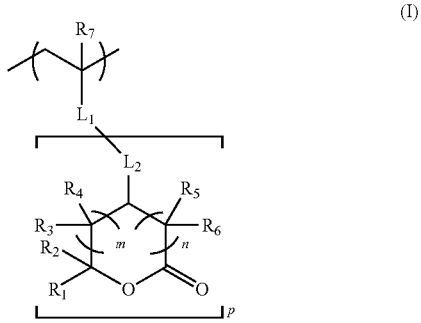

(I)

wherein each of $R_1$ and $R_2$ represents a monovalent organic group, and $R_1$ and $R_2$ may be the same or different and may combine with each other to form a cyclic structure;
each of $R_3$ to $R_6$ represents a hydrogen atom or a monovalent organic group, and $R_3$ to $R_6$ may be the same or different and may combine with each other to form a cyclic structure;
$L_1$ represents a divalent linking group;
$L_2$ represents a single bond or a divalent linking group;
each of m and n represents an integer of 0 to 5, and m+n is 3 or more;
$R_7$ represents a hydrogen atom, an alkyl group or a —$CH_2$—O—Ra group, wherein Ra represents a hydrogen atom, an alkyl group or an acyl group; and
p represents an integer of 1 to 3.

2. The positive photosensitive composition according to claim 1, wherein the resin (A) further contains a repeating unit having a lactone structure.

3. The positive photosensitive composition according to claim 2, wherein the resin (A) further contains a repeating unit capable of decomposing by an action of an acid to produce an alkali-soluble group.

4. The positive photosensitive composition according to claim 3,
wherein the repeating unit having a group capable of decomposing by an action of an acid to produce an alkali-soluble group is a repeating unit represented by the following formula (AI):

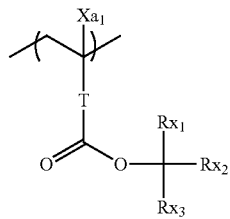

(AI)

wherein $Xa_1$ represents a hydrogen atom, a methyl group, a trifluoromethyl group or a hydroxymethyl group;
T represents a single bond or a divalent linking group; and
each of $Rx_1$ to $Rx_3$ independently represents an alkyl group or a cycloalkyl group, and at least two members out of $Rx_1$ to $Rx_3$ may combine with each other to form a cycloalkyl group.

5. The positive photosensitive composition according to claim 1, wherein the resin (A) further contains a repeating unit having a group capable of decomposing by an action of an acid to produce an alkali-soluble group.

6. The positive photosensitive composition according to claim 5,
wherein the repeating unit having a group capable of decomposing by an action of an acid to produce an alkali-soluble group is a repeating unit represented by the following formula (AI):

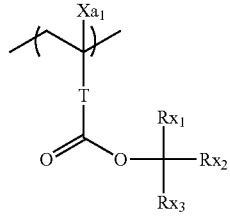

(AI)

wherein $Xa_1$ represents a hydrogen atom, a methyl group, a trifluoromethyl group or a hydroxymethyl group;
T represents a single bond or a divalent linking group; and
each of $Rx_1$ to $Rx_3$ independently represents an alkyl group or a cycloalkyl group, and at least two members out of $Rx_1$ to $Rx_3$ may combine with each other to form a cycloalkyl group.

7. A pattern forming method, comprising:
forming a film from the positive photosensitive composition according to claim 1; and
subjecting the film to exposure and development.

8. The pattern forming method according to claim 7, wherein the exposure is immersion exposure.

9. The positive photosensitive composition according to claim 1,
wherein the divalent linking group represented by $L_1$ is a phenylene group or an ester group.

10. The positive photosensitive composition according to claim 1,
wherein each of $R_1$ and $R_2$ represents an alkyl group, a cycloalkyl group, an aryl group, an aralkyl group or an alkenyl group.

11. The positive photosensitive composition according to claim 1,
wherein m+n is from 3 to 5.

12. The positive photosensitive composition according to claim 1, further comprising:
a hydrophobic resin (HR).

13. A resin, characterized by comprising a repeating unit represented by the following formula (I):

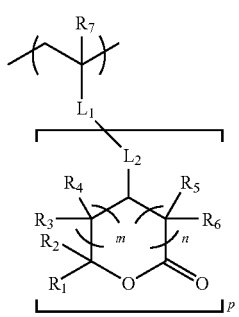

wherein each of $R_1$ and $R_2$ represents a monovalent organic group, and $R_1$ and $R_2$ may be the same or different and may combine with each other to form a cyclic structure;
each of $R_3$ to $R_6$ represents a hydrogen atom or a monovalent organic group, and $R_3$ to $R_6$ may be the same or different and may combine with each other to form a cyclic structure;
$L_1$ represents a divalent linking group;
$L_2$ represents a single bond or a divalent linking group;
each of m and n represents an integer of 0 to 5, and m+n is 3 or more;
$R_7$ represents a hydrogen atom, an alkyl group or a —$CH_2$—O—Ra group, wherein Ra represents a hydrogen atom, an alkyl group or an acyl group; and
p represents an integer of 1 to 3.

14. The resin according to claim 13,
wherein the divalent linking group represented by $L_1$ is a phenylene group or an ester group.

15. The resin according to claim 13,
wherein each of $R_1$ and $R_2$ represents an alkyl group, a cycloalkyl group, an aryl group, an aralkyl group or an alkenyl group.

16. The resin according to claim 5,
wherein m+n is from 3 to 5.

17. A polymerizable compound represented by the following formula (I'):

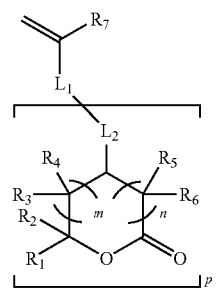

wherein each of $R_1$ and $R_2$ represents a monovalent organic group, and $R_1$ and $R_2$ may be the same or different and may combine with each other to form a cyclic structure;
each of $R_3$ to $R_6$ represents a hydrogen atom or a monovalent organic group, and $R_3$ to $R_6$ may be the same or different and may combine with each other to form a cyclic structure;
$L_1$ represents a divalent linking group;
$L_2$ represents a single bond or a divalent linking group;
each of m and n represents an integer of 0 to 5, and m+n is 3 or more;
$R_7$ represents a hydrogen atom, an alkyl group or a —$CH_2$—O—Ra group, wherein Ra represents a hydrogen atom, an alkyl group or an acyl group; and
p represents an integer of 1 to 3.

18. The polymerizable compound according to claim 17,
wherein the divalent linking group represented by $L_1$ is a phenylene group or an ester group.

19. The polymerizable compound according to claim 6,
wherein each of $R_1$ and $R_2$ represents an alkyl group, a cycloalkyl group, an aryl group, an aralkyl group or an alkenyl group.

20. The polymerizable compound according to claim 17,
wherein m+n is from 3 to 5.

* * * * *